US006412097B1

United States Patent
Kikuchi et al.

(10) Patent No.: US 6,412,097 B1
(45) Date of Patent: Jun. 25, 2002

(54) COMPACTING METHOD OF CIRCUIT LAYOUT BY MOVING COMPONENTS USING MARGINS AND BUNDLE WIDTHS IN COMPLIANCE WITH THE DESIGN RULE, A DEVICE USING THE METHOD AND A COMPUTER PRODUCT ENABLING PROCESSOR TO PERFORM THE METHOD

(75) Inventors: Hideo Kikuchi; Keiji Nagano; Yutaka Akimoto, all of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/495,804

(22) Filed: Feb. 1, 2000

(30) Foreign Application Priority Data

Feb. 2, 1999 (JP) .......................................... 11-025310

(51) Int. Cl.$^7$ ............................................ G06F 17/50
(52) U.S. Cl. ............................................................ 716/2
(58) Field of Search ................................ 716/2, 4, 5, 7, 716/9–12

(56) References Cited

U.S. PATENT DOCUMENTS 5,625,568 A * 4/1997 Edwards ........................ 716/2
6,035,108 A * 3/2000 Kikuchi ......................... 716/2

FOREIGN PATENT DOCUMENTS

| JP | 5-274392 | 10/1993 |
|----|----------|---------|
| JP | 10-3491  | 1/1998  |
| JP | 10-242285 | 9/1998 |

OTHER PUBLICATIONS

Two–Dimensional Compaction by "Zone Refining" Hyunchul Shin, Alberto L. Sangiovanni–Vincentelli and Carol H. Sequin/Department of Electrical Engineering and Computer Sciences, University of California, Berkeley, CA., 23rd Design Automation Conference, 1986 IEEE, Paper 7.3, pp. 115–122.

Kikuchi Hideo "Printed Board Diagonal Wire Compaction Method and Its Evaluation", Joho Shori Gakkai Kenkyu Hoko, (Information Management Society Research Report) (98–DA–88), May 22, 1998, vol. No. 98 Issue No. 43, pp. 29–34.

* cited by examiner

Primary Examiner—Matthew Smith
Assistant Examiner—Thuan Do
(74) Attorney, Agent, or Firm—Hayes Soloway P.C.

(57) ABSTRACT

A layout compaction method adapted to be embodied in computer program product and adapted for compacting a circuit layout having a plurality of layers on which moving objects form layer patterns, wherein the moving objects comprising components and wires. The method assumes a graph problem under condition which prevent the compacted result from violation of the design rule, and then, solves the graph problem to determine a moving order, a moving direction, and a moving distance of each component for moving the components to thereby perform the compacting the circuit layout. After that, the method moves each component according to the moving order, the moving direction and the moving distance to obtain a compacted circuit layout.

79 Claims, 44 Drawing Sheets

BELT WIDTH $W_{WB} = W_B +$ ALL $W_M$

Data Structure of Piece Data (terminal, via-hole)

| Piece Number |
|---|
| Component Number |
| Shape Number |
| Location Number |
| Signal Name |
| Section Number |

FIG. 14

Data Structure of Piece Data (wire, conductor (polygon))

| Piece Number |
|---|
| Shape Number |
| Location Number (1st end) |
| Location Number (2nd end) |
| Signal Name |
| Fixed or Variable of Pattern Shape |

FIG. 15

Data Structure of Location Data

| Location Number |
| --- |
| X-coordinate Value |
| Y-coordinate Value |
| Layer Number |
| Component Number |

FIG. 16

Data Structure of Shape Data

| Shape Number |
| --- |
| Pattern Width in Y-direction |
| Pattern Width in X-direction |
| Pattern Width in X∠45°-direction |
| Pattern Width in X∠-45°-direction |

FIG. 17

Data Structure of Section Data

VPL : Vertical Partition Line

HPL : Horizontal Partition Line

| |
|---|
| Section Number |
| Layer Number |
| Location Number (1st Corner) |
| Location Number (2nd Corner) |
| Location Number (3rd Corner) |
| Location Number (4th Corner) |
| Piece Number (Left VPL) |
| Piece Number (Right VPL) |
| Piece Number (Upper HPL) |
| Piece Number (Lower HPL) |
| Piece Number (1st Terminal) |
| Piece Number (2nd Terminal) |
| . . . |
| Piece Number (n-th Terminal) |

FIG. 18

Data Structure of Piece Data (Partition Line : PL)

| |
|---|
| Piece Number (Partition Line) |
| Component Number (Partition Line) |
| Shape Number (Partition Line) |
| Location Number (Middle Point of PL |
| Joint Direction |

FIG. 19

Data Structure of CG Data

| |
|---|
| Edge Number |
| Compaction Direction |
| Piece Number (1st Node) |
| Piece Number (2nd Node) |

FIG. 21

Data Structure of CG Order Data

| |
|---|
| Compaction Direction |
| Order |
| CG Number |

FIG. 22

Data Structure of TCG Data

| |
|---|
| Compaction Direction |
| Piece Number (Terminal Number : 1st Node) |
| Piece Number (Terminal Number : 2nd Node) |
| Belt Width |
| Maximum Movable Range (Weight) |
| Shape Number (Octagonal Restricted Region) |
| n : a Number of Wires Traversing |
| Piece Number (1st Wire) |
| Piece Number (1st Wire) |
| Piece Number (2nd Wire) |
| . . . |
| Piece Number (n-th Wire) |

FIG. 23

Data Structure of CCG Data

| |
|---|
| Compaction Direction |
| Component Number (1st Node) |
| Component Number (2nd Node) |
| TCG Number |
| Selected Maximum Movable Range (Weight) |

FIG. 24

Data Structure of

Wire Limited Location Data

| Piece Number (Wire) |
| --- |
| Piece Number (Core Terminal) |
| Shape Number (Restricted Region of Wiring) |
| Location Number (Core Terminal) |

FIG. 27

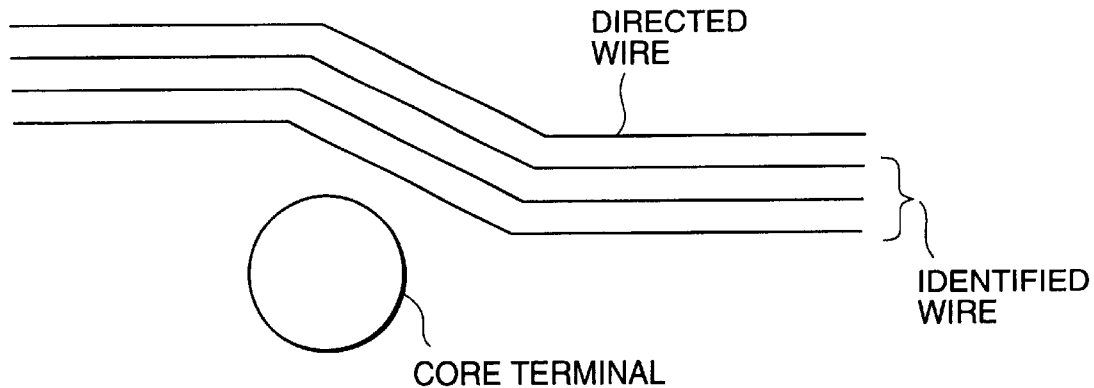
$W_{ADD}$=TOTAL WIDTH OF IDENTIFIED WIRE
+MARGIN COMPLIANT TO THE DESIGN RULE
+WIRE WIDTH OF DIRECTED WIRE
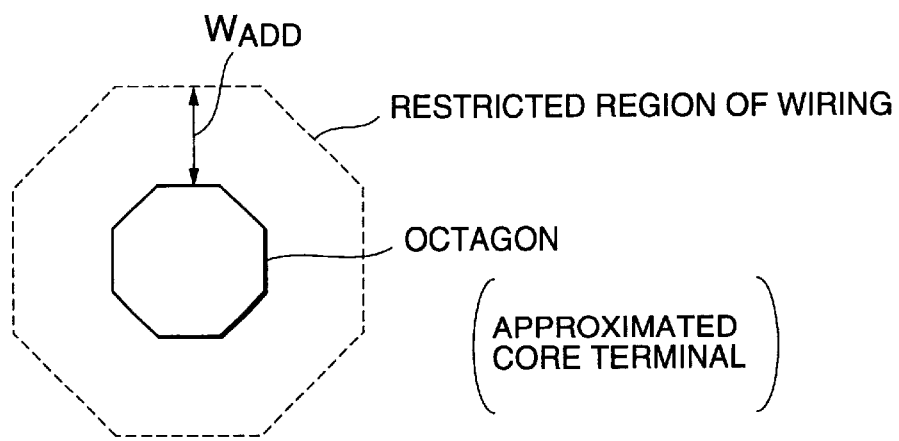
FIG.28

Data Structure of

Component Moving Vector Data

| Component Number          |
| (Upper Side of Substrate Region) |
| Moving Vector             |
| Component Number          |
| (Lower Side of Substrate Region) |

FIG. 39

COMPACTING METHOD OF CIRCUIT LAYOUT BY MOVING COMPONENTS USING MARGINS AND BUNDLE WIDTHS IN COMPLIANCE WITH THE DESIGN RULE, A DEVICE USING THE METHOD AND A COMPUTER PRODUCT ENABLING PROCESSOR TO PERFORM THE METHOD

BACKGROUND OF THE INVENTION

This invention relates to a layout compaction system as used in designing a layout of VLSI or another layout on a printed circuit board, and, in particular, to the compaction system which can automatically provide a small-sized VLSI.

The VLSI has been of high density, so that human can no longer manually design the VLSI. To aid the designing of the VLSI, some kind of EDA (electronic design automation) tools are used in the art of the VLSI design. Especially, layout compaction systems are adapted to automatically compact a circuit layout and work in a layout design phase.

In general, the circuit layout is formed on a substrate and comprises a plurality of layers on each of which objects are arranged as a layer pattern. When the objects are moved in a certain direction, free space is obtained in the opposite direction and enables the layout compaction system to compact the circuit layout. Such objects will be called moving objects, hereinafter.

In detail, the moving objects comprise components, wires, via-holes, semiconductor cells, and so on. Among them, some of the wires are laid on the respective layers in bundles, and some of the components extend over layers. Although each of the components has terminals, all terminals belonging to one component may exist on layers.

The layout compaction system requires taking the complicated structure of the circuit layout into consideration, otherwise the compacted circuit layout may not perform correctly. Besides, there is requirement for the compaction to be high rate. To respond these requirements, various kinds of the compacting methods have been developed and proposed.

In some of the proposed methods, the circuit layout is compacted by moving components as moving objects in relation with each other.

One of them relates to two-dimensional compaction, where the components are simultaneously moved in two directions. Such compacting method is, for example, disclosed in "Two-Dimensional Compaction by 'Zone Refining': Hynchul Shin, Alberto L. Sangiovanni-Vincentelli, Carlo H. Sequin; Proc. of 23rd Design Automation Conference, 1986, pp. 115–122." In summary, the compacting method moves the semiconductor cells in a vertical direction of the circuit layout from upper side one to down, and simultaneously moves the semiconductor cells in a horizontal direction of the circuit layout.

Another compacting method is disclosed in Japanese Unexamined Patent Publication No. Hei 5-274392, namely, JP-A 5-274392. In this method, the substrate is divided at positions of wires into a plurality of regions. That is, on all boundaries between the regions, the wires are always laid. Under the condition, the compaction in the horizontal direction is executed from the regions closer to the left side of the substrate to right, and simultaneously the compaction in the vertical direction is executed from the regions closer to the upper side of the substrate to down. Thus, the method keeps an arrangement of the regions, and provides uniformly compacted circuit layout.

However, the above-mentioned methods can not handle wiring of the diagonal form, and therefore, can not accomplish the high rate of the compaction.

On the other hand, the method which can handle wiring of the diagonal form, is disclosed in Japanese Unexamined Patent Publication (JP-A) No. Hei 10-3491, namely, JP-A 10-3491. This method removes all of the wires from the circuit layout, and then, compacts the circuit layout by moving the component together with re-wiring of newly wires.

It is however noted that the newly wires bring about another problem since consideration has been made about only the moving of the component. Some of wires are laid on the layers in bundle to form wire bundle. If not taking the characteristic of the circuit into consideration, the wire bundle has a width substantially equal to the total sum of the width of the wires comprising the wire bundle. Actually, predetermined margins however are required between the adjacent wires, to prevent cross talk from occurring between the adjacent wires. Such margins are fixed in the design rule for the compaction targets, such as the VLSI. The above method of JP-A 10-3491 does not consider such characteristic, and thereby, may violate the design rule.

SUMMARY OF THE INVENTION

This invention therefore provides a compacting method which can handle wiring of the diagonal form with a relationship of the components and the wires kept, and which can meet the design rule.

According to one aspect of this invention, a compacting method compacts a circuit layout having a plurality of layers on which moving objects form layer patterns. For example, the moving objects comprise components having terminals, wires, via-holes, semiconductor cells, conductors having predetermined pattern shapes. In this specification, parts of the via-hole at every layer, the semiconductor cells, profiles of the components may be handled as the terminal. A combination unit of the component and the via-hole may be, as a whole, handled as single component. The via-hole connected to only wire may be handled as one of the components. The conductors may be approximated into polygons, each of the polygons being handled as the component, while edges of each polygon begin handled as the terminals. These handling are for the sake of clarity and for readily processing, which do not restrict this invention.

Some of the wires are laid on the respective layers in bundles to form wire bundles. Each of the wires having a wire width and a pattern shape as a wire pattern shape. Each of the wire bundles having a pattern shape as a bundle pattern shape and a bundle width which is defined by a total width of wires comprising each wire bundle.

The method comprises the following three steps for each of the layer patterns on each of the layers.

First, a graph problem is assumed under first through fourth condition, wherein a graph comprises nodes corresponding to the components and edges corresponding to moving vectors of the components. The first condition is that the wire widths of the wires are fixed at constant wire width values. The second condition is that belt widths of wire belts are fixed at constant belt width values. The wire belts are defined by adding predetermined margins to both sides in a width direction of each of the wire bundles in compliance with a design rule. Each of the belt widths is equal to a sum of each of the bundle widths and the predetermined margins. The third condition is that component-wire spaces are variable. Each of the component-wire spaces is defined to be a distance from the component to edges in the width direction of the wire belts and/or the wires. The fourth condition is that wire pattern shape and the bundle pattern shape are changeable for compacting.

When assumed, the graph problem is solved so that a moving order, a moving direction, and a moving distance of each component are determined for moving the components. And then, each component is moved according to the moving order, the moving direction and the moving distance.

With this method, the compacted circuit layout does not have the problem, such as cross talk, because the assumption of the graph problem takes the design rule into consideration and, as the solution, the moving vectors of the components are determined. The method may be in the form of software instructions and be executed on a computer (or by a processor) virtually. In this case, the computer applies the method original layout data of the circuit layout to produce compacted layout data of the compacted circuit layout.

BRIEF DESCRIPTION OF THE DRAWINGS

FIG. 14 shows a data structure of piece data of a terminal, a part of via-hole, and so on;

FIG. 15 shows a data structure of piece data of a wire, an edge of polygon, and so forth;

FIG. 16 shows a data structure of location data;

FIG. 17 shows a data structure of shape data;

FIG. 18 shows a data structure of section data;

FIG. 19 shows a data structure of piece data of a partition line;

FIG. 21 shows a data structure of constraint graph data;

FIG. 22 shows a data structure of constraint graph order data;

FIG. 23 shows a data structure of terminal constraint graph data;

FIG. 24 shows a data structure of component constraint graph data;

FIG. 27 shows a data structure of wire limited location data;

FIG. 28 is a view for use in describing the fixing restricted region of wiring;

FIG. 39 shows a data structure of component moving vector data;

DESCRIPTION OF THE PREFERRED EMBODIMENTS

Figure 1:
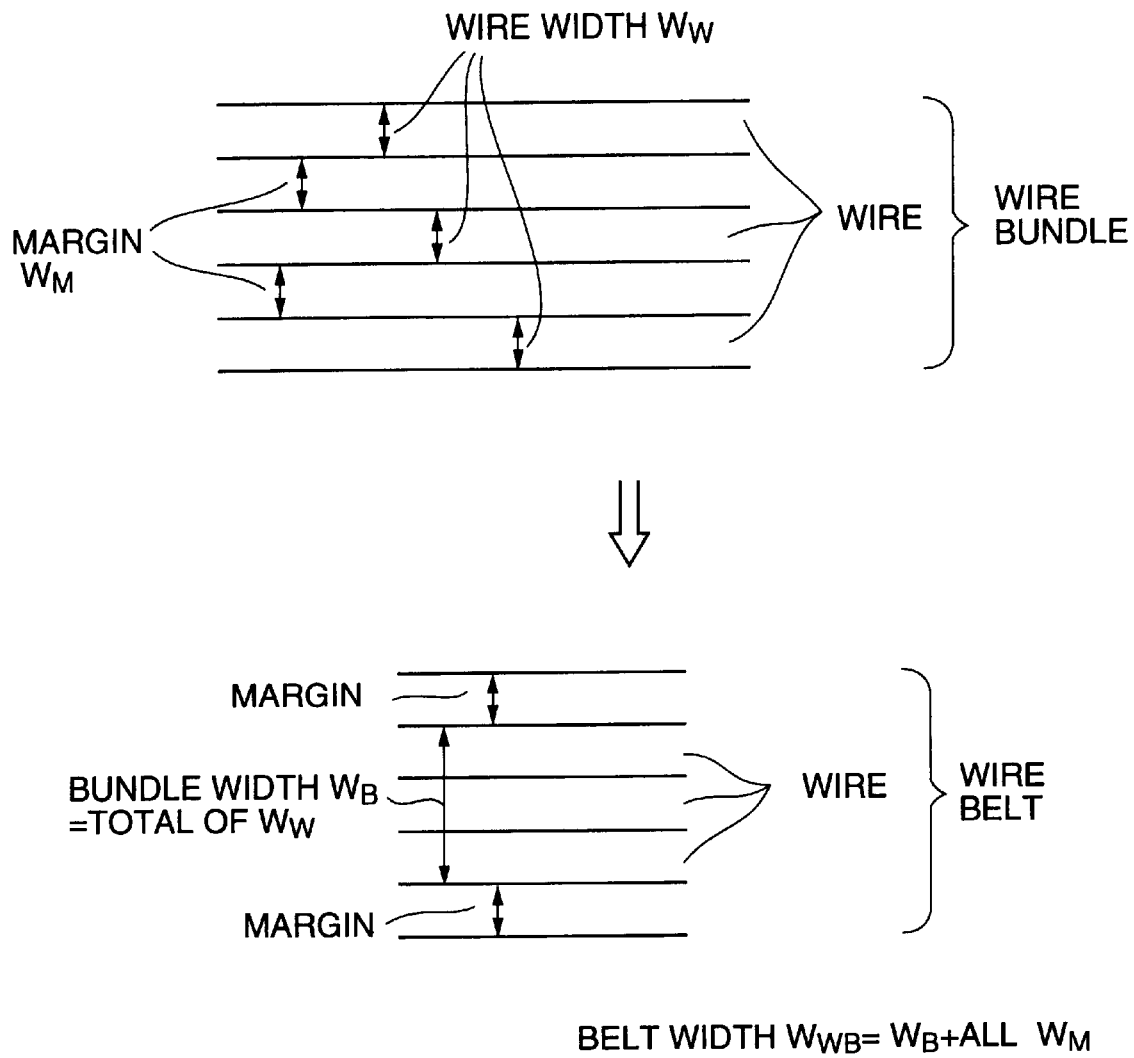
FIG. 1 is a view for use in describing definitions of wire bundle, wire belt and so forth.

On actual circuit layout, a wire bundle is arranged, as illustrated in upper side of FIG. 1, and required margins to prevent the mutual interference from occurring. Taking this into consideration, a wire belt is defined in this specification, as shown in lower side of FIG. 1. Provided that widths of the wire, the wire bundle, and the margin are $W_W$, $W_B$(=total of $W_W$) and $W_M$, respectively, the wire belt has a belt width $W_{WB}$ equal to $W_B$ and $W_M$s. Specifically, the compacting method of this invention fixes both the belt width $W_{WB}$ and the wire width $W_W$ at constant values and, on the other hand, the pattern shapes of the wire and the wire bundle are changeable. Besides, component-wire spaces are variable, each of the component-wire spaces being defined to be a distance from the component to edges in the width direction of the wire belts and/or the wires.

Under the condition, the graph problem is assumed for each layer pattern, wherein a graph comprises nodes corresponding to components and edges corresponding to moving vectors of the components.

Figure 2:
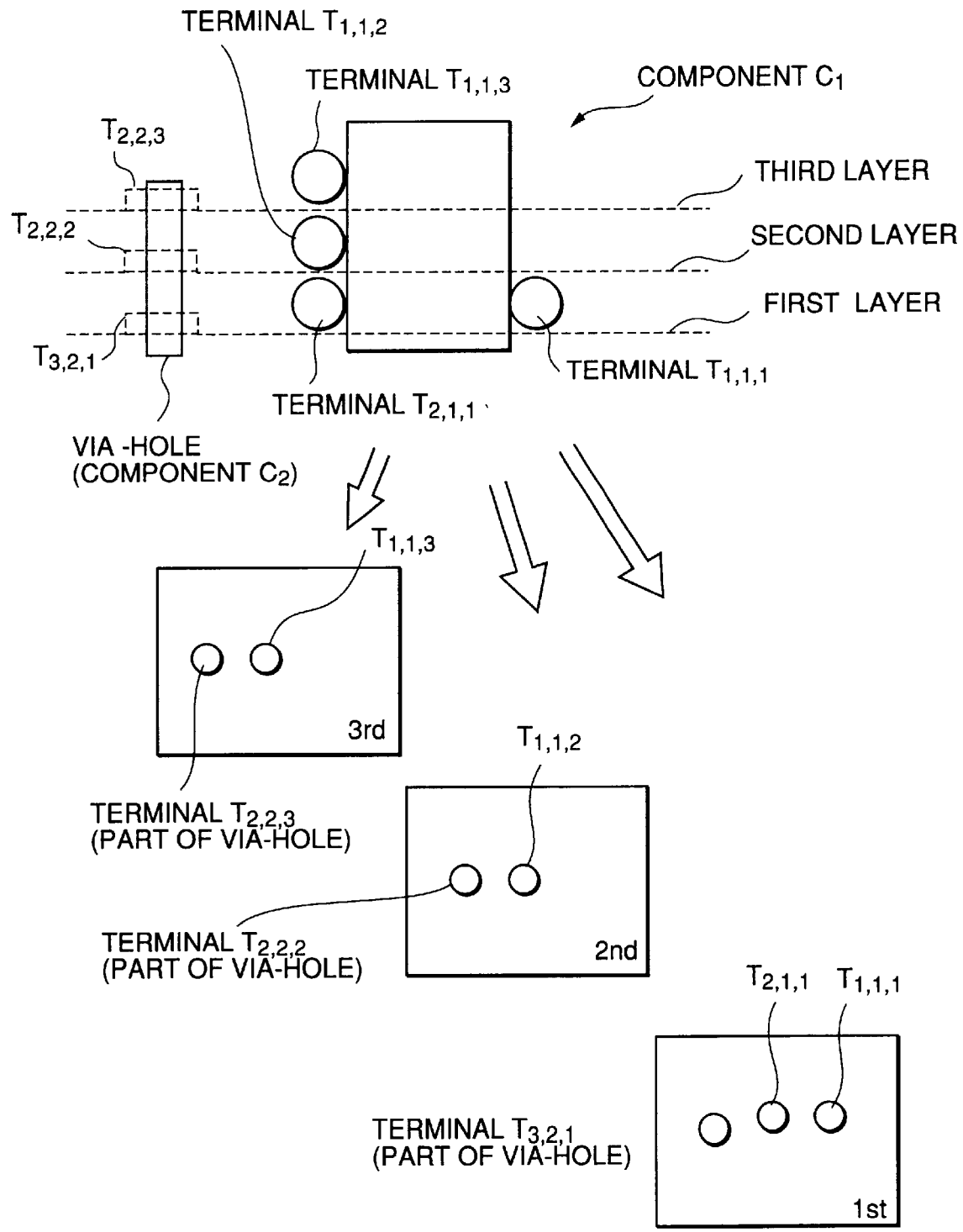
FIG. 2 is a view for use in describing the extracting terminals from components.

In detail, terminals are extracted from the components for each layer pattern, as illustrated in FIG. 2. Parts of via-holes are handled as the terminals, and are represented at each layer pattern. Also, semiconductor cells and profiles of the components are handled as the terminal, in this embodiment. A combination unit of the component and the via-hole is, as a whole, handled as single component and the via-hole connected to only wire may be handled as one of the components, in this embodiment. Furthermore, conductors are approximated into polygons, each of the polygons being handled as the component, while edges of each polygon being handled as the terminals, in this embodiment.

Each terminal $T_{i,j,k}$ is given a unique terminal number "i" at each layer, a component number "j" indicative of the component corresponding to the terminal, and a layer number "k", so as to be distinguish from other terminals. For example, the terminal $T_{1,1,1}$ and the terminal $T_{2,1,1}$ exist on the first layer and belong to the same component $C_1$, but the terminal $T_{3,2,1}$ and the terminal $T_{1,1,3}$ are exist on layers different from each other, and besides, belong to different components $C_2$, $C_1$.

In this embodiment, compaction process is repeatedly carried out for first and second compaction directions which are perpendicular to each other, such as X- and Y- direction on X–Y coordinates.

Figure 3:
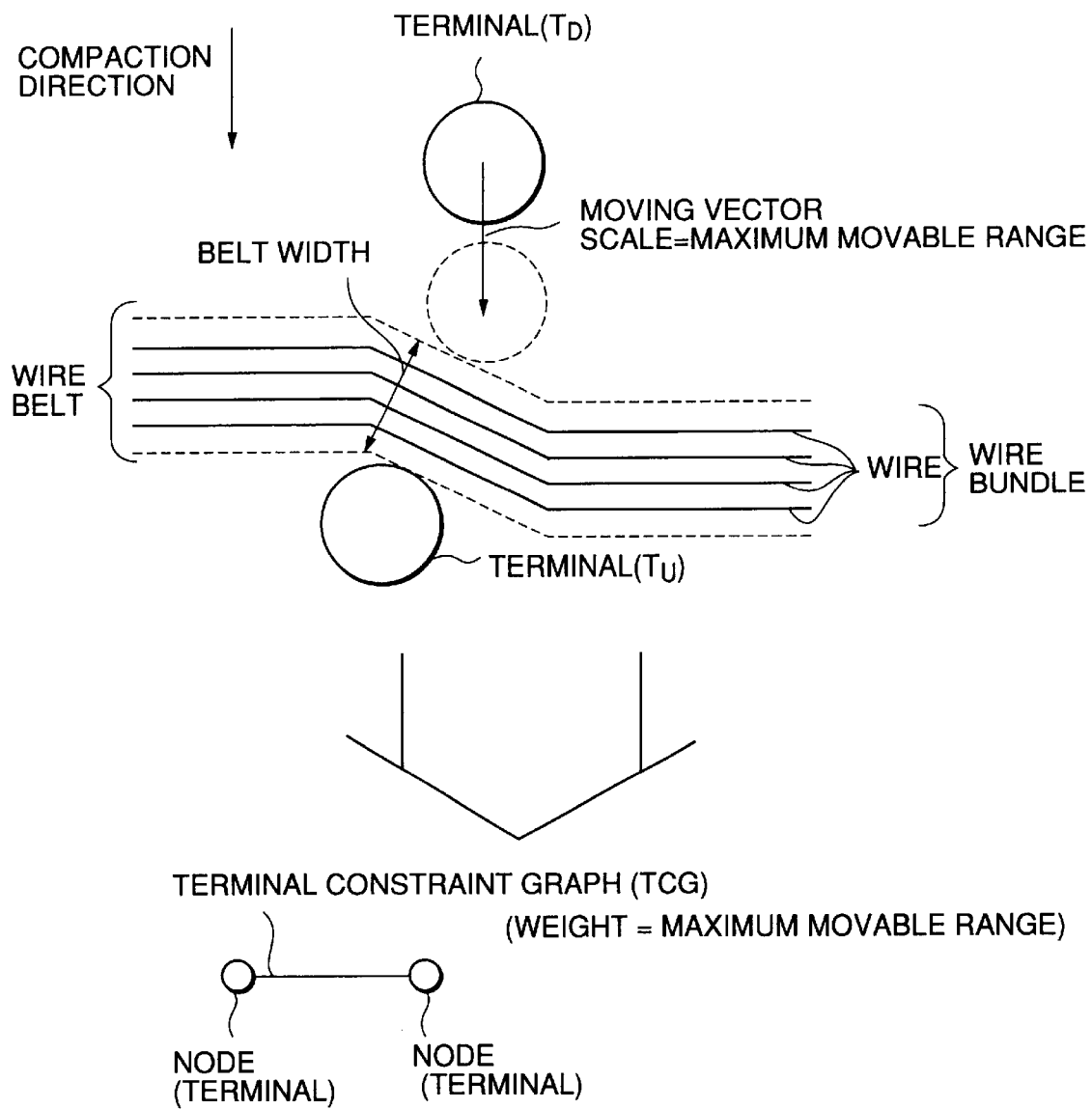
FIG. 3 is a view for use in describing the defining terminal constraint graph.

When terminals $T_{i,j,k}$ are obtained, the first compaction direction is selected and terminal constraint graphs (TCGs) for the first compaction direction are defined, as shown in FIG. 3. Such definitions are executed for each layer pattern. Each of the terminal constraint graphs relates to a pair of particular terminals selected among the terminals of all components. The particular terminals are close to each other in the first compaction direction and belong to different components from one to another. Specifically, one of the particular terminals, which is down one in the first compaction direction, is also represented by "$T_D$", while the other particular terminal, which is upper one in the first compaction direction, is also represented by "$T_U$."

The particular terminals $T_D$ and $T_U$ are assigned to nodes at both ends of the terminal constraint graph. The nodes for the terminal constraint graph are represented by $N_{i,j,k}$, where "i", "j" and "k" mean the same ones of the $T_{i,j,k}$.

The terminal constraint graph has, as a weight, a maximum movable range of the particular terminal $T_D$ when the particular terminal $T_D$ is moved for the particular terminal $T_U$ in the first compaction direction. If the wire or the wire bundle traverses between the particular terminals $T_D$ and $T_U$, the movable range is restricted by the wire width or the belt width, and thereby, the weight of the terminal constraint graph becomes light in comparison with the case of no wire traversing. Furthermore, there is a case where the distance between the particular terminals $T_D$ and $T_U$ in the first compaction direction is shorter than another distance required by the design rule in accordance with the wire width and/or the belt width. In this case, the maximum movable range has a minus value, so that the weight of the terminal constraint graph is negative. Otherwise, the maximum movable range has a plus value, so that the weigh of the terminal constraint graph is positive.

Such defining of the terminal constraint graph is repeatedly executed for all pairs of the particular terminals $T_U$ and $T_D$, each pair of which are selected among the terminals of all components at every layer pattern, so as to obtain the terminal constraint graphs in relation to all pairs.

At this time, a corner of a substrate region, on which the circuit layout is formed, is handled as the terminal, in this embodiment. The corner is upper one of both of the first and second compaction directions, such as lower-left corner in a case of the first and second compaction directions being toward left and lower, respectively. Also, the above definition of the terminal constraint graph is executed in relation with a case where the corner and the terminal closes to the corner are handled as the pair of particular terminals. The pair including the corner is called a particular pair, wherein the closest terminal serves as the particular terminal $T_D$, while the corner serves as the particular terminal $T_U$. The node corresponding to the corner is called a particular node in the graph and is utilized, in solving the shortest path problem of the graph, as a starting point. About this, detail explanation will be made in later.

Figure 4:
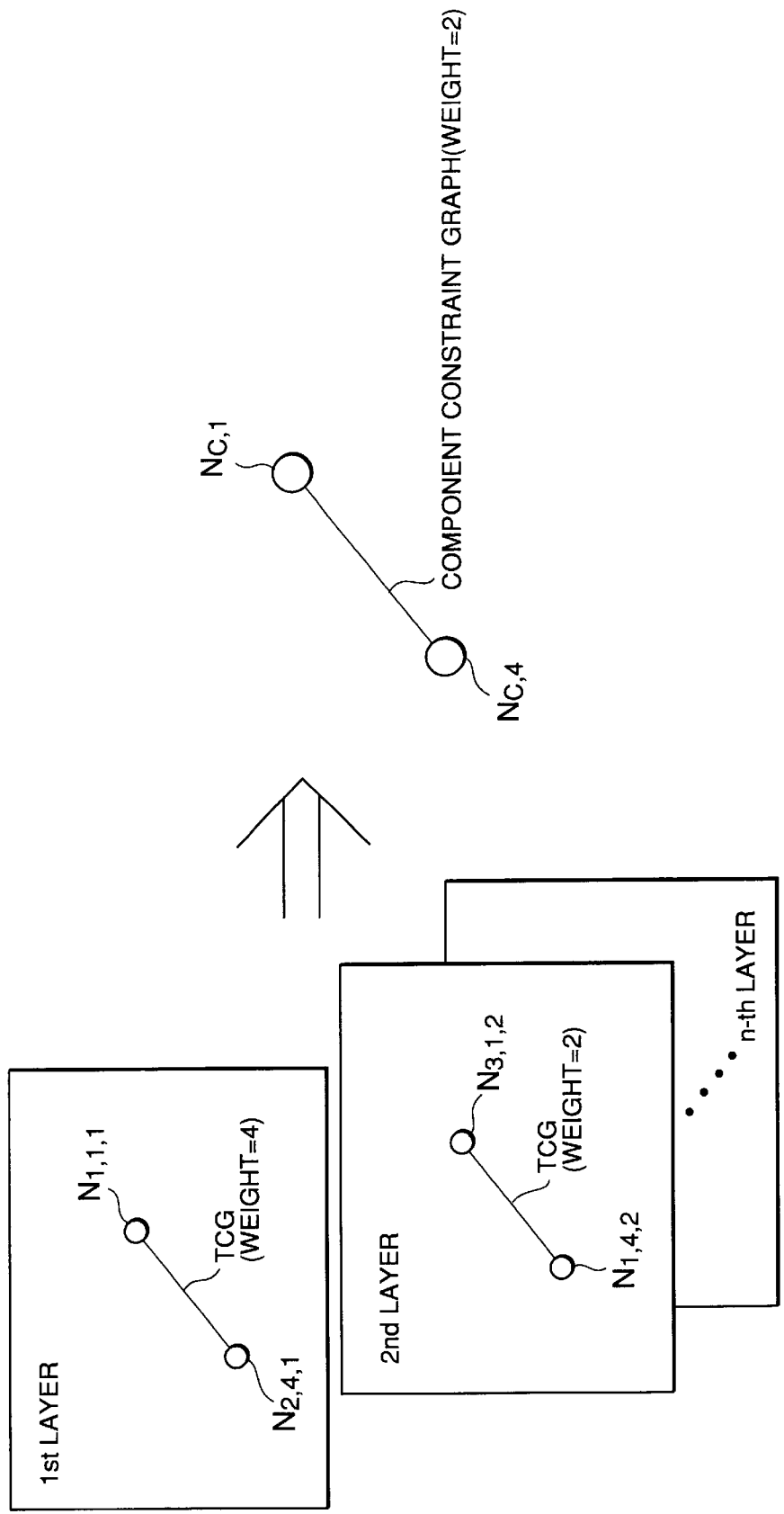
FIG. 4 is a view for use in describing the determining component constraint graph.

After the definition of all terminal constraint graphs for all of the layer patterns, determination is made about component constraint graphs (CCGs) on the basis of the terminal constraint graphs of all layer patterns, as shown in FIG. 4.

With reference to nodes for the terminal constraint graphs, a group of the pairs, in which the particular terminals belong two certain components, are selected. In FIG. 4, the nodes corresponding to the components $C_1$ and $C_4$ are selected so that the terminal constraint graphs are also selected. And then, the components $C_1$ and $C_4$ are assigned to nodes for the component constraint graph. The nodes for the component constraint graph are referred to as $N_{cj}$, where "j" is used as the same meaning "j" of $T_{i,j,k}$, and especially, the node corresponding to the corner is represented as $N_{0,0}$.

A weight of each component constraint graph is determined to be a minimum one among the weights of the terminal constraint graphs relating to the respective pairs. For example, the weight of the terminal constraint graph on the second layer is smaller than the weights of the terminal constraint graphs on the first and the other layers, in FIG. 4. Therefore, the weight of the component constraint graph is selected so as to be the weight of the terminal constraint graph on the second layer. Such determination of the component constraint graphs is repeatedly executed for all of the terminal constraint graphs.

Figure 5:
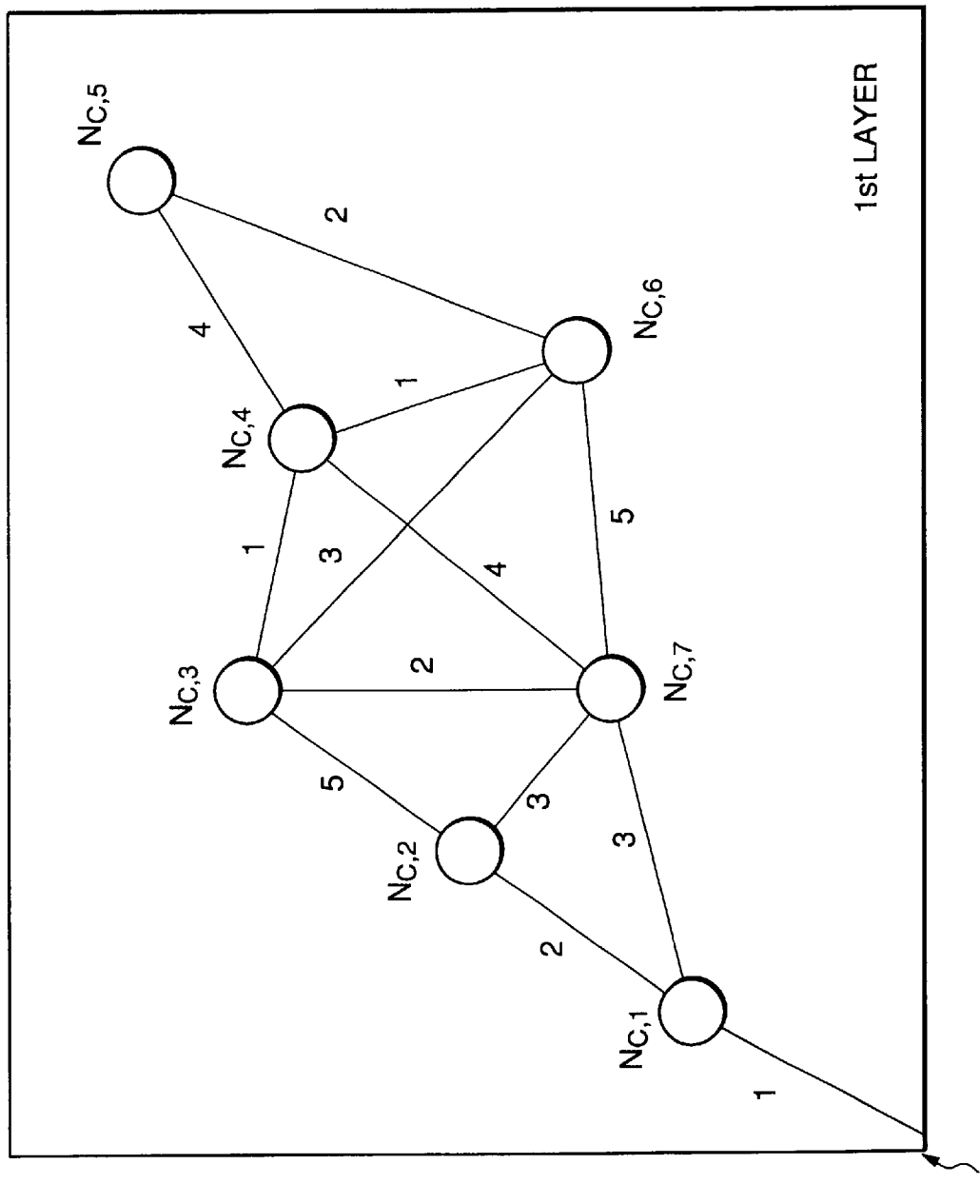
FIG. 5 is a view for use in describing the assuming graph problem.

When the determining is executed for all of the terminal constraint graphs, the graph is, for each layer pattern, created about all components existing of the layer, in question. In detail, the component constraint graphs are joined, with reference to the nodes for the component constraint graphs, so that the graph is obtained, as shown in FIG. 5. The illustrated graph is for the first layer, where numbers added to edges indicate the weights of the edges, respectively.

Figure 6:
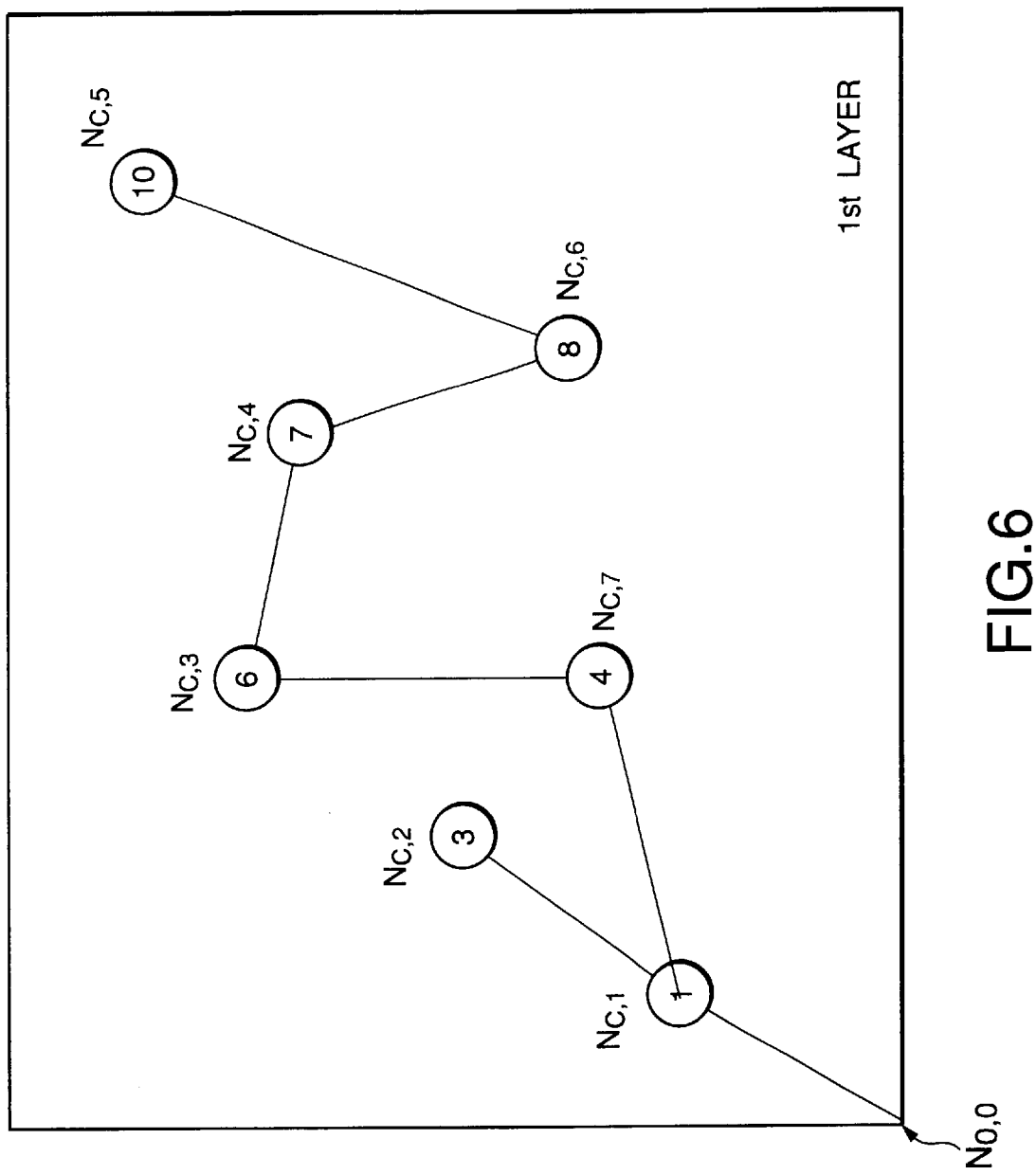
FIG. 6 is a view for use in describing the solving graph problem.
Figure 7:
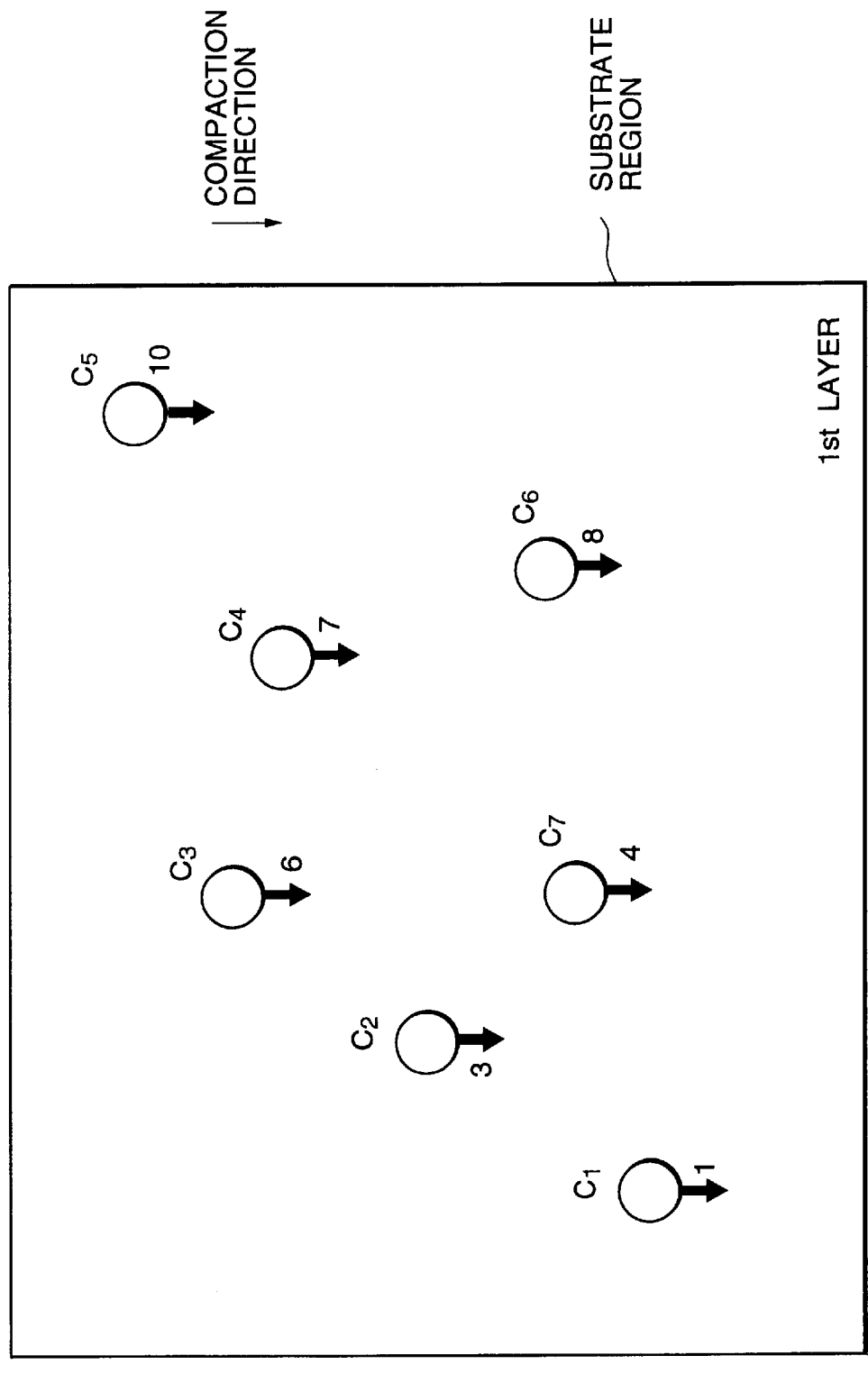
FIG. 7 is a view of use in describing the moving components.

On the basis of the above graph, the graph problem is solved to determine a moving order and a moving distance of each component on each layer responding to the graph. Specifically, the graph problem is the shortest path problem, wherein the particular node $N_{0,0}$ is the starting point. The shortest path problem is solved by utilizing, for example, the Dijkstra method. The solution of the graph problem shown in FIG. 5 is illustrated in FIG. 6, where lengths of shortest paths to the respective nodes are written into the circle representative of the nodes. The shortest path shows that the components $C_1 \sim C_7$ should be moved in order of $C_1$, $C_2$, $C_7$, $C_3$, $C_4$, $C_6$, and $C_5$, and that the moving distances of the components $C_1 \sim C_7$ should be 1, 3, 6, 7, 10, 8, and 4, respectively.

After the solving, each component is moved according to the moving order and the moving distance in the compaction direction. In the above example, the components $C_1$, $C_2$, $C_7$, $C_3$, $C_4$, $C_8$, and $C_5$ are moved in this order and with the moving distances 1, 3, 4, 6, 7, 8, and 10, respectively. The above solving and the moving are executed for all layer patterns, so that the compaction in the first compaction direction is achieved.

After the compaction in the first compaction direction, next compaction is executed in the second compaction direction, by the same way of the first compaction direction. As the result, each of the components is moved in the second compaction direction, according to the moving order and the moving distance obtained by solving the graph problem in a case of the second compaction direction. Thus, the compactions are executed in both compaction directions, resulting in the compacted circuit layout.

With this method, the widths of the wire and the wire bundle are considered at the defining step of the terminal constraint graph. In addition, the component constraint graph is determined, in consideration of the terminal constraint graphs of all layers, so that the movements of the components on every layer are consistent with each other. Thus, the compacted circuit layout can meed the requirement of the design rule.

The above-mentioned method may comprise the following steps, in connection with wiring. After the moving of the component, the method may at first judge whether the wire and/or the wire belt are laid transversely to a virtual line connecting between the particular terminals. And then, the method may execute re-wiring of the wire and/or the wire bundle (wire belt), in question, in consideration of an allowable form of the design rule. Such allowable form may be a selected one of a vertical form, a horizontal form, and a diagonal form to the bottom line of the substrate region, and a combination thereof.

Figure 8:
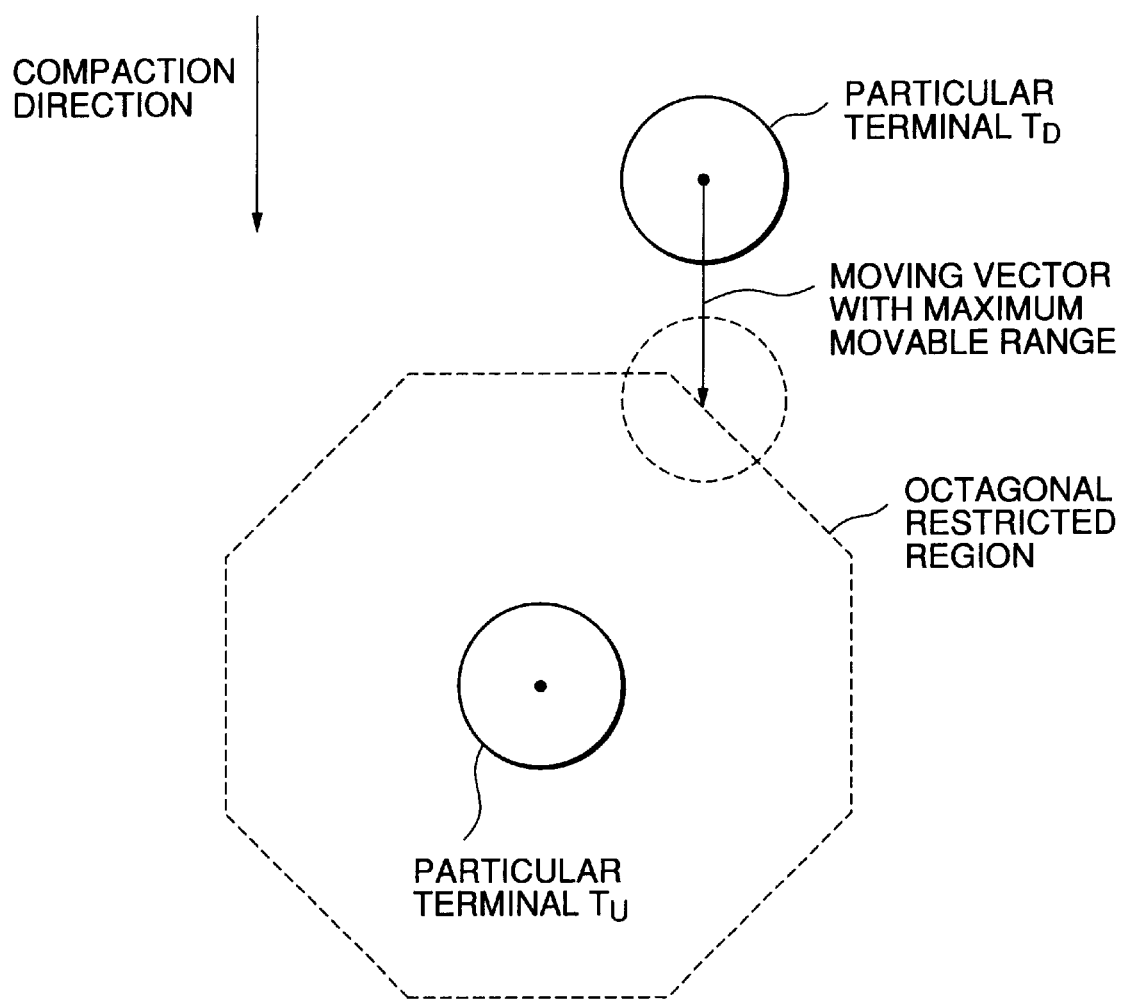
FIG. 8 is a view for use in describing the octagonal restricted region.

The above-mentioned method can adopt the following modification, prior to the definition of the terminal constraint graphs. If the wire and the wire bundle are changeable in a selected one of the vertical form, the horizontal form and the diagonal form, and the combination thereof, a restricted region for the particular terminal $T_D$ may be an octagon which has a center common to the particular terminal $T_U$, as shown in FIG. 8. In this modification, an octagonal restricted region is therefore fixed so as to forbid a center of the particular terminal $T_D$ to enter inside of the octagonal restriction region, and thereby, to restrict the movement of the particular terminal $T_U$ within an allowable range of the design rule. And then, the defining of the terminal constraint graph is carried out under the restriction of the octagonal restricted region.

Figure 9:
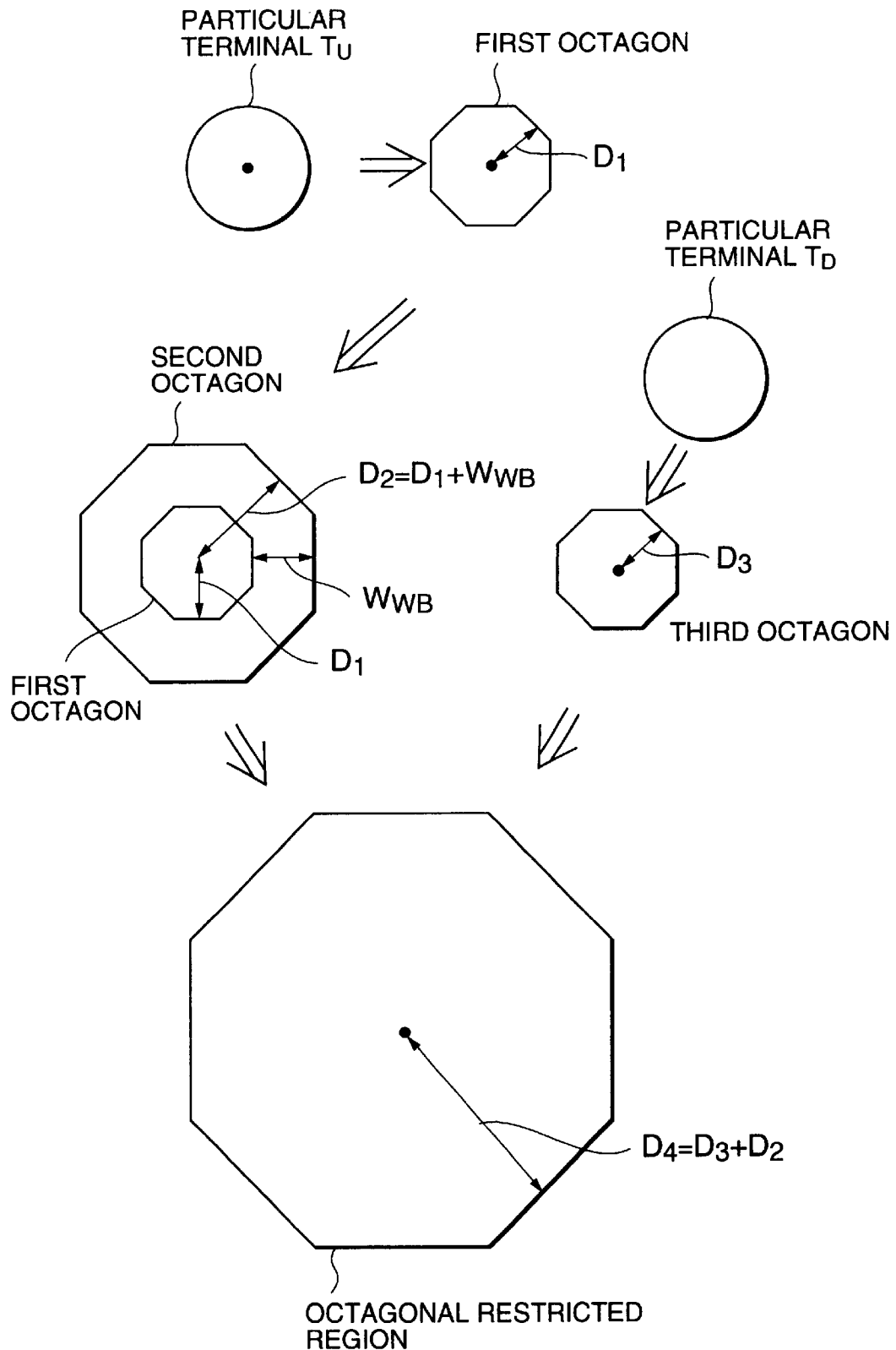
FIG. 9 is a view for use in describing the fixing octagonal restricted region.

The fixing of the octagonal restricted region may adopt the following steps. Referring to FIG. 9, the particular terminal $T_U$ is at first approximated into a first octagon having a first distance $D_1$ from a center to an edge of the first octagon. The first distance $D_1$ is substantially equal to the radius of the circle representative of the particular terminal $T_U$.

The first octagon is added the belt width to each of the edges of the first octagon, so that a second octagon is obtained. The second octagon has a second distance $D_2$ from a center to an edge of the second octagon, the second distance $D_2$ being equal to a sum of the belt width $W_{WB}$ and the first distance $D_1$. If the wire bundle does not traverse between the particular terminals, but if the wire traverses between the particular terminals, the second distance $D_2$ may be a sum of the wire width $W_W$ and the first distance $D_1$. If no wire is laid between the particular terminals, the second distance $D_2$ may be equal to the first distance $D_1$ or a sum of the first distance and a margin width compliant to the design rule.

On the other hand, the particular terminal $T_D$ is also approximated into a third octagon which has a third distance $D_3$ from a center to an edge of the third octagon.

And then, the third distance $D_3$ is added to each of edges of the second octagon so that the octagonal restricted region is determined in size and in shape. The octagonal restricted region is a octagon with a fourth distance $D_4$ from a center to an edge of the octagon, the fourth distance $D_4$ being equal to a sum of the second distance $D_2$ and the third distance $D_3$.

The compacting method according to this embodiment can further adopt the following modification.

Figure 10:
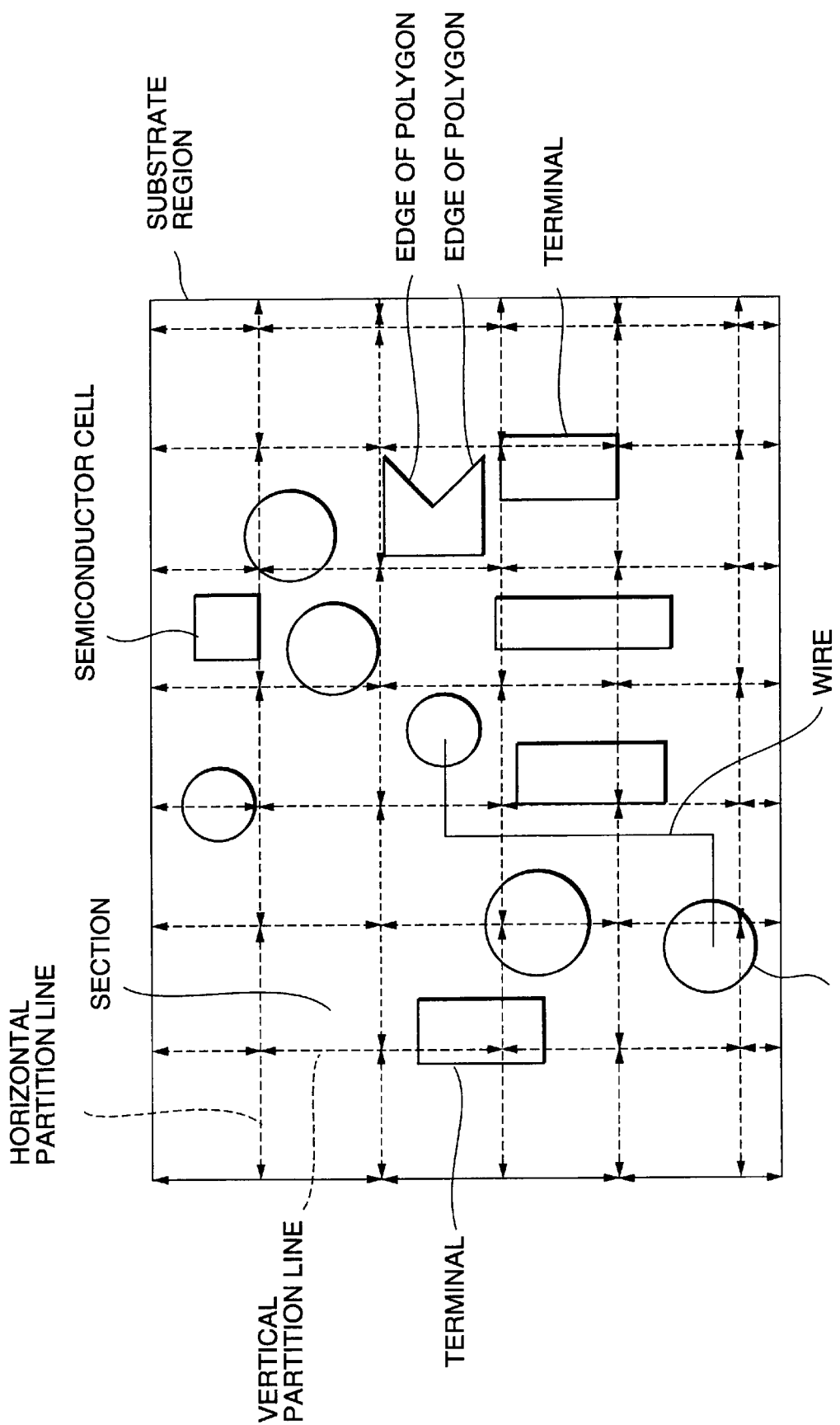
FIG. 10 is a view for use in describing the partitioning substrate region into sections.

Prior to the definition of the terminal constraint graphs, the substrate region is partitioned with a plurality of vertical partition lines (VPLs) and a plurality of horizontal partition lines (HPLs), so that a plurality of sections are obtained, as illustrated in FIG. 10. The illustrated vertical and horizontal partition lines are arranged in the form of hound's-tooth check. Both of the vertical and the horizontal partition lines are also correctively referred to as partition lines (PL). Each length of the vertical and the horizontal partition lines is variable, and accordingly, each size of the sections is variable. The vertical and horizontal partition lines are picked up on the defining, to be handled as the terminals. Herein, the part of the via-hole, the semiconductor cell and the edges of the conductor which is approximated into the polygon, are depicted in FIG. 10, but all are handled as terminals, as mentioned above.

After the partitioning, the sections are changed in size, to accommodate the terminals therewithin, if possible. The number of the terminals accommodated in each section can be selected at the designer direction. With this modification, it serves a lot of trouble if the appropriate partitioning is executed, because it causes the defining to be executed for each section, instead of entire substrate region.

Figure 11:
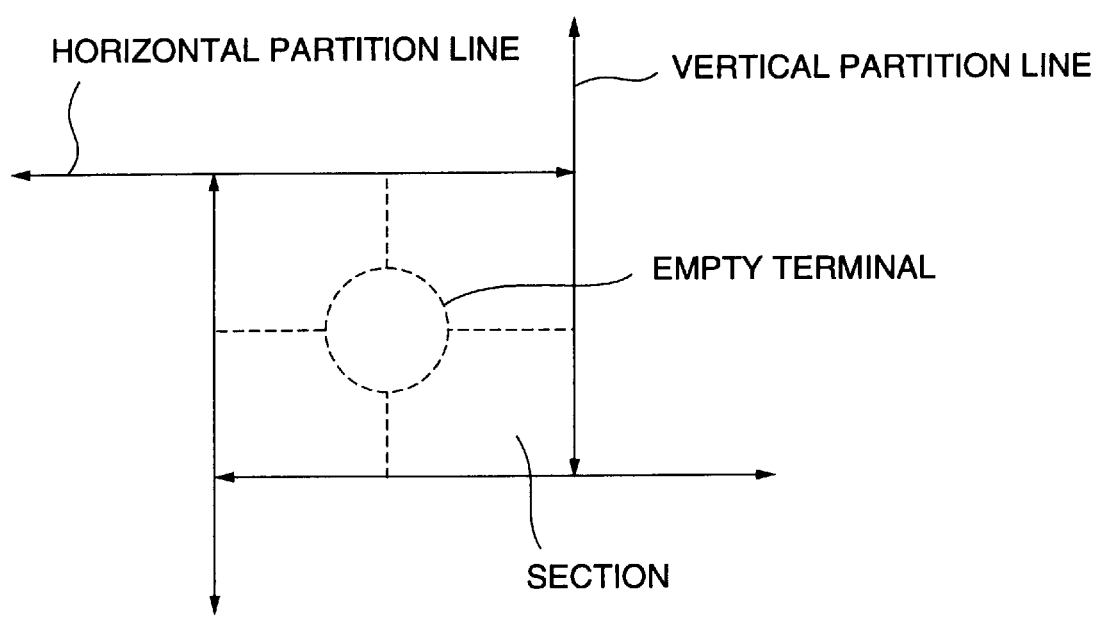
FIG. 11 is a view for use in describing the assuming empty terminal.

It is then detected whether or not the terminals except for the partition lines belong to one of the sections. As the result, if no terminal belong to the one section, an empty terminal is supposed to be placed as the terminal at a center of the one section, as illustrated in FIG. 11. Besides, the defining step of the terminal constraint graph is repeatedly executed, in the one section, for all of pairs of particular terminals selected among the partition lines and the empty terminal.

If the resultant of the detecting shows that a plurality of the terminals except for the partition lines belong to the one section, the defining is repeatedly executed, in the one section, for all of the pairs of particular terminals selected among the terminals including the partition lines. If only one terminal except for the partition lines belongs to the one section, the defining is repeatedly executed, in the one section, for all of the pairs of particular terminals selected among the partition lines and the only one terminal.

Herein, in case of adopting the concept of section divided, when the components are moved, the partition lines may be also moved in accordance with the movements of the components.

Furthermore, the above-mentioned method of the embodiment can be modified as the following. After the defining of the terminal constraint graph and prior to the determining of the component constraint graph, it is detected whether or not the pair of particular terminals are given the same signal. According to the detecting, the terminal constraint graph relating to the pair of particular terminals given the same signal is removed, and then, the component constraint graph is determined. This removing makes the calculation of the determination easy.

It may be further adopted that a target moving vector is designated, prior to the assuming step of the graph problem. Herein, the target moving vector has a target direction and a target distance in the moving of each component. In this event, the defining of the terminal constraint graph may be executed in accordance with the target moving vector.

Moreover, the above-mentioned method can adopt the following modification, after the circuit layout has been once compacted. It may be required that the compacted circuit layout want to be included within a target size. To meet the requirement, the following modification is effective.

For the sake of clarity, a shape of the substrate region is supposed to be a rectangular having vertical lines and horizontal lines in the predetermined and perpendicular directions, respectively. Also, a shape of a target substrate region is decided to be another rectangular having target vertical lines and target horizontal lines smaller than the vertical lines and horizontal lines in the predetermined and perpendicular direction, respectively.

In this modification, a particular one of the pairs of the particular terminals is identified for each layer pattern, after the circuit layout has been compacted once. If one pair of the particular terminals satisfies a requirement that the movement in the first compaction direction of the particular terminal $T_D$ causes the once compacted circuit layout to be over the target substrate region in the second compaction direction, the one pair is the particular pair. That is, if the path corresponding to the pair is selected in the solving step of the shortest path problem, the compacted circuit layout is not included within a desired size. Therefore, the terminal constraint graph of the particular pair is removed, and then, the graph problem is re-assumed as a re-assumed graph problem in consideration of the removing. When the re-assumed graph problem is solved, and accordingly, each component is moved in the first compaction direction, a sized of the compacted circuit layout comes to be included within or to get closer to the desired size.

It will be appreciated that the above-mentioned embodiment and modifications may be embodied in a computer system for a layout compaction apparatus that contains hardware and software enabling it to perform the foregoing compaction operations, so that the layout compaction apparatus obtains a compacted layout data of the compacted circuit layout from original layout data of the circuit layout.

Now, detail examples will be concretely made about a layout compaction apparatus according to embodiments of the invention, with reference to some drawings. The layout compaction apparatus is adapted, responsive to the original layout data of the circuit layout, to virtually move the components, and thereby, to virtually compact the circuit layout. As the result of virtually compaction, the layout compaction apparatus produces the compacted layout data of the compacted circuit layout.

Figure 12:
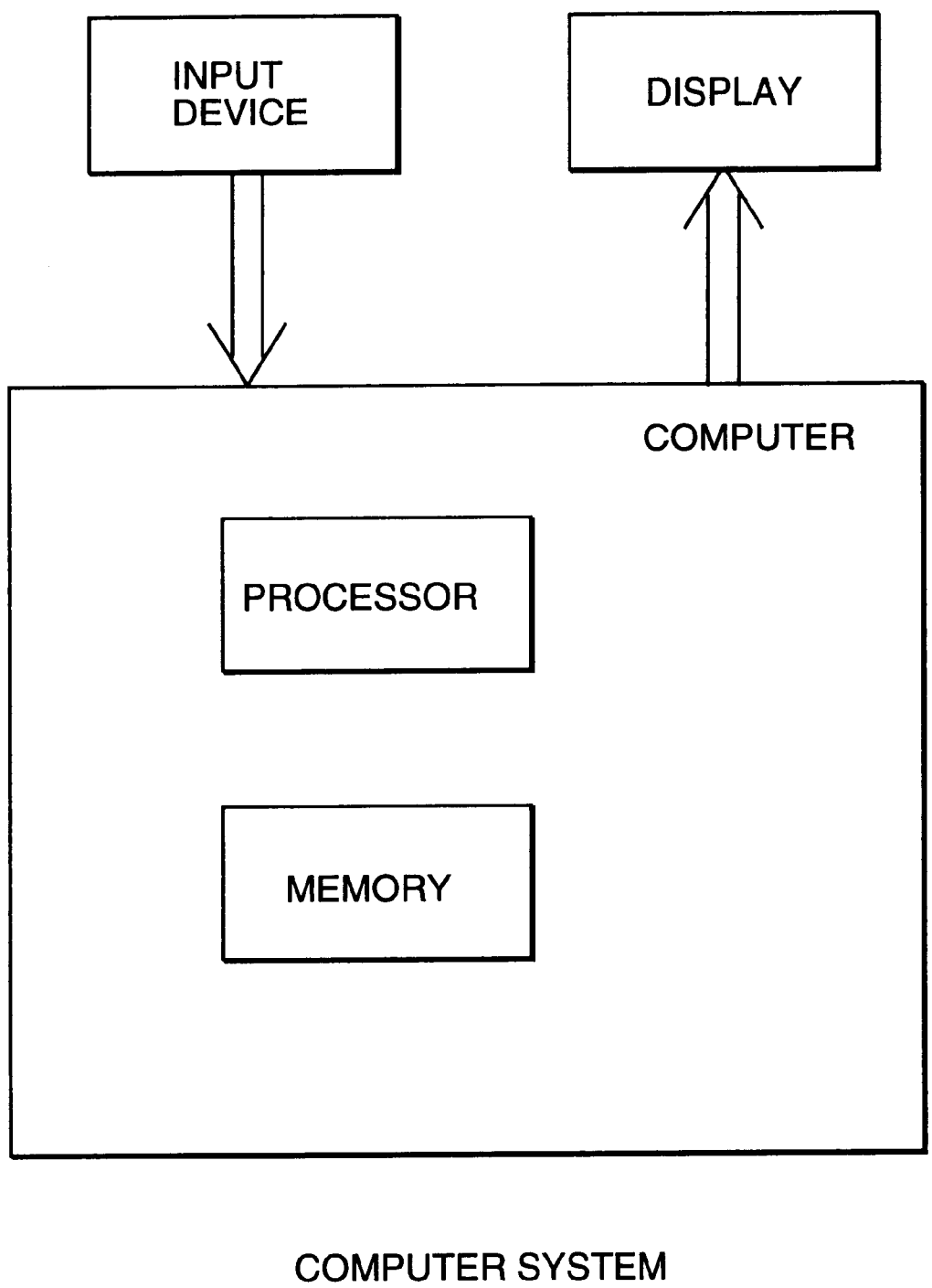
FIG. 12 shows, in schematic form, a computer system of a layout compaction apparatus.

Such layout compaction apparatus comprises a processor, a memory, an input device and a display, as shown in FIG. 12. I/O interface and various kinds of other computer's components are omitted in FIG. 12, for the sake of simplicity. The illustrated memory includes software instructions adapted to enable the processor to cause the layout compaction apparatus to perform the above-mentioned method. In other ward, the illustrated processor always performs in accordance with the software instructions included in the illustrated memory. The illustrated memory is further adapted to store data processed and/or to be processed by the processor. The memory comprises, for example, an integrated circuit and a hard disk drive. The illustrated input device may comprise a mouse, a keyboard, and a touch-panel apparatus.

Figure 13:
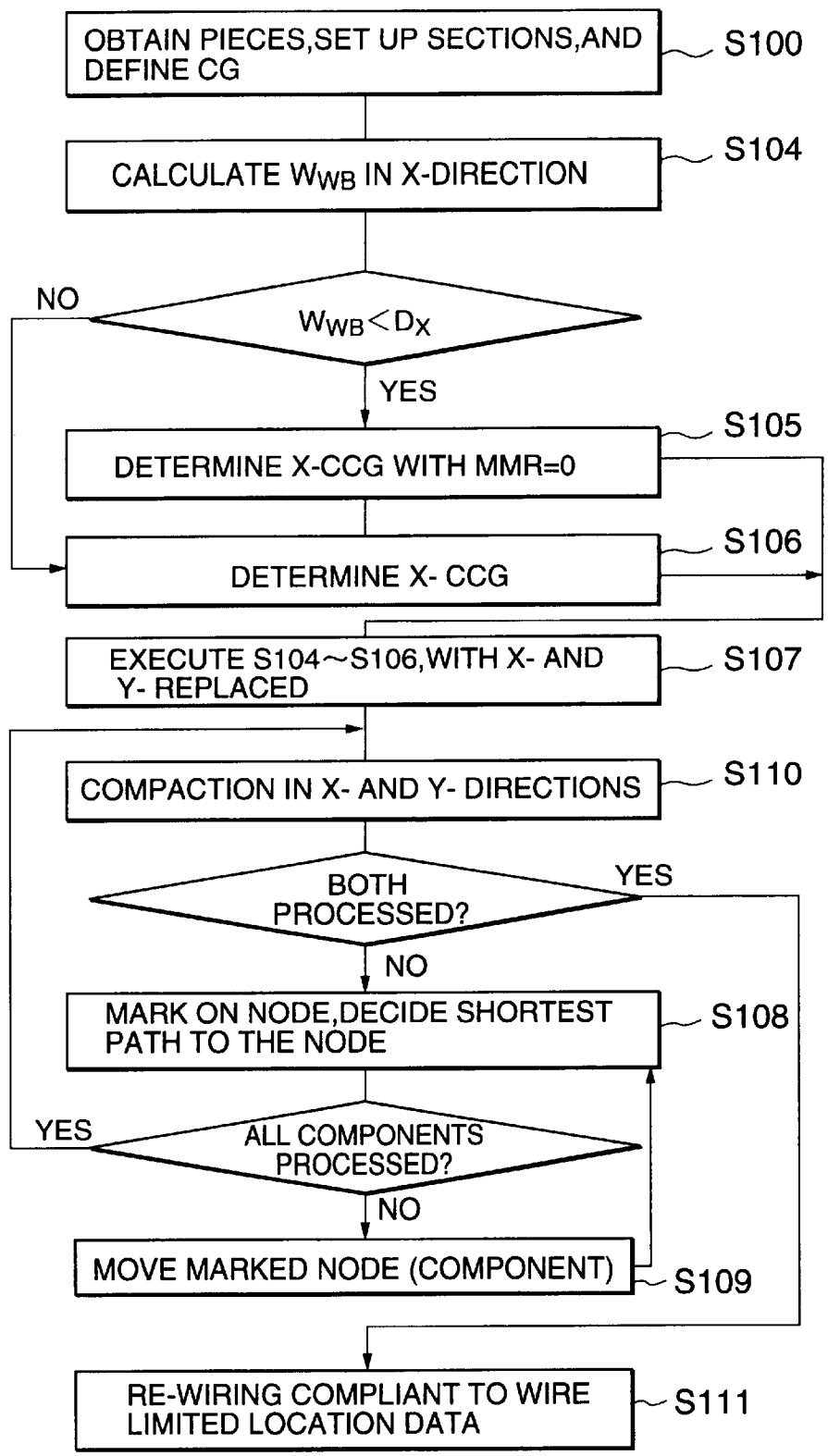
FIG. 13 is a flow-chart showing operations according to a first example.

In a layout compaction apparatus according to a first example, the processor performs as illustrated in FIG. 13.

When layout data are inputted, the processor produces piece data from the layout data, in the step S100 shown in FIG. 12. Herein, 'pieces' are objects to be processed by the processor, and comprise the above-mentioned 'terminals' and parts of 'wires', and so forth. In detail, the layout data are separated into the terminals, the wires, the via-holes, the polygons (conductors), profiles of the components, profiles of the substrate, and letters of 'marking pattern', and so on. Especially, the wire is further separated at a turning and a junction thereof, and a crossing between the wire and the terminal. Similarly, the polygon is further separated into edges thereof. The results of separation are all handled as pieces.

When pieces are obtained, for each piece, piece data, location data and shape data are produced to be stored into the memory with data structures illustrated in FIGS. 14, 15, 16 and 17. Herein, the producing of the data are executed for the each layer pattern.

As for piece obtained from the terminal, via-hole, or the like, piece data comprise a piece number, a component number, a shape number, a location number, a signal name, and section number, as shown in FIG. 14. The piece number indicates the piece itself, and corresponds to, for example, the above-mentioned 'terminal number i'. The component number represents the component that the piece belongs to, and corresponds to, for example, the above-mentioned 'component number j'. That is, if a plurality of the pieces belong to one component, all of the pieces has the same component number. For example, although the pieces of the via-hole have different piece data at respective layers, all have a common component number. The shape number is for linking the piece data with the shape data indicative of the shape of the piece. The location data is for linking the piece data with the location data representative of the location of the piece on the layout pattern and the layer on which the piece is arranged. As regards the shape data and the location data, explanation will be made in later. The signal name represents a name of a signal that the piece receives. The section number indicates a section to which the piece belongs. Herein, the section is an area enclosed with the partition lines, which will be described in later.

On the other hand, as for the piece obtained from the wire, the polygon, or the like, the piece data comprise a piece number, a shape number, two location numbers, a signal name, and a distinction of 'fixed' and 'variable' of the pattern shape, as shown in FIG. 15. The piece number, the shape number, and the signal name are as same as ones in FIG. 14. The piece of the wire, the polygon, or the like, has two ends, and the location data are produced for each end, so that the piece data has two location numbers, as described in later. Furthermore, if one end of the wire is connected to the terminal, the end of the wire has the same location number as the terminal. Similarly, if one end of one wire is connected to another end of another wire, two ends have the same location number as to each other. In addition, if the piece data are for the piece of the wire, the item of the distinction is 'variable', while, if for the piece of the polygon, the item of the distinction is 'fixed'.

The location data comprise the location number, an X-coordinate value, a Y-coordinate value, a layer number and the component number, as shown in FIG. 16. The location number indicates the location data itself, and is used in linked with the piece data. The X-coordinate vale and the Y-coordinate value are of the X–Y coordinates, which are supposed on the substrate region and have the origin at the lower-left corner. As mentioned above, since the piece of the wire or the polygon has two pairs of the X- and Y-coordinate values, two location data are made for each piece obtained from the wire and so on. The layer number indicates the layer where the corresponding piece belongs. The component number indicates the component of the corresponding piece. The layer number represents the layer to which the corresponding piece belongs, and corresponds to, for example, the above-mentioned 'layer number k'.

In detail, the layer number is assigned, in accordance with the layers, as the followings. For example, each piece obtained from the terminal belongs to a signaling layer, a power-supply layer, or a ground layer, and each piece obtained from the wire also does. Each piece obtained from the profile of the component belongs to a component profile layer. Each piece obtained from the letter belongs to a marking-pattern layer, and each piece obtained form a marking restricted region pattern also does. The marking restricted region pattern is a processing hole relating to the marking letter, and so forth.

The shape data have data of an octagon obtained by approximating the piece and comprise the shape number, and pattern widths in X-, Y-, X∠45°-, X∠−45°-directions. The shape number indicates the shape data itself, and linked with the corresponding piece. The pattern width in X-direction is width between opposite sides of the corresponding piece in X-direction. The pattern width in Y-direction is width between opposite sides of the corresponding piece in Y-direction. The pattern width in X∠45°-direction is width from the lower-left side to the upper-right side of the corresponding piece. The pattern width in X∠−45°-direction is width from the lower-right side to the upper-left side of the corresponding piece.

It should be noted here that, even if the violation for the design rule exists on the original layout data of the circuit layout, this apparatus allows the existence. If the original layout data does not meet the design rule, the apparatus corrects the violation, taking the design rule into consideration, for example, in the process of the defining of the terminal constraint graph.

After the pieces data, the shape data, and the location data are produced and stored in the memory, the substrate region is partitioned into a plurality of sections with partition lines (PL), in the step S100 shown in FIG. 12.

In detail, the vertical partition lines (VPLs) and the horizontal partition lines (HPLs) are arranged in a lattice form, while a shape of the section is a square having edges, each of which has a length equal to a minimum size of the terminal.

Such section is stored in the memory as section data having the data structure illustrated in FIG. 18. The section data comprise a section number, the layer number, the location numbers of the corners of the section, the piece numbers of the partition lines enclosing the section, and the piece numbers of the terminal included within the section.

The section number is assigned to the section and has a unique number on the layer which the section exists on. Concretely, the section number comprises, for example, a vertical order in the Y-direction and a horizontal order in the X-direction. That is, the vertical order has a lower number if the corresponding piece is closer to the bottom of the substrate region, while the horizontal order has a lower number if the corresponding piece is close to the left of the substrate region. Thus, the section number is a unique on a layer. Herein, as regards a plurality of the layers, although there are the sections having the same section numbers, they are distinguished from each other by referring to the layer number.

Furthermore, it is detected where the corners of the section locate, and thereby, the detected locations are stored in the form of the foregoing location data. To be linked with the location data, each location number of the corners is stored in the section data. Also, as key to know the partition lines enclosing the section, the piece numbers of the partition lines are stored in the section data.

The piece numbers, which are for the terminals included within the section, are determined, as the followings. At first, as for a center of the piece, a location is calculated, and then, it is identified which section the calculated location corresponds to. The section data of the identified section store the piece number of the piece, in question, as shown in FIG. 18. On the other hand, the section number of the identified section is stored in the piece data of the piece, in question, as shown in FIG. 14.

Moreover, for each of the partition lines, piece data are produced, as shown in FIG. 19. The piece data of the partition line comprise a piece number of the partition line, and the component number of the partition line, the shape number of the partition line, and the location number, and a joint direction. Among them, the piece number, the component number, and the shape number are assigned in the same way to ones of other pieces. A location of the partition line is decided on the basis of the middle point of the partition line, in question, and thereby, the location data of the partition line are produced and the location number of the location data is stored in the piece data of the partition line.

The joint direction is determined as the result of the following processes. In an initial condition, no partition line is joined with the others, although partition lines form the sections. Under the condition, as for one corner of the section, two vertical partition lines extending from the one corner is at first directed, and then, the number of the wires traversing to the vertical partition lines, which will be a first number. Similarly, two horizontal partition lines extending from the one corner is directed, and then, the number of the wires traversing to the horizontal partition lines, which will be a second number. The difference between the first and the second number is calculated, and the calculated difference is compared with a predetermined number. For example, the predetermined number is five and represents a result of subtracting the first number from the second number. As a result of the comparison, if the difference is smaller than the predetermined number, the vertical partition lines are joined with each other at the one corner, while the horizontal partition lines are not. In this event, the piece data of the partition lines have, as the joint direction, the Y-direction. This joining process is executed for all of the corners of the section. The joining process may be executed in a condition that the vertical partition lines and the horizontal partition lines are replaced with each other.

Specifically, there is a case where the result of the comparison can not determine the joint direction of the partition lines. In this case, as for the corners close to each other, the joint directions are different from the each other. If the joining process applies to all of the corners of the sections, all partition lines are arranged in the form of hound's-tooth check, as illustrated in the above-referred FIG. 10.

After the joining of the partition lines, the piece numbers of the partition lines are updated in the section data, accordingly.

Figure 20:
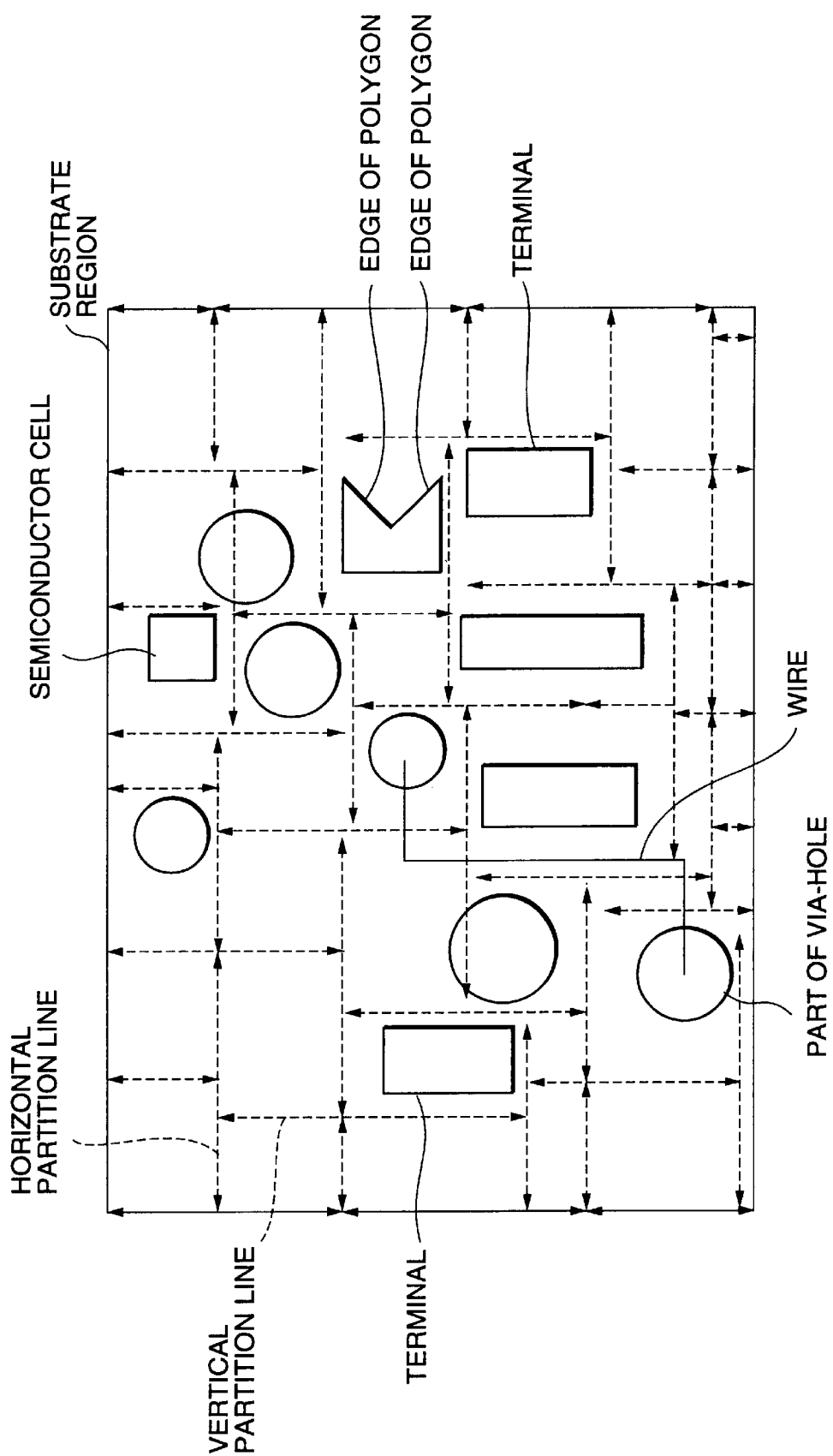
FIG. 20 is a view for use in describing the accommodating the terminals into the section.

At this point, the partition lines are cross on the terminals, via-holes, and so on, as shown in FIG. 10. To correct this, the sizes of the sections are required to be varied, so that the terminals, etc. are accommodated within the sections. Therefore, the lengths of the partition lines are varied, and together, the partition lines are moved, and thereby, the terminals are accommodated in the sections, as illustrated in FIG. 20. After the accommodating, the varied lengths of the partition lines and the moved locations of the partition lines are updated in the corresponding piece data, location data, and shape data. The varying size of the section is executed for each layer.

Particularly, the moving of the partition line meets the following condition. Each of the partition lines is moved toward the lower-left corner, under a condition that the moving does not bring about a newly crossing of the partition line and the terminals, and so forth. And then, the corresponding location data are stored with the location of the partition line closest to the lower-left corner compliant to this condition. In addition, when the partitioning is first executed, if a plurality of terminals belong to one section, the succeeding partitioning also keeps the relationship between the plurality of terminals and the one section. Furthermore, if the partition line is moved to cancel one crossing of the partition lines and the terminal, while the moving brings about a newly crossing of another partition line and the terminals, the cancellation of the one crossing are not executed.

After the terminals are almost accommodated within the sections, the processor defines a constraint graph (CG) in a case where the compaction direction is a first compaction direction. And then, the processor stores the memory with constraint graph data of the constraint graph, as shown in FIG. 21. The constraint graph data comprise a edge number, the compaction direction, and the piece numbers. The edge number is assigned to the constraint graph and is a unique one at each layer. The piece numbers are the numbers of the pieces assigned to nodes at both ends of the constraint graph. As understood from the data structure, the constraint graph itself has no weight.

In this example, the first compaction direction is the X-direction, and accordingly, the constraint graph and the constraint graph data for the first compaction direction will be also referred to as X-constraint graph and X-constraint graph data, respectively. The defining of the X-constraint graph is executed each section on each layer.

With reference to the piece data of the piece included in the section and the location data corresponding to the piece data, the arrangement of the pieces in the X-direction is decided. And then, the pieces close to each other are selected, and their piece number is written into the X-constraint graph data as the piece numbers. Herein, the first node for the X-constraint graph is one of the pieces that locates on lower side of the substrate, while the second node is the other one. Needless to say, the X-direction is also written into the X-constraint graph data as the compaction direction. When these are memorized into the X-constraint graph data, the edge number is assigned the lower number of the numbers, which has not been assigned to any edge.

Specifically, as for the selected pieces, if the piece data have the same signal name, the X-constraint graph is not defined for the selected pieces. Instead, the upper one of the selected pieces is assumed to be transparent seen from the lower one, and another piece is selected as the newly upper one. And then, the X-constraint graph is defined for the lower piece and the newly upper piece.

Furthermore, the order of the constraint graph in the X-direction is calculated to be memorized order data of the constraint graph, as shown in FIG. 22. One X-constraint graph is directed as a first edge, and then, key-piece is detected to be the piece arranged on lower side of the substrate region for the first edge. When the key-piece is detected, second edges are detected to be the X-constraint graphs having the X-constraint graph data including the piece data of the key-piece. If all of the second edges have been determined the order themselves, the order of the first edge is determined to be the lower number of the numbers, which has not been assigned to any edge. Otherwise, the second edge not having the order is directed as a newly first edge, and then, the above processing is repeated. Thus, the orders of all X-constraint graphs are determined.

When the constraint graph data and the order data is determined for the X-direction, and then, such determination is executed for the Y-direction, in the same way of the X-constraint graph data and the order data thereof. Herein, the constraint graph for the Y-direction and the data thereof will be also referred to as Y-constraint graph and Y-constraint graph data, respectively.

In steps of S104 through S106 shown in FIG. 13, the terminal constraint graphs for the X-direction are defined, and then, the component constraint graphs for the X-direction are determined. Their data are stored in the memory with the data structures as shown in FIGS. 23 and 24. The terminal constraint graph and the terminal constraint graph data for X-direction will be also referred to as X-terminal constraint graph and X-terminal constraint graph data, respectively. The component constraint graph and the component constraint graph data for X-direction will be also referred to as X-component constraint graph and X-component constraint graph data, respectively.

Referring to FIG. 23, terminal constraint graph data comprise a compaction direction, the piece numbers of the pieces corresponding to first and second nodes, a belt width, a maximum movable range (MMR) of the second node for the first node, the shape number of the octagonal restricted region, a number of wires traversing between the pieces, the piece numbers corresponding to the traversing wires. Herein, the pieces corresponding to the first and second nodes are the above-mentioned 'particular terminals', and the first and second nodes correspond to the particular terminals $T_U$ and $T_D$, respectively.

Referring to FIG. 24, the component constraint graph data comprise the compaction direction, the component numbers of the component corresponding to first and second nodes, a terminal constraint graph number, and a minimum one of the maximum movable ranges of the corresponding terminal constraint graphs.

In detail, these data shown in FIGS. 23 and 24 are produced as the described in later.

At first, the X-direction is written into the terminal constraint graph data, as the compaction direction.

Figure 25:
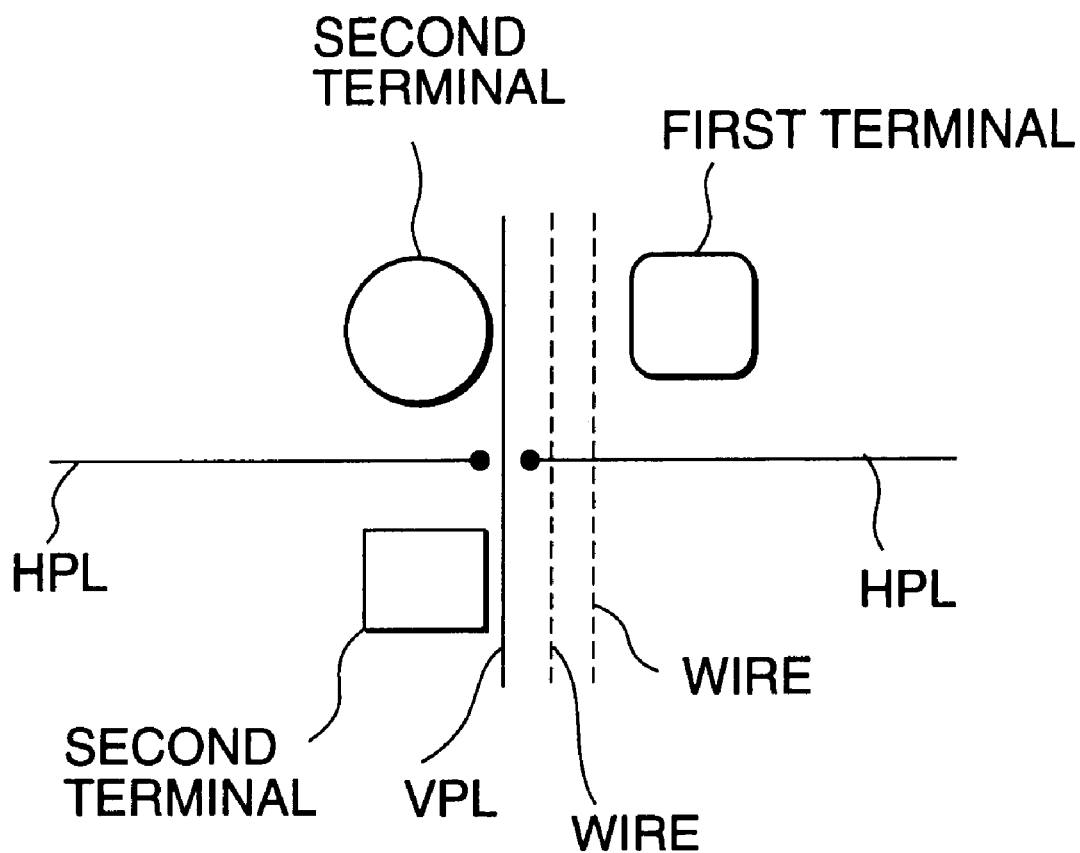
FIG. 25 is a view for use in describing the defining the terminal constraint graph.

After than, it is directed to first and second terminals arranged at opposite side of each other relative to the vertical partition line, as shown in FIG. 25. The first and second terminals become the particular terminals, and the piece numbers corresponding to the first and second terminals are written into the terminal constraint graph data. If one of the first and second terminals does not exist, an empty terminal is assumed to be arranged on a center of the corresponding sections and to be handled as the other one terminal.

And then, the wires traversing the particular terminals are detected, with reference to a plurality of the piece data and a plurality of the location data both corresponding to the particular terminals and the wires. When the number of the wires traversing between the particular terminals is detected, the total width of the traversing wires can be calculated. At this point, the number of the traversing wires and the piece numbers corresponding to the traversing wires are written into the terminal constraint graph data.

And then, the belt width is obtained by adding, to the total width, the margins compliant to the design rule. As understood from the calculation, the term 'belt width' in this process is slightly different from the above-mentioned 'belt width', because of causing the handling in the computer to be easy. That is, the belt width hereinafter includes not only wire bundle case, but also one wire case and no wire case. In one wire case, the belt width comes to be equal to the wire width, while, in no wire case, the belt width comes to be 'zero' or a predetermined width required by the design rule. The obtained belt width is written into the terminal constraint graph data.

After that, it is judged whether the belt width $W_{WB}$ is smaller that the distance $D_X$ in the X-direction between the particular terminals or not. If the belt width $W_{WB}$ is smaller than distance $D_X$, and then, the step S105 is executed, else the step S106 is executed, as shown in FIG. 13.

In step 105 of FIG. 13, 'zero' is written into the terminal constraint graph data, as the maximum movable range, because $W_{WB}<D_X$. And then, the component constraint graph data are produced on the basis of the terminal constraint graphs including one having 'zero' as the maximum movable range. The determining of the component constraint graph is executed in the way described above with reference to FIG. 4. Therefore, the component constraint graph data have 'zero' as the selected maximum movable range in FIG. 24. At this time, the processor stores the component constraint graph data with the terminal constraint graph having 'zero' as the maximum movable range.

Herein, if both of the existing component constraint graph data and the newly produced ones include the same component numbers, it is identified which data include the maximum movable range smaller than the other, and then, both of the data are updated to the identified data.

On the other hand, when the belt width $W_{WB}$ is not smaller than the distance $D_X$, in step S104 of FIG. 13, the maximum movable range is calculated for the terminal constraint graph, as the followings. Herein, the calculation of the maximum movable range can be applied to the terminal constraint graphs except for one having 'zero' as the maximum movable range.

Figure 26:
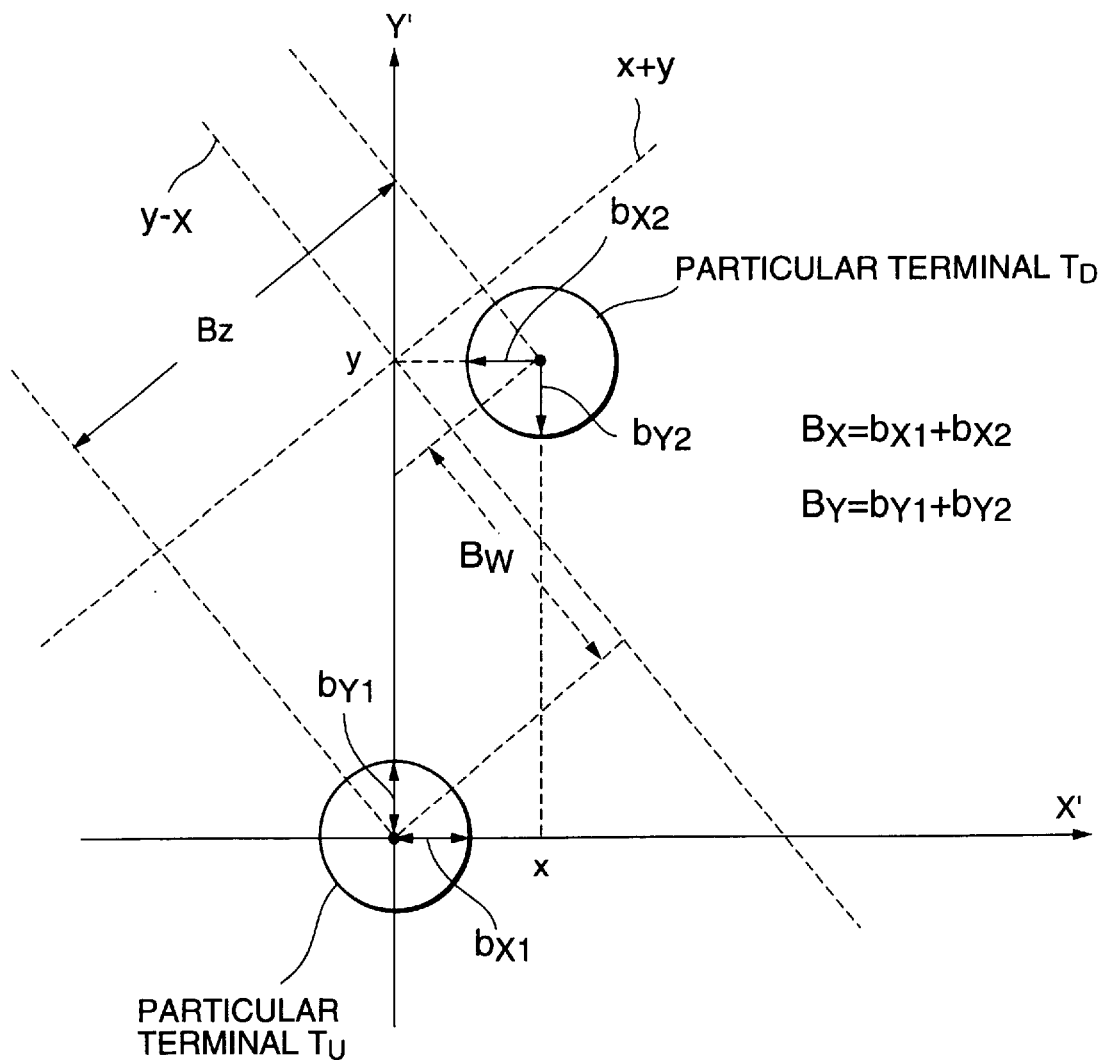
FIG. 26 is a view for use in describing the calculating maximum movable range.

To calculate the maximum movable range (M), some of the variables are defined with reference to FIG. 3. The particular terminal $T_D$ is assumed to be arranged on the relative space where a position of the particular terminal $T_U$ is the origin, that will be depicted in FIG. 26. And then, the particular terminal $T_D$ locates at a position of (x, y) on the X'–Y' coordinates. The particular terminals $T_U$ and $T_D$ have lengths of $b_{X1}$ and $b_{X2}$ in X'-direction, and lengths of $b_{Y1}$ and $b_{Y2}$ in Y'-direction. Under the circumstance, Bx is defined as a sum of the $b_{X1}$ and $b_{X2}$, while By is defined as a sum of the $b_{Y1}$ and $b_{Y2}$. Furthermore, when both of the particular terminals $T_U$ and $T_D$ are projected onto the line represented by 'x+y', Bz is defined as a distance between the centers thereof. Similarly, when both of the particular terminals $T_U$ and $T_D$ are projected onto the line represented by 'y–x', Bw is defined as a distance between the centers thereof.

Under the definition of the variables, if the following inequality (1) stands up, the maximum movable range (M) are calculated, by using the following equations (2) through (6).

$$-Bx<x<Bx \tag{1}$$

$$U1=By \tag{2}$$

$$U2=Bz=x \tag{3}$$

$$U3=Bw+x \tag{4}$$

$$U=|\text{a minimum one among } U1, U2, U3| \tag{5}$$

$$M=y-U$$

When the maximum movable range is calculated for each of the X-terminal constraint graphs, the X-component constraint graph is calculated on the basis of the corresponding X-terminal constraint graphs, as described above with reference to FIG. 4. Herein, if both of the existing component constraint graph data and the newly produced ones include the same component numbers, it is also identified which data include the maximum movable range smaller than the other, and then, both of the data are updated to the identified data, again.

In almost cases, the step 106 is executed after the step S104. The maximum movable range in the X-direction serves the restriction of the moving in the X-direction, because the moving distance of the component can not exceed the maximum movable range in the X-direction. As the result, even if the moving of the component in the X-direction is executed, the components have a movable space therebetween in the Y-direction.

Herein, the above-mentioned calculation of the terminal constraint graph can be replaced with the following calculation.

At first, the particular terminals are selected to be the first and the second terminals between which a virtual line having an inclination of the least degrees relative to the X-axis is defined. After that, the vertical partition line traversing between the selected first and second terminals is handled as the terminal.

Besides, the terminal constraint graph is defined for the particular terminals that are the selected second terminal and the vertical partition line. In the illustrated in FIG. 25, such terminal constraint graph data has "0" as the belt width and "0" as the maximum movable range, and accordingly, the component constraint graph has zero of the selected maximum movable range.

Similarly, the terminal constraint graph is defined for the particular terminals that are the selected first terminal and the vertical partition line. In the illustrated in FIG. 25, such particular terminals has a wire bundle therebetween, and therefore, the defining of the terminal constraint graphs is executed, according to the calculation of the maximum movable range, and so on. And then, the component constraint graph is calculated on the basis of the corresponding terminal constraint graphs.

After that, the newly second terminal is selected among the terminals except for the already selected first and second terminals, in such that a virtual line between the newly second terminal and the first terminal has an inclination of the least degrees relative to the X-axis. And then, a subtraction is carried out in such that the belt width assumed between the first terminal and the vertical partition line is subtracted from the belt width assumed between the first and second terminals.

The result of the subtraction is stored in the terminal constraint graph data of the terminal constraint graph, which is for the newly second terminal and the vertical partition line. In addition, the terminal constraint graph data are stored with the number of the wires traversing between the newly second terminal and the vertical partition line and the piece numbers of the traversing wire.

Besides, the maximum movable range for the particular terminals is calculated, and thereby, the terminal constraint graph, which is for the newly second terminal and the vertical partition line, is defined. Furthermore, the component constraint graph is determined on the basis of the corresponding terminal constraint graphs.

After that, the newly first terminal is selected among the terminals except for the already selected first and second terminals, in such that a virtual line between the newly first terminal and the second terminal has an inclination of the least degrees relative to the X-axis. And then, a subtraction is carried out in such that the belt width assumed between the second terminal and the vertical partition line is subtracted from the belt width assumed between the first and second terminals.

The result of the subtraction is stored in the terminal constraint graph data of the terminal constraint graph, which is for the newly first terminal and the vertical partition line. In addition, the terminal constraint graph data are stored with the number of the wires traversing between the newly first terminal and the vertical partition line and the piece numbers of the traversing wire.

Besides, the maximum movable range for the particular terminals is calculated, and thereby, the terminal constraint graph, which is for the newly first terminal and the vertical partition line, is defined. Furthermore, the component constraint graph is determined on the basis of the corresponding terminal constraint graphs.

After that, the above processing is repeatedly executed. That is, a still selected terminal is selected among the terminals except for the already selected terminals. The still selected terminal locates at opposite side of the already selected terminal relative to the vertical partition line. Also, a virtual line between the still selected and the already selected terminals has an inclination of the least degrees relative to the X-axis. And then, the terminal constraint graph is defined for the still selected and the already selected terminals. Furthermore, the component constraint graph is determined on the basis of the corresponding terminal constraint graphs.

When the modification is applied to the defining of the terminal constraint graph, the number of the terminal constraint graph to be processed becomes small. In detail, if the sizes of the sections are determined to be large in the pre-processing of the step S106, the number of the terminals accommodated in each section becomes many. As the result, the number of the terminal constraint graph also increases, for the terminals belonging to different sections from each other, so as to be multiplied the number of the terminals belonging to one section and the number of the terminals belonging to the other section. However, if the modification is adopted to the defining of the terminal constraint graph, the number of the terminal constraint graph is decreased to be the total number of the terminals belonging to the sections.

To decrease the number of the terminal constraint graph, the followings are effective. The followings relate to the combination of the particular terminals in one section.

In one section, pairs of two terminals are selected among all terminals belonging to the one section. Among them, only the pairs, which meet the following condition are, selected the pairs of the particular terminals:

(1) The second terminal locates at a position closer to the right side (the upper side) than the first terminal; and (2) The first and second terminals are meet the equation of $(A-1) \times (B-1)=0$. A is defined as the number of the terminals $T_A$. The terminal $T_A$ are selected among the terminals locating at a position closer to the right side (the upper side) than the first terminal. Furthermore, provided that a distance $D_A$ between the terminal $T_A$ and the first terminal, and the distance $D_0$ between the first and second terminals, $D_A \leq D_0$. Also, B is defined as the number of the terminals $T_B$. The terminal $T_B$ are selected among the terminals locating at position closer to the left side (the lower side) than the second terminal. Furthermore, provided that a distance $D_B$ between the terminal $T_B$ and the second terminal, and the distance $D_0$, $D_A \leq D_0$; where the phrases in parentheses correspond to the case of compacting in the Y-direction.

If the first and the second terminals meet the above requirements, then the first and the second terminals are the particular terminals. Such selection of the particular terminals causes the number of the terminal constraint graph to decrease.

Turning to FIG. 13, after the steps S104 through S106 are executed, and thereby, the X-component constraint graphs are obtained, the same steps S104 through S106 are executed with the X-direction replaced with the Y-direction, in a step S107. As the result, the Y-component constraint graphed are also obtained.

Herein, the next step is step S110 in FIG. 13 and it is detected whether the compacting is executed in both of the X- and the Y-directions or not. However, directly after the steps S107, since the compacting is not executed in both of the directions, the next steps S108 and S109 are repeatedly executed. At first, the steps S108 and S109 are executed for the X-direction, and then, the same steps S108 and S109 are executed for the Y-direction.

In the step S108, the shortest path problem is solved, by applying the Dijkstra method with the graph based on the X-component constraint graphs. As the result, the shortest path is obtained for each component. Herein, with reference to FIGS. 5 and 6, detail explanation will be made about how to solve the shortest path problem.

At first, the nodes joined with the starting point $N_{0,0}$ are found out, as candidates for a first node. In FIG. 5, the candidate is only the node $N_{C,1}$, and therefore, the edge joining between the nodes $N_{0,0}$ and $N_{C,1}$ is selected and the node $N_{C,1}$ is marked as the first node. And thereby, the length of the shortest path to the first node is determined to "1", as shown in FIG. 6.

And then, because the edge joined the node $N_{0,0}$ with the node $N_{C,1}$ is one, the nodes joined with the first node $N_{C,1}$ are found out, as candidates for a second node. In FIG. 5, the candidates are the node $N_{C,2}$ and the node $N_{C,7}$. Between the nodes $N_{C,2}$ and $N_{C,7}$, a length of the path to the node $N_{C2}$ is shortest, and therefore, the edge joining between the nodes $N_{C,1}$ and $N_{C,2}$ is selected and the node $N_{C,2}$ is marked as the second node. And thereby, the length of the shortest path to the second node is determined to "3", as shown in FIG. 6.

And then, the nodes joined with all nodes existing on the already determined paths are found out, as the candidates for a third node. In FIGS. 5 and 6, all nodes existing on the already determined paths are the nodes $N_{C,1}$ and $N_{C,2}$, and therefore, the candidates are the nodes $N_{C,3}$ and $N_{C,7}$. Between the nodes $N_{C,3}$ and $N_{C,7}$, a length of the path to the node $N_{C,7}$ is shortest, and therefore, the edge joining between the nodes $N_{C,1}$ and $N_{C,7}$ is selected and the node $N_{C,7}$ is marked as the third node. And thereby, the length of the shortest path to the third node is determined to "4", as shown in FIG. 6.

After then, the nodes joined with all nodes existing on the already determined paths are found out, as the candidates for a fourth node. In FIGS. 5 and 6, all nodes existing on the already determined paths are the nodes $N_{C,1}$, $N_{C,2}$ and $N_{C,7}$, and therefore, the candidates are the nodes $N_{C,3}$, $N_{C,4}$ and $N_{C,8}$. Among the nodes $N_{C,3}$, $N_{C,4}$ and $N_{C,6}$, a length of the path to the node $N_{C,3}$ is shortest, and therefore, the edge joining between the nodes $N_{C,7}$ and $N_{C,3}$ is selected and the node $N_{C,3}$ is marked as the fourth node. And thereby, the length of the shortest path to the fourth node is determined to "6", as shown in FIG. 6. After that, the similarly processing is repeatedly executed, and thereby, the orders of marking on each node and the shortest path to each node are determined.

In this example, after a node is marked in the step S108, the component corresponding to the marked node is moved in the X-direction with the moving distance being equal to the shortest path to the marked node. And then, turning to the step S108, next node is marked, as shown in FIG. 13.

After the steps S108 through S109 are repeatedly executed, and thereby, the compacting in the X-direction is completed, the same steps S108 through S109 are repeatedly executed with the X-direction replaced with the Y-direction, in a step S107. As the result, the compacting in the Y-direction is also completed, and then, re-wiring of the wires is executed in next step S111.

Prior to the re-wiring, wire limited region data is produced for every wire, as shown in FIG. 27. The wire limited region data comprise the piece number of the wire, in question, the piece number of a core terminal, the shape number of a restricted region of wiring, the location number of the core terminal.

In detail, the wire limited region data is produced, as shown in FIG. 28. One wire is directed to be processed, and then, the Y-terminal constraint graph data having the piece number of the directed wire are extracted among all of the Y-terminal constraint graph data. And then, the core terminals are determined to be the terminals that correspond to the first nodes for the Y-terminal constraint graphs. Herein, if the wire, which shape is already fixed in shape, is laid between the core terminal and the directed wire, the fixed wire may be the newly core terminal, instead of the foregoing core terminal.

For each core terminal, the wires arranged between the directed wire and the core terminal is identified. And then, the additional width $W_{ADD}$ is determined to be a sum of the total width of the identified wires, margins compliant to the design rule and the wire width of the directed wire. On the other hand, the core terminal is approximated into an octagon. The additional width $W_{ADD}$ is added to each edge of the octagon to form the restricted region of wiring, as shown in FIG. 28. Such restricted region is written into the shape data.

After the shape data of the restricted region is produced, the shape number of the shape data is written into the wire limited location data. The piece number and the location number of the core terminal is also written into the wire limited location data. Thus, the wire limited location data is obtained.

After the calculation of the wire limited location data, the directed wire is suitably re-wired outside of the corresponding restricted region of wiring. Such re-wiring is repeatedly executed for all directed wires, and then, all wires are re-wired.

Figure 29:
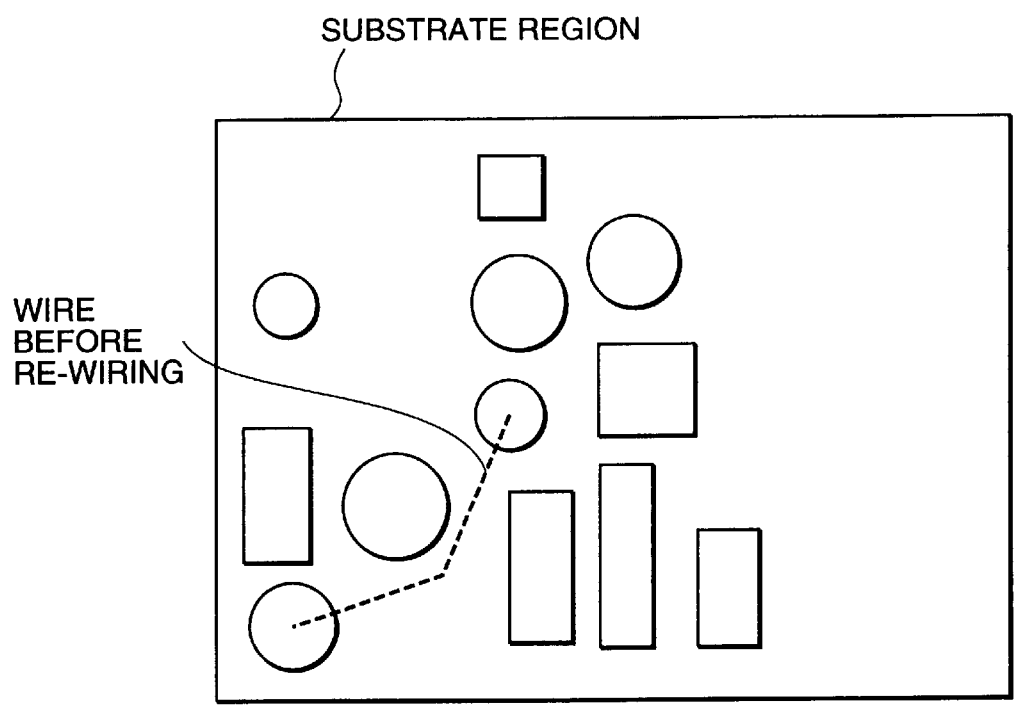
FIG. 29 is a view for use in describing an operation of the first example.

Now, for the first example, summarized procedures will be explained with also reference to FIGS. 29 through 31.

As illustrated in FIG. 10, the sections are at first arranged, and then the sections are varied in size and in location to accommodate the terminals, as shown in FIG. 20.

And then, the X-terminal constraint graphs are defined in the illustrated way in FIG. 3, and furthermore, the X-component constraint graphs are determined in the way shown in FIG. 4.

On the other hand, the Y-terminal constraint graphs are also defined in the illustrated way in FIG. 3, and furthermore, the Y-component constraint graphs are determined in the way shown in FIG. 4.

After that, the moving orders and the moving distances of the components are calculated in accordance with the X-direction, and thereby, the compacting in the X-direction is carried out. Similarly, the compacting in the Y-direction is carried out. As the result of the compacting in both directions, the components are moved for the lower-left corner of the substrate region, and therefore, the compacted layout is obtained, as shown in FIG. 29.

Figure 30:
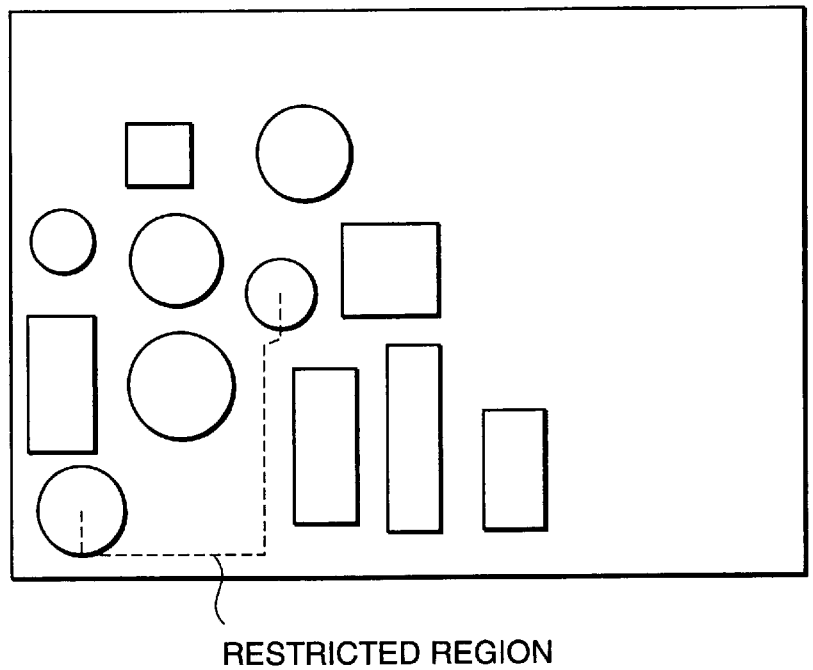
FIG. 30 is a view for use in describing another operation of the first example.
Figure 31:
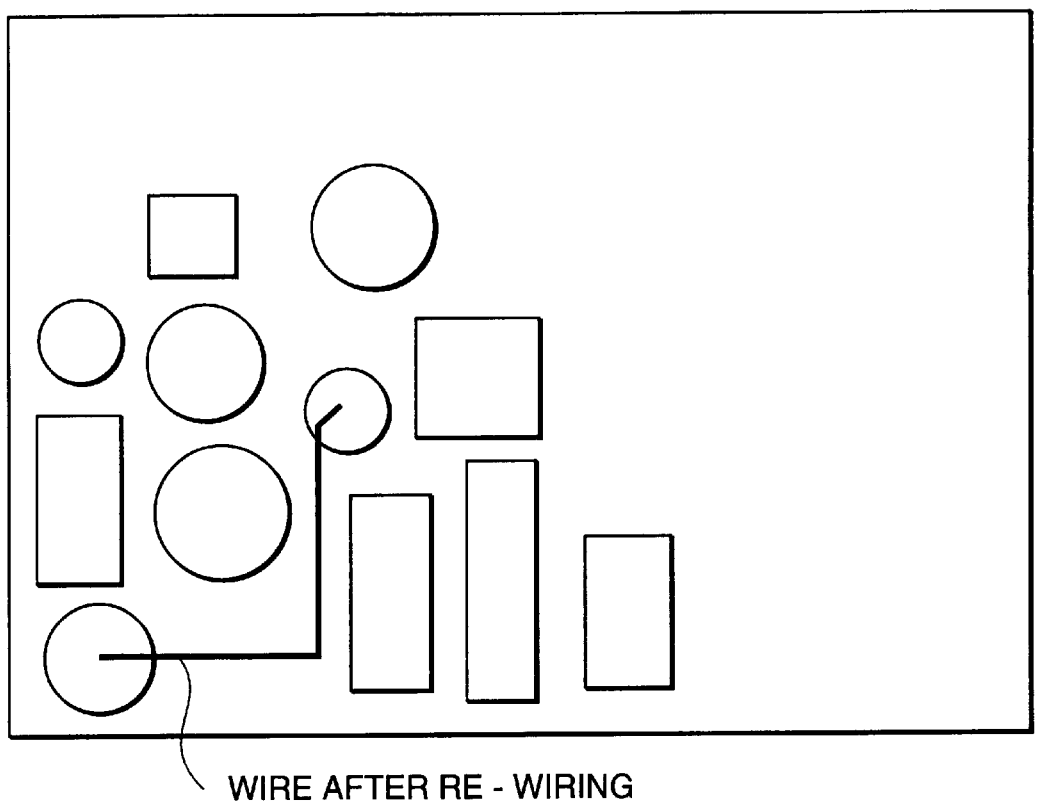
FIG. 31 is a view for use in describing another operation of the first example.

After that, the restricted region of the re-wiring is calculated for each wire, and thereby, the wire limited location data is produced, as shown in FIG. 30. And then, the re-wiring of each wire is executed under the restriction of the restricted region of wiring, so that the compacted layout data of the compacted circuit layout. The compacted layout data is stored into the memory.

With the layout compaction apparatus, the compacted circuit layout does not have the problem, such as cross talk, because the assumption of the graph problem takes the design rule into consideration. More concretely, the terminal constraint graph is defined and the moving vectors of the components are determined, taking the design rule into consideration. Therefore, the layout compaction apparatus can handle wiring of the diagonal form with a relationship of the components and the wires kept, and which can meet the design rule.

Figure 32:
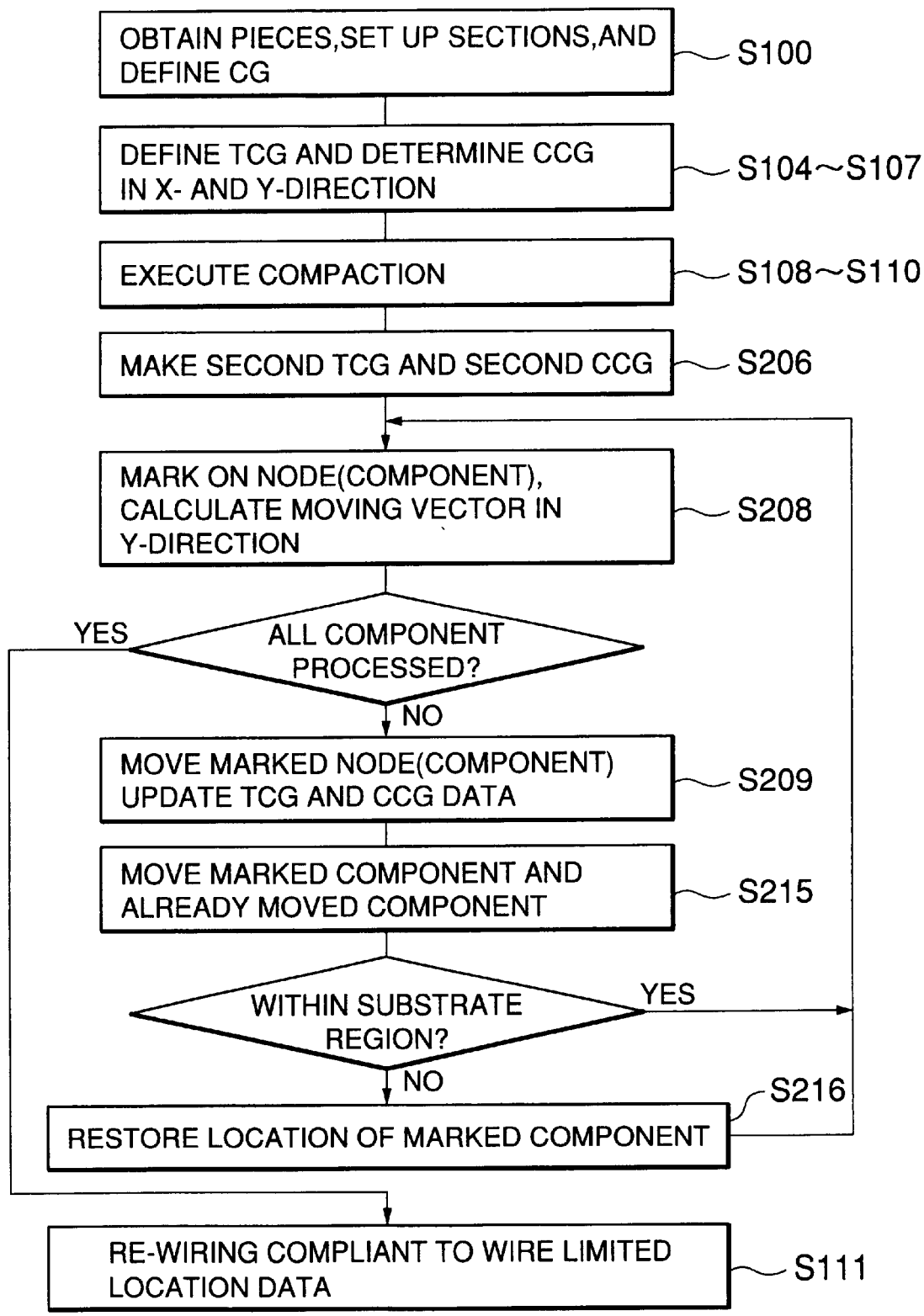
FIG. 32 is a flow-chart showing operations of a second example.

Now, description will be made about a layout compaction apparatus according to a second example. In the layout compaction apparatus, the processor performs as illustrated in FIG. 32.

When layout data are inputted, the processor executes the obtaining of the pieces, the setting up the sections, the accommodating the terminals into the sections, and the defining of the constraint graphs, according to the same way to the first example (in the step S100).

And then, the processor executes the defining of the terminal constraint graphs and the determining of the component constraint graphs in the X- and Y-directions, according to the same way to the first example (in the steps S104 through S107).

And then, the processor executes the compacting in the X- and Y-directions, in the same manner of the first example (in the steps S108 through S110). As a result of the compaction, the once compacted circuit layout is obtained.

The above compacting does not consider the requirement that the compacted circuit layout want to be included within a target size. Therefore, the once compacted circuit layout may not be included within the target size, while may have free spaces to be removable. The following steps are useful in getting rid of the problem.

Figure 33:
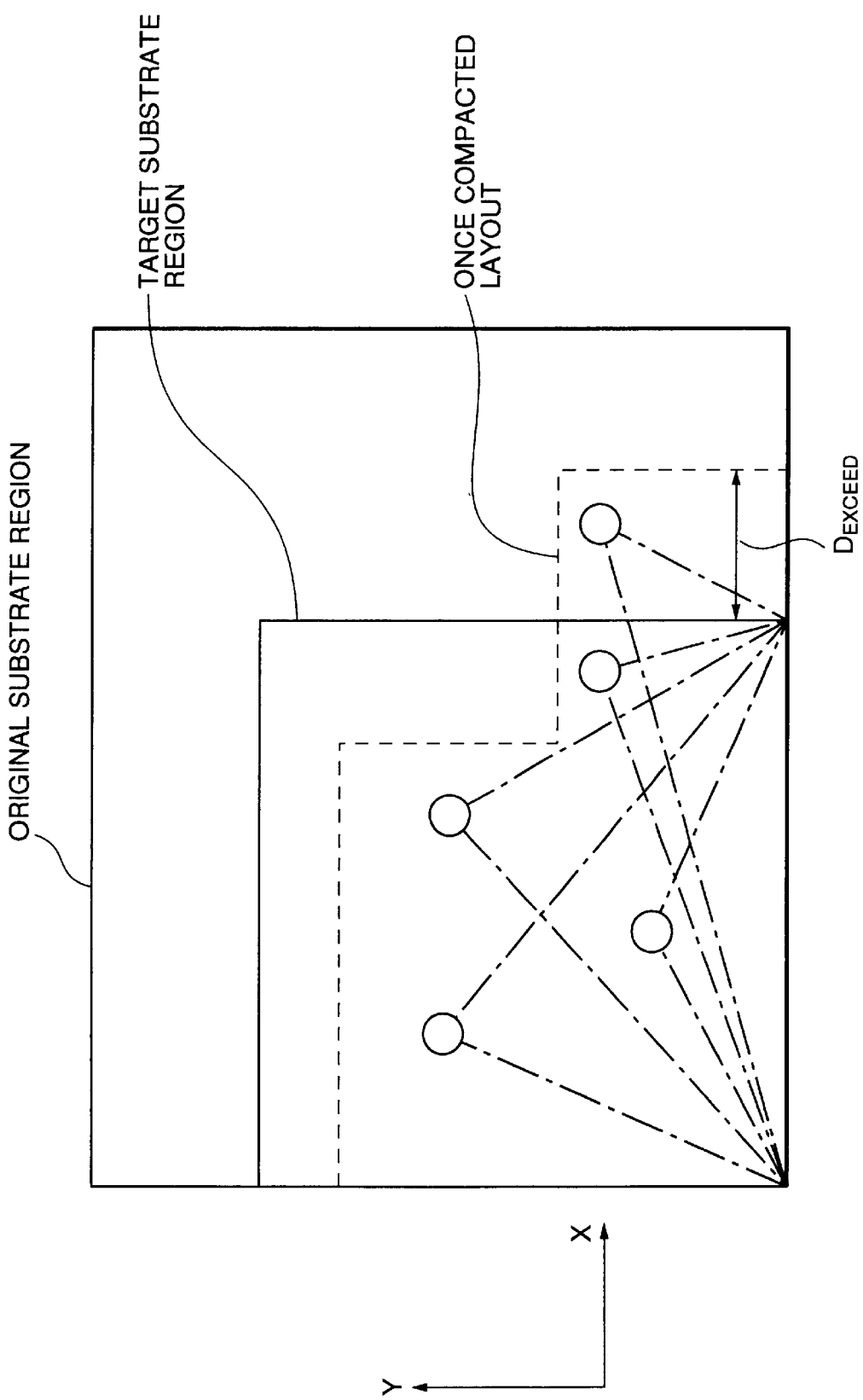
FIG. 33 is a view for use in describing an operation of the second example.

Herein, a substrate region having the target size is called a target substrate region. For example, a shape of the original substrate region is supposed to be a rectangular having vertical lines and horizontal lines in the Y- and X-directions, respectively, as shown in FIG. 33. Also, a shape of the target substrate region is decided to be another rectangular having target vertical lines and target horizontal lines in the Y- and X-directions, respectively, as shown in FIG. 33. The target vertical lines and target horizontal lines are smaller than the vertical lines and horizontal lines.

The processor detects the part of the once compacted circuit layout that exceeds the target substrate region, and calculates a distance $D_{EXCEED}$ of the exceeding part in the X-direction. And then, a distance $D_{ALW}$ is determined to be longer than the distance $D_{EXCEED}$.

After that, the determining of the component constraint graphs is executed, as shown in FIG. 33.

For each component, the processor determines the component constraint graph data that is for the component and the left edge (or the lower-left corner) of the target substrate region, and writes the distance $D_{ALW}$ as the maximum movable range into the component constraint graph data. The processor also writes the X-direction as the compaction direction, into the component constraint graph data.

Furthermore, for each component, the processor determines the component constraint graph data that is for the component and the right edge (or the lower-right corner) of the target substrate region, and writes the distance $D_{ALW}$ as the maximum movable range into the component constraint graph data. The processor also writes the Y-direction as the compaction direction, into the component constraint graph data.

Figure 34:
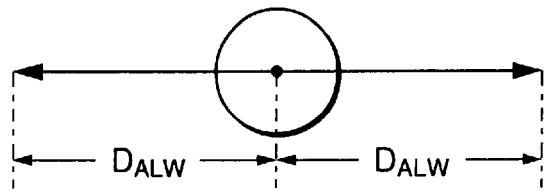
FIG. 34 is a view for use in describing an allowable distance of the component.

These X- and Y-component constraint graphs restrict the movement of the components, so that the components can move toward right and left with the moving distances being within the distance $D_{ALW}$, as shown in FIG. 34. It is noted here that the terminal existing over the target substrate region can move toward only left, because the distance $D_{ALW}$ depicted at right side of FIG. 34 has a minus value.

Figure 35:
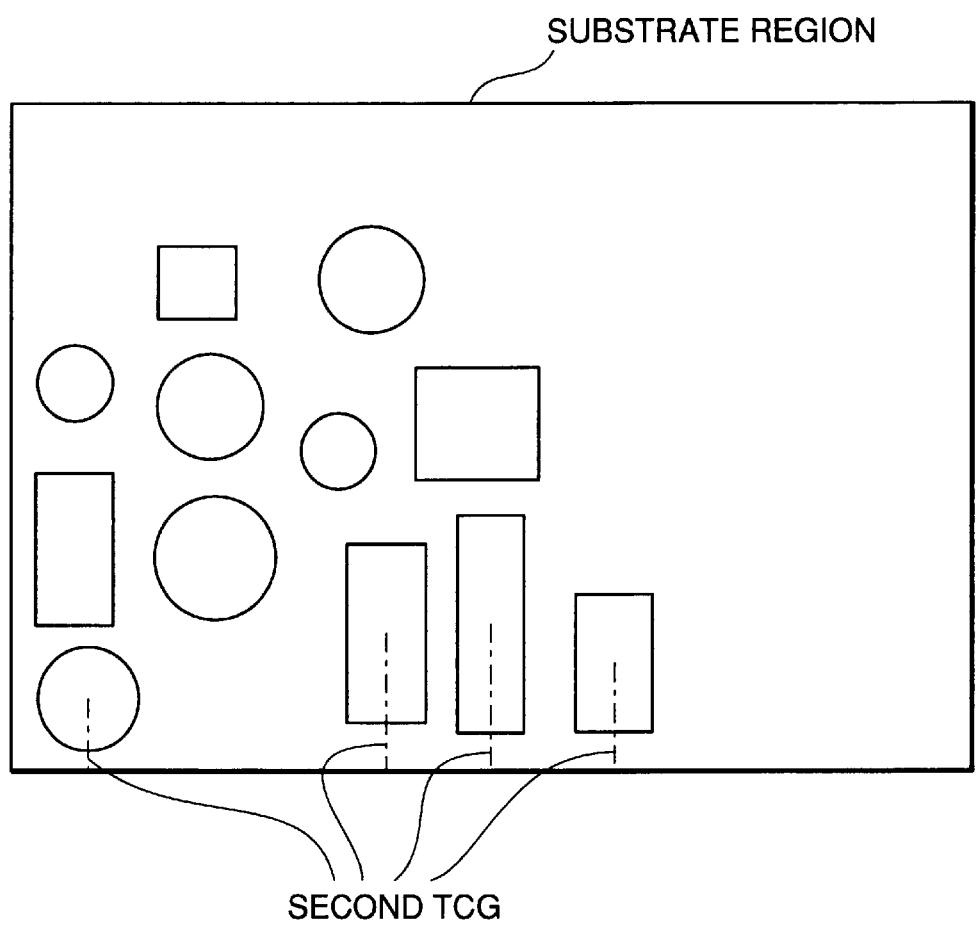
FIG. 35 is a view for use in describing another operation of the second example.

After that, the processor assumes the edges of the substrate region as the terminals. And then, the processor extracts the terminal that is not empty terminal and that is closest to the lower edges of the substrate. The extracted terminal exists on the upper side of the substrate region. The processor defines second terminal constraint graph for the extracted terminal and the lower edge of the substrate region, as shown in FIG. 35. Actually, the illustrate second terminal constraint graph is a virtual and does not exist on the substrate region. Therefore, the second terminal constraint graph is depicted with the chained line. The second terminal constraint graph data has the same data structure of the terminal constraint graph data.

And then, the processor extracts the terminal that is not empty terminal and that joined with the already extracted terminal by the terminal constraint graph. The newly extracted terminal exists on the upper side of the substrate region. The processor obtains the belt width assigned to the pair of the newly and the already extracted terminals, and adds the obtained belt width to the belt width of the pair of the already extracted terminal and the lower edge of the substrate region. The processor holds the added belt width as a temporary belt width into the memory.

Figure 36:
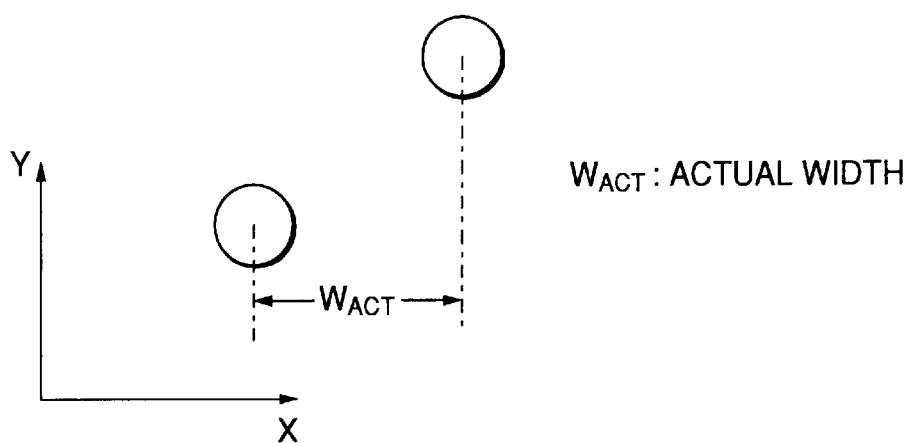
FIG. 36 is a view for use in describing an actual width between the terminals in the X-direction.
Figure 37:
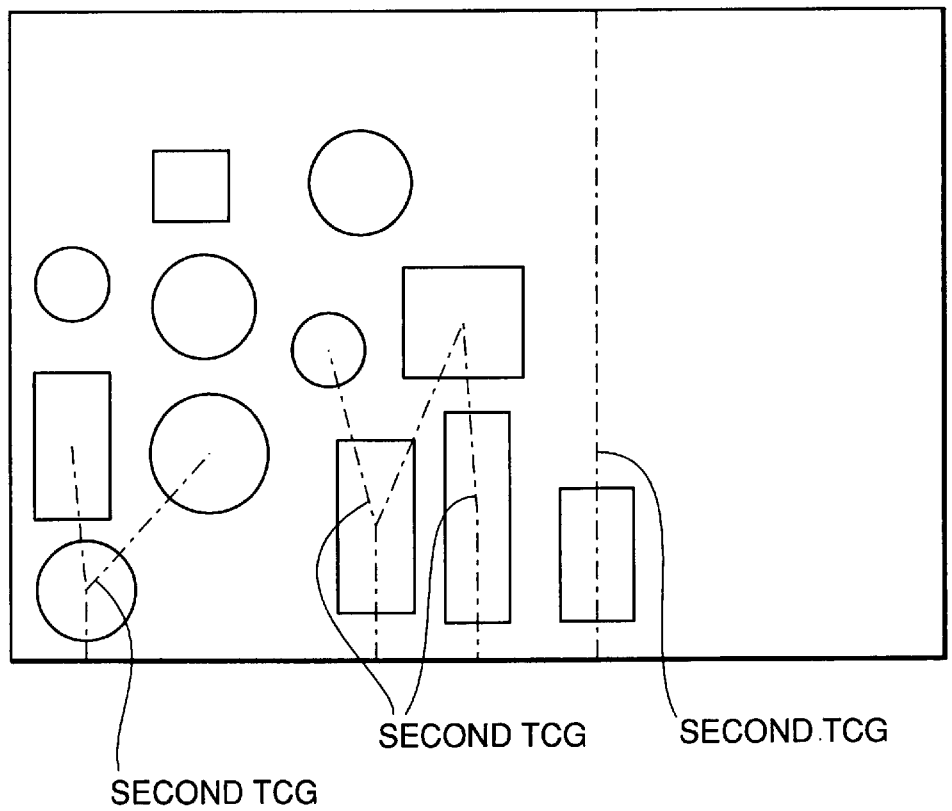
FIG. 37 is a view for use in describing another operation of the second example.

On the other hand, the processor obtains the belt width $W_{WB}$ in the X-direction of the pair of the newly and the already extracted terminals, and also, calculates an actual width $W_R$ between the newly and the already extracted terminals, as shown in FIG. 36. After that, the processor judges whether the actual width $W_R$ meets the following inequality: $0<W_R-W_{WB}<2W_{ALW}$. If the actual width meets the inequality, the processor defines the second terminal constraint graph the newly extracted terminal and the lower edge of the substrate region, as shown in FIG. 37.

And also, the processor writes the temporary belt width as the belt width into the second terminal constraint graph data. The processor also calculates the maximum movable range as the same way that is described in first example, and stores it into the second terminal restriction data. The processor further calculates the octagonal restricted region, as described above with reference to the FIGS. 8 and 9, and stores it into the second terminal restriction data.

Furthermore, the processor extracts the terminal that is not empty terminal and that joined with the already extracted terminal by the terminal constraint graph. The newly extracted terminal exists on the upper side of the substrate region. The processor obtained the belt width assigned to the pair of the newly and the already extracted terminals, and adds the obtained belt width to the belt width of the second terminal constraint graph data corresponding to the already extracted terminal. The processor holds the added belt width as a temporary belt width into the memory.

On the other hand, the processor obtains the belt width $W_{WB}$ in the X-direction of the pair of the newly extracted terminal and the terminal closest to the lower edge. And also, the processor calculates an actual width $W_R$ between the newly extracted terminal and the closest terminal, as shown in FIG. 36. After that, the processor judges whether the actual width $W_R$ meets the following inequality: $0<W_R-W_{WB}<2W_{ALW}$. If the actual width meets the inequality, the processor defines the second terminal constraint graph the newly extracted terminal and the lower edge of the substrate region.

And also, the processor writes the temporary belt width as the belt width into the second terminal constraint graph data. The processor also calculates the maximum movable range as the same way that is described in first example, and stores it into the second terminal restriction data. The processor further calculates the octagonal restricted region, as described above with reference to the FIGS. 8 and 9, and stores it into the second terminal restriction data.

Figure 38:
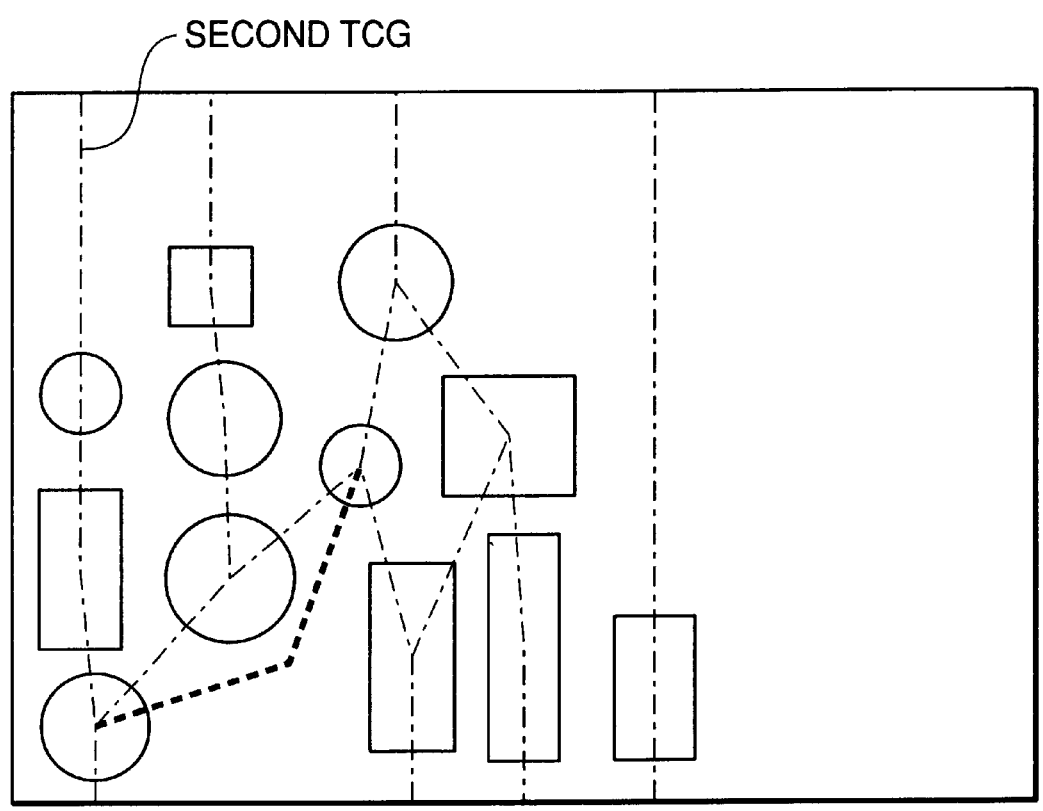
FIG. 38 is a view for use in describing another operation of the second example.

Such defining of the second terminal constraint graph is repeatedly executed until the upper edge of the substrate region becomes the newly extracted terminal. Moreover, the processor replaces the lower edge of the substrate region with the terminal closer to the lower edge, and repeatedly carries out the above-mentioned process. In addition, the processor replaces the closer terminal with the newly terminal above, and closer to, the closer terminal, and repeatedly executes the above-mentioned process. Such replacement is repeatedly executed, and accordingly, the defining of the second terminal constraint graph is repeatedly executed. For example, the resultant shown in FIG. 38 is obtained. As understood from FIG. 38 and the above description, each of the second terminal constraint graphs is a chain of the terminal constraint graphs that meet the predetermined requirements.

When the defining of the second terminal constraint graph is executed, the determining of second component constraint graph is executed, on the basis of the second terminal constraint graphs and in the same manner described in relation with the component constraint graph. The second component constraint graph data has the same structure of the component constraint graph data.

After determining the second component constraint graph data, the processor assumes the graph, by using the second component constraint graph data, and solves the shortest path problem, by utilizing Dijkstra method. Although, the processor obtains the shortest path, in turn, the description will be made under the assumption that the solving is repeatedly executed halfway, for the sake of simplicity. However, the parson skilled in the art will readily understand the operations from the description.

It is assumed that one component, namely, one node of the graph is marked, and that the shortest path to the marked component is obtained, according to the Dijkstra method. In this event, the second component constraint graph that is included in the shortest path and that is joined the marked component, will be referred to as a selected component constraint graph. The terminals of the marked component also referred to as selected terminals.

The processor extracts the terminals from the upper component (namely, second node) of the selected component constraint graph. Herein, the upper component is the marked component, while the extracted terminals are the selected terminals. And then, the processor selects one among the second terminal constraint graphs that has, as the upper terminal (namely, second terminal), the terminals of the upper component. The selected second terminal constraint graph further has the lower terminal (namely, first terminal) belonging to the component that exists on the already calculated shortest path.

And then, the processor moves the octagonal restricted region of the selected second terminal constraint graph, according to a component moving vector of the component having the terminal that is the lower terminal of the selected second terminal constraint graph.

Herein, the component moving vector of one component is obtained, as the followings.

The processor assumes the vector from the one component downward. And then, the processor downwardly extends the assumed vector, under the allowance that a tip of the assumed vector can move in right and left within the distance $D_{ALW}$, until the assumed vector reaches any one of the octagonal restricted regions of the components arranged below relative to the one component.

The processor determines, as the component moving vector of the one component, the assumed vector having a maximum length in the Y-direction. The processor memorizes, in the memory, the component moving vector with data structure shown in FIG. 39.

The component moving vector data comprise the moving vector and the component numbers. The upper component is the one component, while the lower component is the component having the octagonal restricted region whereto the moving vector touches with the tip.

Turning to the description about the solving the shortest path problem, the processor calculates the component moving vector of the marked component, and stores it into the memory. Also, the processor memorizes the length in the Y-direction of the component moving vector of the marked component as a length of the shortest path of the marked component. And then, the processor adds, to the already calculated shortest path, the component constraint graph joining between the marked component and the corresponding lower component. Furthermore, the processor subtracts the length of the shortest path in the Y-direction of the corresponding lower component from the length of the shortest path in the Y-direction of the marked component. And then, the processor updates the maximum movable range of the component constraint graph corresponding to the marked component with a value obtained by the subtracting.

There is a possibility that the processor restore all data to the condition prior to the adding the selected component constraint graph to the shortest path. Therefore, the processor holds the data required by the restoration. If all components are marked, and then, the processor executes the step S111, else, the processor executes the following step S209.

After calculating the component moving vector of the marked component, the processor moves the selected terminal with the component moving vector of the marked component. In this event, the selected terminal is moved toward closer section in the Y-direction one by one. Depending upon the length in X-direction of the moving vector, the selected terminal is moved toward closer section in the X-direction one by one. The processor updates the terminal constraint graph data and the component constraint graph data, whenever the selected terminal is moved toward the closer section one by one.

Figure 40:
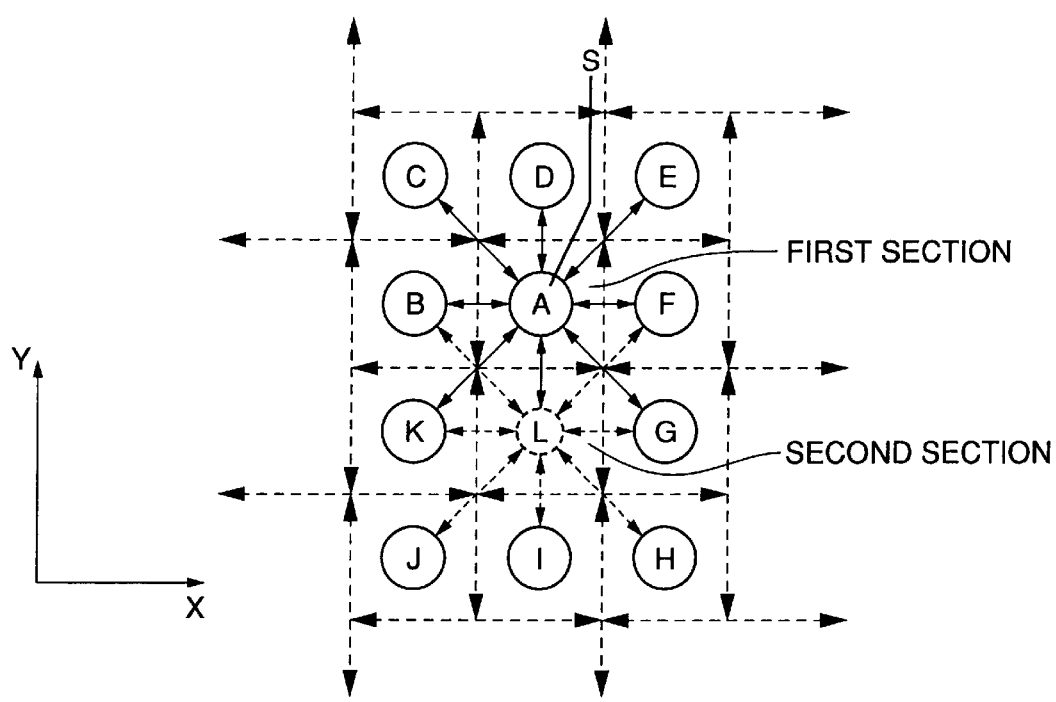
FIG. 40 is a view for use in describing another operation of the second example.
Figure 41:
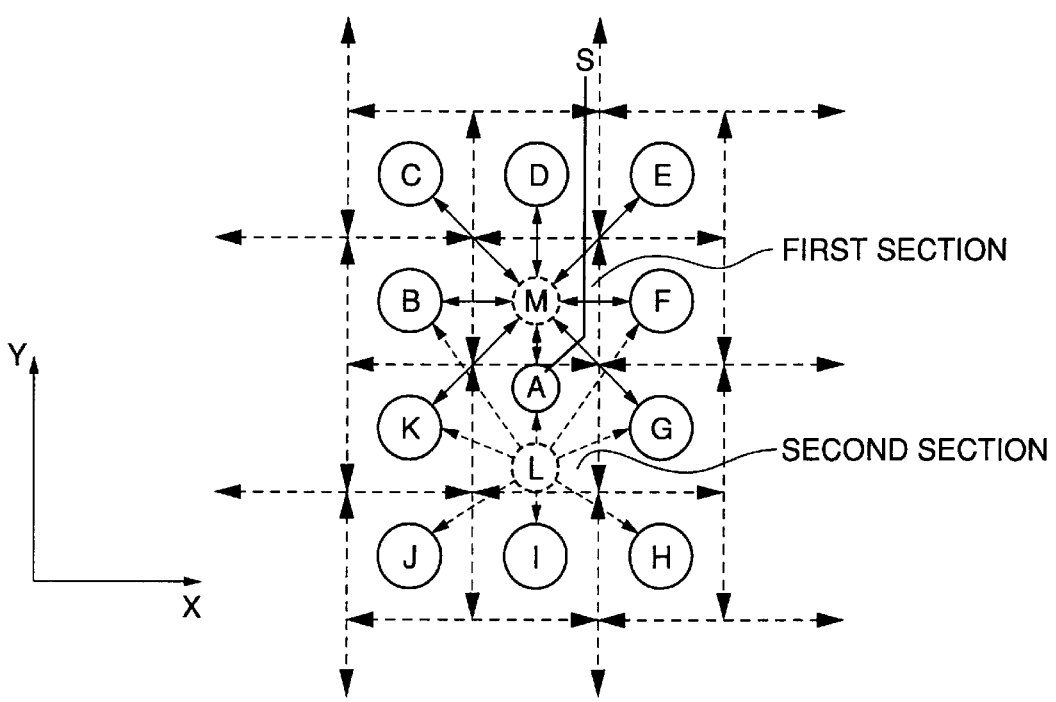
FIG. 41 is a view for use in describing another operation of the second example.

Now, detail explanation will be made about the moving of the selected terminal and the updating of the terminal and the component restriction data, with reference to FIGS. 40 and 41. In the FIGS. 40 and 41, the terminal A is moved from first section to second section closer to the first section in the Y-direction. The terminals L and M are the empty terminals.

The processor extracts the terminal L as the terminal accommodated within the second section. The terminal L is the empty terminal and serves as an intermediary of the moving of the terminal A, that will be also referred to as the intermediary terminal.

And then, the processor identifies the terminals that do not belong to the section close to the first section, but belong to the section close to the second section. In FIG. 40, the identified terminals are terminals H, I and J. The processor extracts, as intermediate belt widths, the belt widths of the terminal constraint graphs of the terminal A and the identified terminals H, I and J, respectively. Also the processor extracts, as already existing belt widths, the belt widths of the terminal constraint graphs of the terminal L and the identified terminals H, I and J, respectively.

And then, the processor adds the intermediate belt widths to the already existing belt widths to obtain additional belt widths, respectively. Herein, if the wire connected to the first terminal is included in the additional belt width, the processor removes the connected wire and updates the additional belt width. Also, if one wire is included in both of the intermediate belt widths and the already existing belt widths, the processor removes the one wire and updates the additional belt width.

And then, the processor defines, for the terminal A and each of the identified terminals, the terminal constraint graphs. The processor writes the additional belt widths into data of these terminal constraint graphs.

On the other hand, the processor further identifies the terminals that do not belong to the section close to the second section, but belong to the section close to the first section. In FIG. 40, the identified terminals are terminals C, D and E. And then, the processor removes the terminal constraint graphs that join the terminal A with the terminals C, D and E. The processor updates connecting directions of the terminal constraint graphs of the terminal A and the remaining terminals (F, G, K and B).

After that, the processor assumes the empty terminal M within the first section. The processor extracts the terminals close to the terminal M via the partition lines, among the terminals joined with terminal A. Such extracted terminals are terminals K, B, C, D, E, F and G, in FIG. 41.

The processor defines the newly terminal constraint graphs joining the terminal M with the extracted terminals K, B, C, D, E, F and G. The processor writes the belt widths of the terminal constraint graphs joining the terminal A with the extracted terminals into the belt widths of the newly terminal constraint graphs. Also, the processor defines the terminal constraint graph joining the terminal A with the terminal M, with the belt width being equal zero.

Herein, if the wire connected to the terminal A is extended in accordance with the moving of the terminal A and if the extended wire traverse between a newly pair of the terminals, the processor updates the belt width of the terminal constraint graph of the newly pair.

Turning to the step S209 in FIG. 32, the processor updates all of the maximum movable ranges in relation with the X- and Y-terminal constraint graphs that are updated or defined according to the moving of the selected terminal, as the same manner of the steps S104 through S107. Accordingly, the processor updates the component constraint graphs. And then, the processor repeatedly executes the above processing for all of the selected terminals.

After that, the processor judges whether each component is accommodated within the target substrate region or not. Herein, the component already moved by the step 208 will be called the already moved component.

In detail, the processor extracts a chain of the X-component constraint graphs that are from the left of the target substrate region through the already moved component to the marked component, and calculates the shortest path of the marked component in the X-direction. Also, the processor extracts a chain of the X-component constraint graphs that are from the marked component through the already moved component to the right of the target substrate region, and calculates the shortest path of the right of the target substrate region in the X-direction. If the shortest path of the right has a plus value, the target substrate region can be more compacted in the X-direction. Otherwise, some components are arranged over the target substrate region in the X-direction. In latter case, the step S216 is executed, as described in later.

In a case where the shortest path of the right has a plus value, the processor calculates the component moving vectors for moving the already moved component existing on the shortest path toward left. And then, the processor calculates the second vectors by adding the calculated component moving vectors to the component moving vectors that are stored before the already moved components are moved.

Also, the processor extracts the Y-second terminal constraint graphs whose upper terminals are the terminals belonging to the already moved components. And then, the processor calculates locations of the octagonal restricted regions of the lower terminals of the Y-second terminal constraint graphs, in a case of being moved with the moving vectors of the lower components to which the lower terminals belong.

And then, the processor determines lines parallel to the Y-coordinate and traversing on the tip of the second vectors. The processor calculates the uppermost points on which the determined lines and the moved octagonal restricted regions are cross.

The processor displaces the second vectors with the tips of the second vectors existing on the uppermost points to obtain newly component moving vectors. The newly component moving vectors are memorized into the memory. After that, turning to the step S208, the above-mentioned processing is repeatedly carried out.

In the step S216, the processor extracts the component joined with the marked component by the X-component constraint graph, and projects the extracted component and the marked component onto the Y-coordinate. And then, the processor calculates the moving distance in the Y-direction in a case where the extracted component and the marked component are closest to each other with the wire belt laid therebetween. The processor determines the Y-component constraint graph having the calculated distance as the maximum movable range. Such component constraint graph will be also referred to as a terminal exclusive edge.

The processor decides the octagonal restricted region of the terminal exclusive edge to be a horizontal line extending through a position, which is lower than the position of the upper terminal of the terminal exclusion edge with the maximum movable range left therebetween. Such terminal exclusion edge causes the upper terminal to be upper than the lower terminal, and restricts the upper terminal lying on the lower terminal. Herein, the processor restores data relating to the marked component, and so on, to the condition before the marked component is marked, and turns to the step S208.

As mentioned above, the processor executes the processing of the step S216, and then, prevent the compacting of the Y-direction from causing the compacted layout to over the target substrate region in the X-direction. The processor repeatedly executes the steps S208 through S216, and registers the component constraint graphs.

After that, the re-wiring is executed in the same way of the first example.

Now, further explanation will be made about the second example, with reference to FIGS. 42A and 42B.

Figure 42:
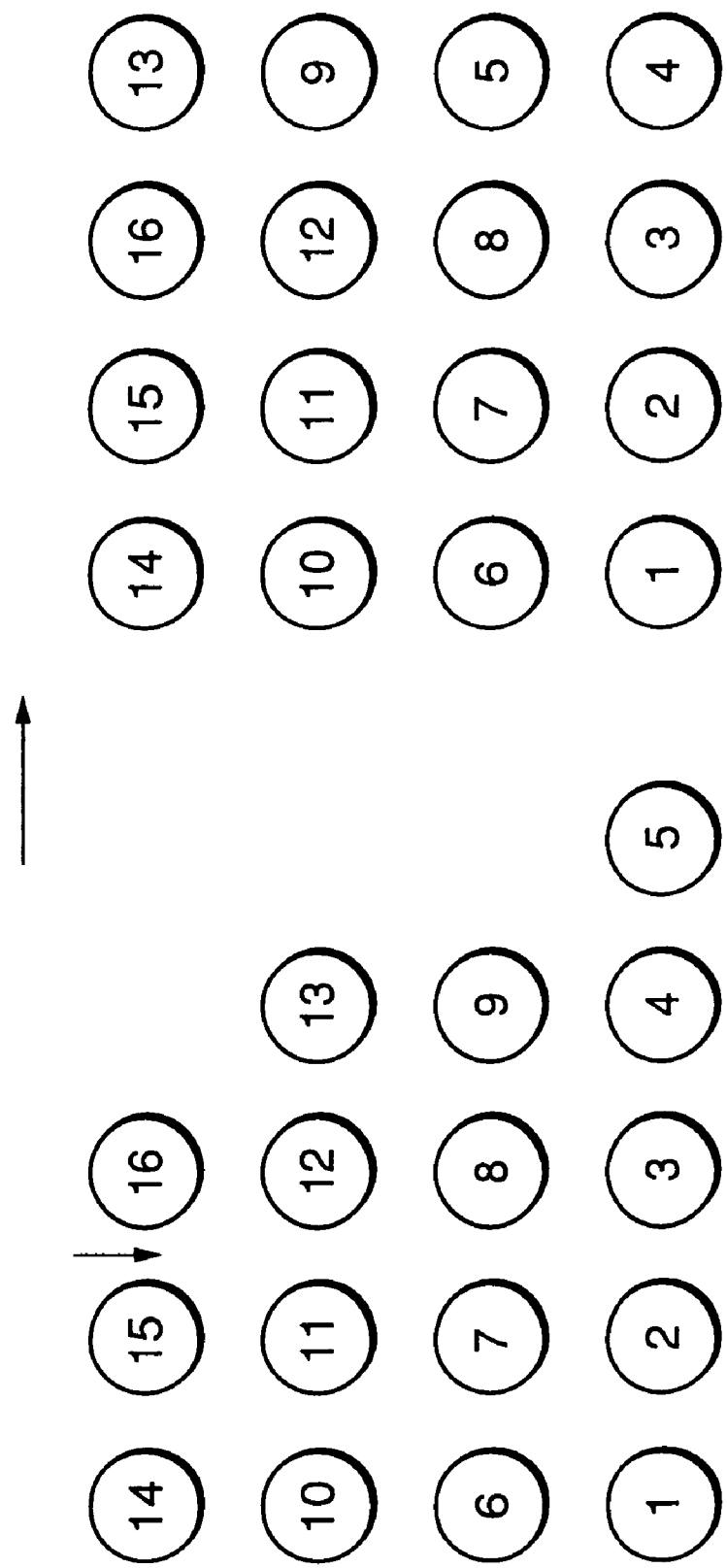
FIGS. 42A and 42B are views for use in describing another operation of the second example.
Figure 43:
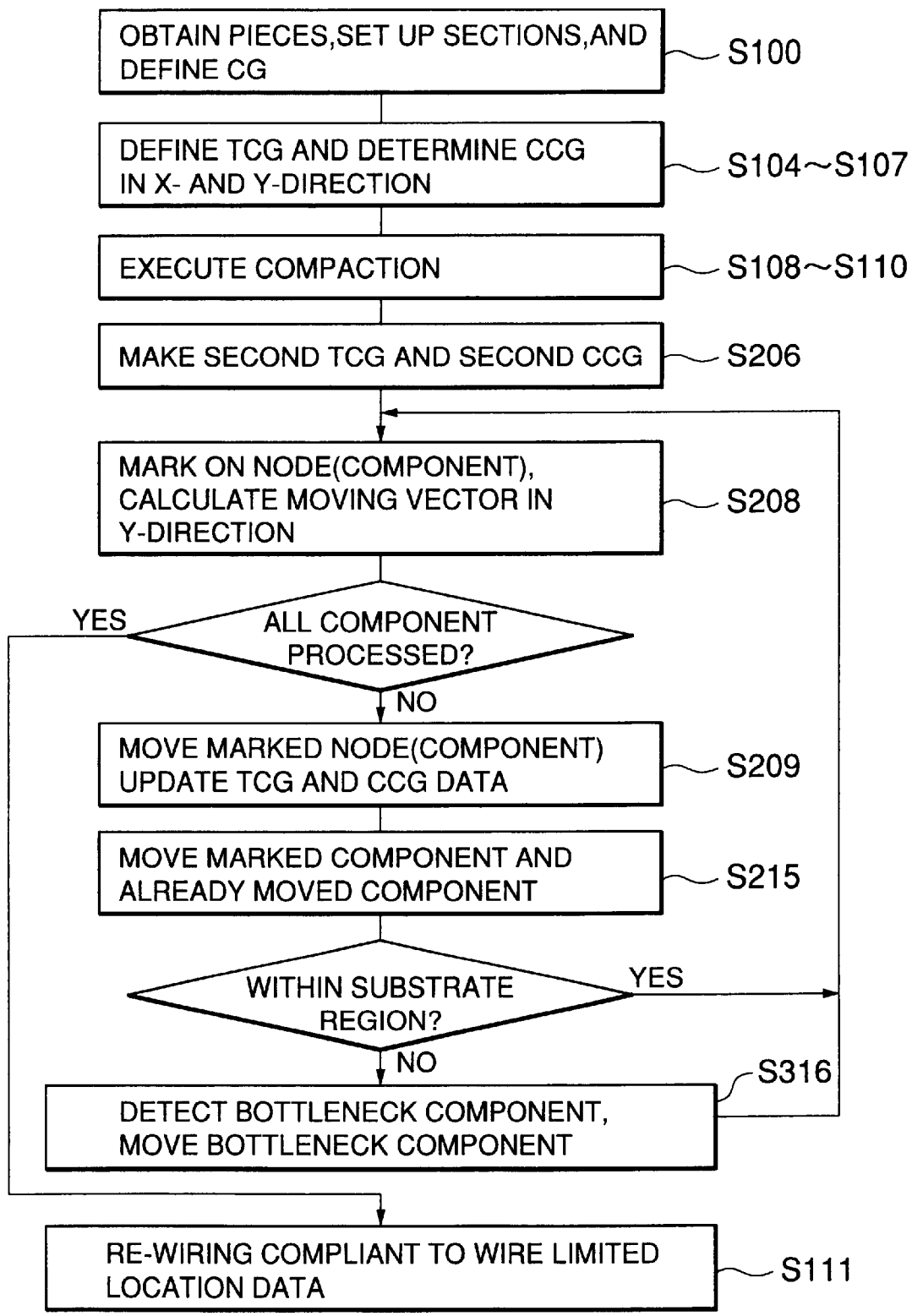
FIG. 43 is a flow-chart showing operations of a third example.

It is assumed that the processor reads the original layout data of an initial layout as shown in FIG. 42A. Herein, the target substrate region can include four components in the X-direction at maximum. Therefore, the terminals 1 through 4 are moved for down, according to the processing in the steps S108 and S109, while the terminal 5 is over the target substrate region, according to the processing in the step 215.

To correct such violation, the terminal exclusion edge that has the terminals 5 and 4 as the upper and the lower terminals is made in the step 216. And thereby, the terminal 5 is restricted to be arranged on the same row of the terminals 1 through 4. With the terminal exclusion edge, the processing in the steps S108 and S109 is executed, the terminal 5 is arranged on the upper row of the terminals 1 through 4.

And then, the terminals 6 through 8 are moved down, according to the processing in the steps S108 and S109. If the terminal 9 is moved down, the terminal 9 is arranged outside of the target substrate region. Therefore, the terminal exclusion edge is made about the terminals 9 and 8. And thereby, the terminal 9 is restricted to be arranged on the same row of the terminals 6 through 8.

Such processing is repeatedly executed, and thereby, the compacted layout shown in FIG. 42B is obtained and is accommodated within the target substrate region.

Now, the explanation will be made about the layout compaction apparatus according to a third example. The third example is modification of the second example, and only the steps S216 and the S316 are different from each other. For the sake of brevity, the same steps are not referred.

As the result of the processing in steps S206 through S209, if the shortest path of the right of the target substrate region has a minus value, then the step S316 is executed. Herein, such shortest path is called bottleneck path.

In this event, the processor identifies the components existing on the shortest path of the X-direction, which is from the left of the target substrate region, through the already moved component and the marked component, to the right of the target substrate region. And then, the processor extracts, among the identified components, the components each of which is the lower component of the component constraint graph having the upper component except for the already moved component. The processor selects, among the extracted components, the fewest kind of components, such as via-hole and so on. Such selected components are called displacement components.

And then, the processor makes the Y-terminal exclusion edge which is a part of the bottleneck path and which has the displacement component and the component existing on the bottleneck path. The processor calculates a position which has a distance to the initial position of the displacement component, the distance being not longer than the maximum movable range. And then, the processor moves the displacement component to the calculated position. The movement is executed toward the upper side of the Y-direction, and passing through the sections one by one. In accordance with the movement, the terminal constraint graphs for terminals of the displacement component and the component constraint graph for the displacement component are updated. Turning to the steps S208, and searching of the shortest path is executed, again.

As described above, the processor controls the compacted layout not to be over the target substrate region in the X-direction. The steps S208 through S316 are repeatedly executed for all marked components.

Figure 44:
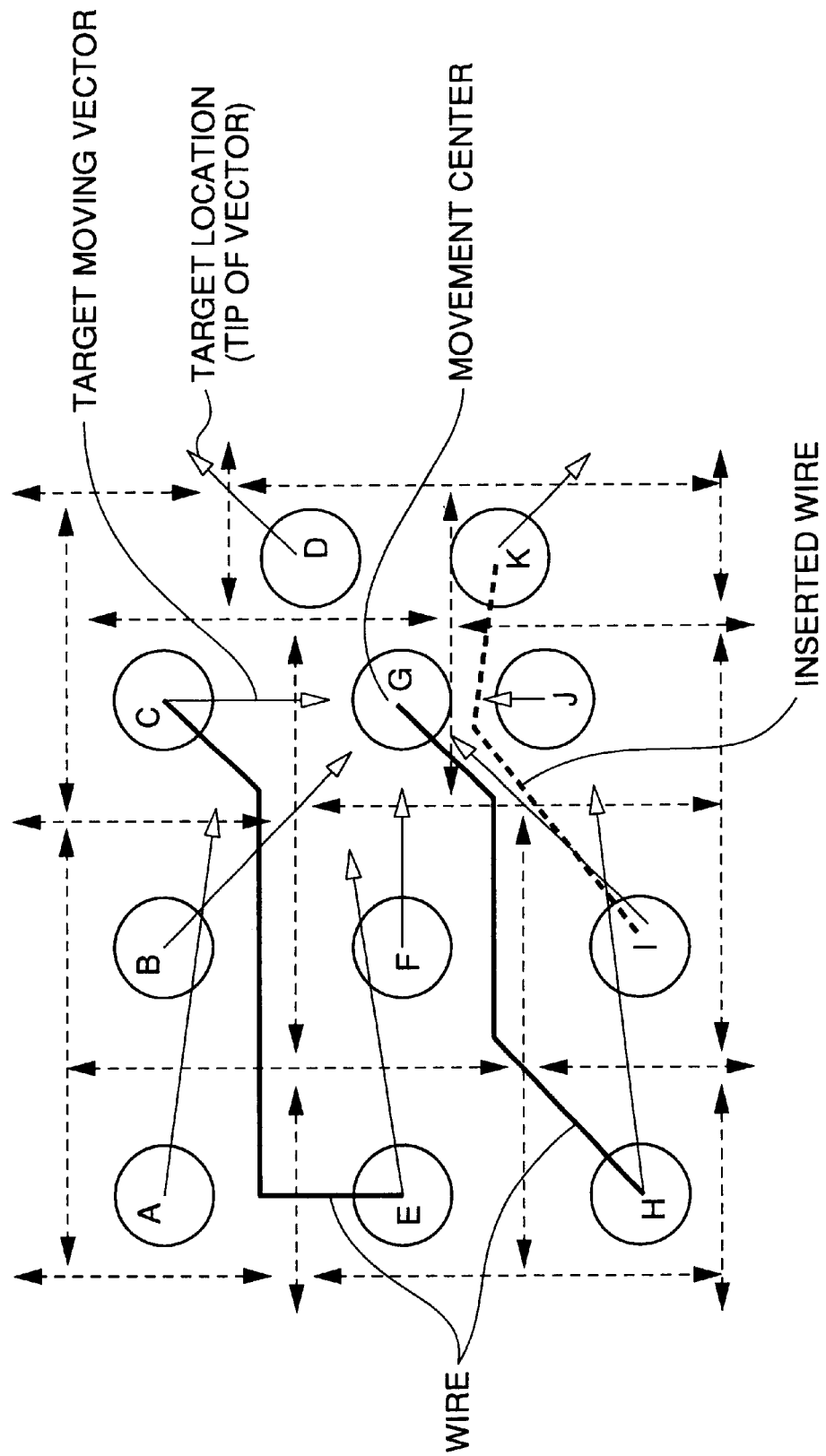
FIG. 44 is a view for use in describing an operation of a fourth example.
Figure 45:
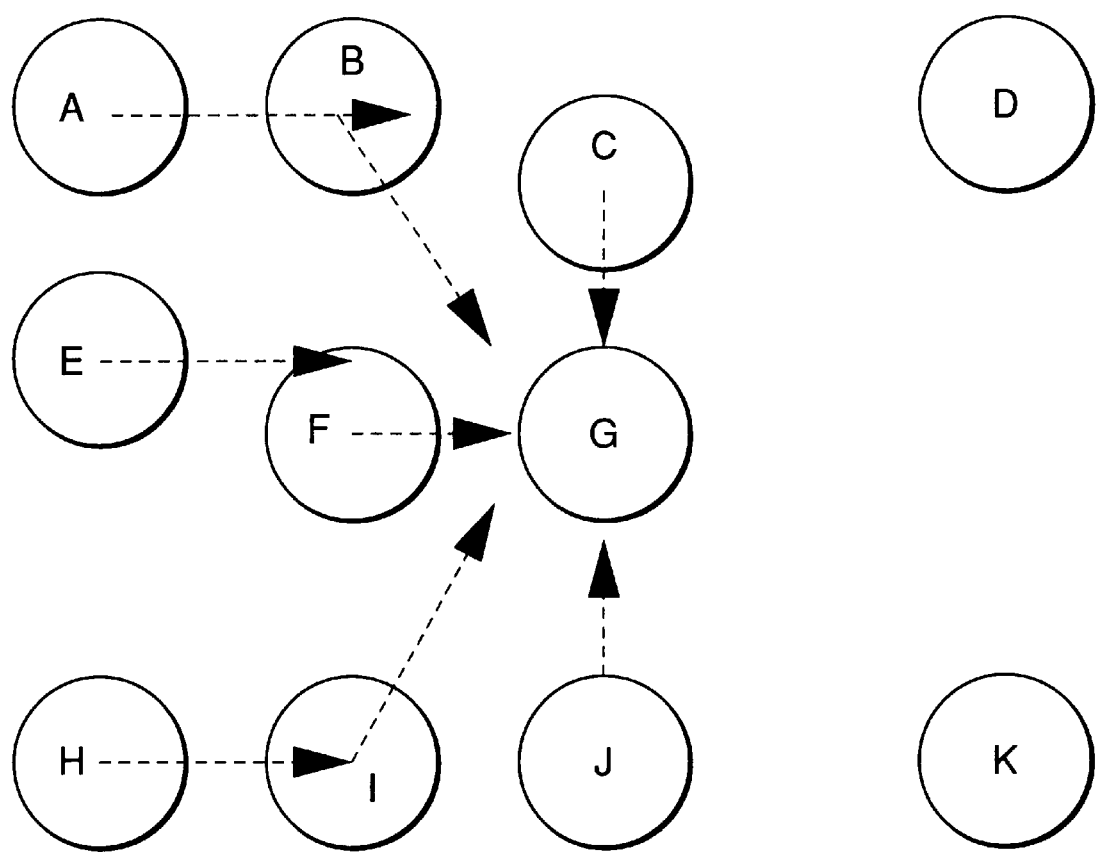
FIG. 45 is a view for use in describing another operation of the fourth example.
Figure 46:
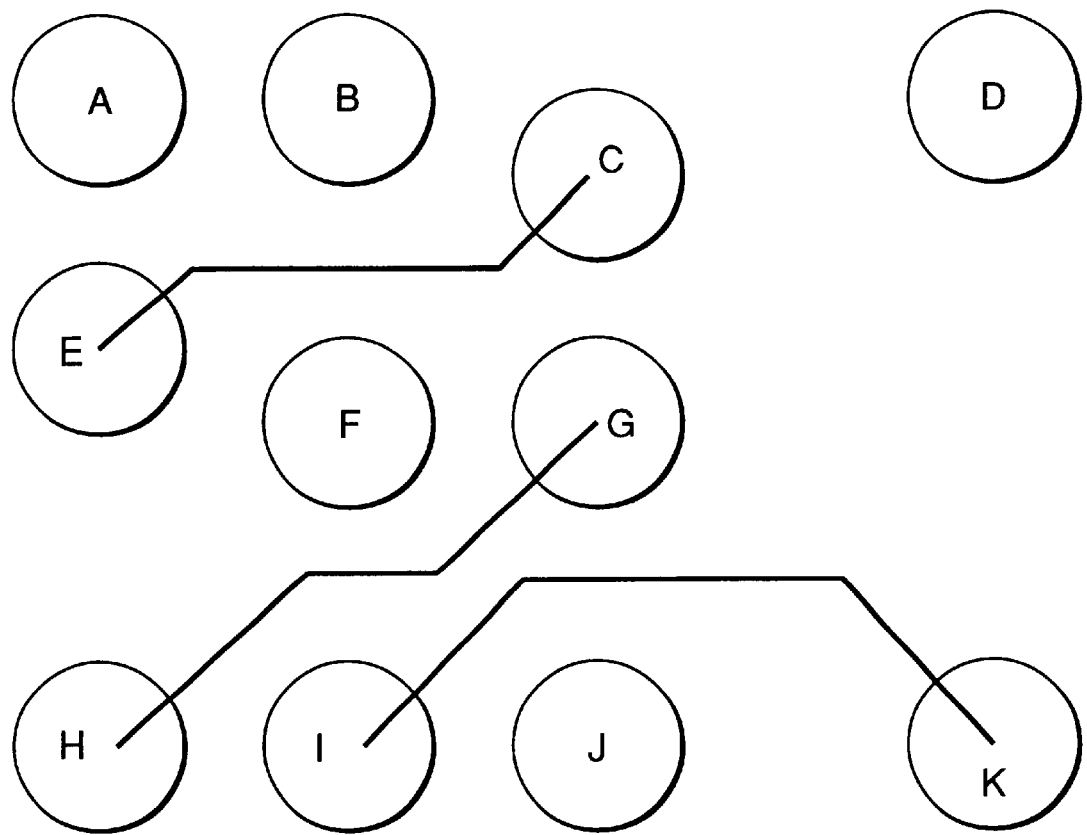
FIG. 46 is a view for use in describing another operation of the fourth example.

Now, description is made about the layout compaction apparatus according to a fourth example of the embodiment, with reference to FIGS. 44 through 46.

In the layout compaction apparatus, the input device is used to designate a target moving vector for each component. The target moving vector has a target direction and a target distance in the moving of each component, and the processor moves each component in accordance with the target moving vector. Herein, if the target moving vectors are all directed to one point, the circuit layout is converged, when compacted. If the target moving vectors are all radially extended from one point, the circuit layout is expanded.

The processor partitions the inputted circuit layout into a plurality of the sections, as shown in FIG. 44. And then, the constraint graph data and the constraint graph order data are produced, in the same manner of the first example.

The operator inputs the target moving vector with the input device, as shown in FIG. 44. The target moving vector has the location of the component as a starting point, and a target location as a terminated point. That is, the target location is a location of the tip of the moving vector. Furthermore, the operator inputs a point toward which the component will be moved toward, with the input device. Such point will be called a movement center. In FIG. 44, the movement center is designated to a location of the component G. The component located at the movement center is called to an immovable component. If no component is located at the movement center, the empty component is arranged on the movement center, and it will be called the immovable component. Each of the components is compacted in a direction designated by the corresponding target moving vector, as the followings.

The processor determines the Y-component constraint graphs of the immovable component and the respective components. Such Y-component constraint graph has, as a weight, a length in the Y-direction of the target moving vector. Similarly, the X-component constraint graphs are determined. With these component constraint graphs, the components are moved with the target moving vectors.

When the component constraint graphs are determined, the processor executes the processing of the steps S104 through S107, and thereby, defines other terminal constraint graphs, and then, determines other component constraint graphs. The processor may update other terminal constraint graphs and other component constraint graphs.

And then, the processor extracts the component joined with the already moved component by the component constraint graph. Herein, the immovable component and the edges of the substrate region are assumed to be the already moved components. The processor adds the moving distance of the already moved component in the compaction direction to the maximum movable range of the component constraint graph of the compaction direction. And then, the processor holds the added value as a movement restriction length into the memory. If the movement restriction length of the already moved component is memorized, the processor selects the movement restriction length less than others, and updates all the movement restriction lengths to be the selected length. Herein, the movement restriction length has a minus value, so that the component moved away from the tip of the compaction direction.

The processor solves the shortest path problem where the movement restriction lengths are given on the edges. And then, the processor moves the components under the solution of the problem. Such moved components are memorized as the already moved components.

For example, the processor extracts at first the movement restriction length of the component D in the X-direction, and moves the component D with the movement restriction length in the X-direction, in the circuit layout as shown in FIG. 44. And then, the processor extracts the movement restriction length of the component K, and moves the component K with the movement restriction length in the X-direction. And then, the processor extracts the movement restriction length of the component D in the Y-direction, and moves the component D with the movement restriction length in the Y-direction. And then, the processor extracts the movement restriction length of the component K in the Y-direction, and moves the component K with the movement restriction length in the Y-direction. And then, the processor moves the components E, H, A and J with the respective movement restriction lengths in the Y-direction, in this order. Furthermore, the processor moves the components F, C, B, I, B, I, E, A and H with the respective movement restriction lengths in the X-, Y-, Y-, Y-, X-, X-, X-, X-, and X-directions, in this order. Thus, the compacted layout is obtained, as shown in FIG. 45. At this point, an arrangement of the wires has not been determined yet.

The processor fixes the restricted region of wiring (namely, the wire limited location), for each wire, as the same way of the first example. After that, the processor executes the re-wiring of the wires under the restriction of the wire limited location, resulting in the layout with wires as shown in FIG. 46.

Now, explanation is made about the layout compaction apparatus according to a fifth example of the embodiment, with also reference to FIGS. 47 through 50.

In the layout compaction apparatus, the operator can designate the target substrate region, the moving of the component from its section to another section, by using the input device, and recognizes the state of the processing, by using the display.

It is noted here that the terminals belonging to one component are fixed relative to others of the one component. Therefore, one section accommodating one terminal is also fixed relative to other sections accommodating other terminals of the one component.

Taking this into consideration, when such component is moved, the terminals of the component are also moved with the relationship among such terminals be held, in this example. As the result, the relationship among the sections accommodating such terminals, is unchanged, after the component is moved. And then, the processor updates the respective terminal constraint graphs and the respective component constraint graphs, when such component is moved.

Now, detail explanation will be made about the fifth example.

The processor executes the step S100, and obtains the constraint graph data and the constraint graph order data. And then, the processor carries out the step S100, and obtains the terminal constraint graphs and the component constraint graphs.

Figure 47:
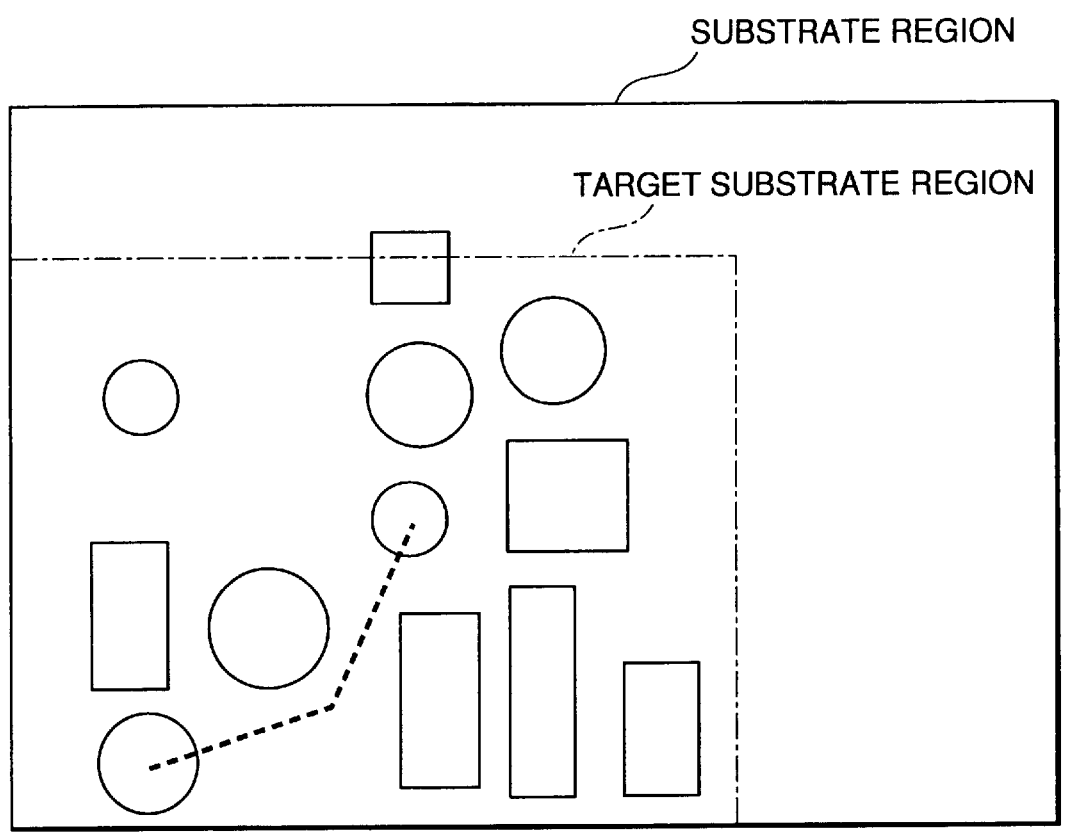
FIG. 47 is a view for use in describing an operation of a fifth example.

And then, the processor executes the steps S108 and S109 in the X-direction and also executes the steps S108 and S109, and thereby, obtains the compacted layout, as shown in FIG. 47.

When the operator designates the target substrate region, as shown in FIG. 47, the processor executes the steps S206 through S215, and judges whether the target substrate region accommodates the components of the chain of the component terminal constraint graphs or not. Herein, it is supposed that the target substrate region can not.

Furthermore, if a value is predetermined as a pre-obstacle margin that is positive, the processor detects whether the shortest path of the edges of the target substrate region is larger than the pre-obstacle margin or not. And, if the shortest path is not larger than the pre-obstacle margin, the processor recognizes that the compacted layout is barely accommodated within the target substrate region.

The above-mentioned judging, detecting and recognizing are executed for both of the X- and Y-directions.

And then, the processor extracts the terminal constraint graphs that cause the compacted circuit layout to be over the target substrate region. The processor controls the display to display, with special emphasis, the sections which accommodate the terminals at both ends of the extracted terminal constraint graphs, as shown in FIG. 48.

Figure 48:
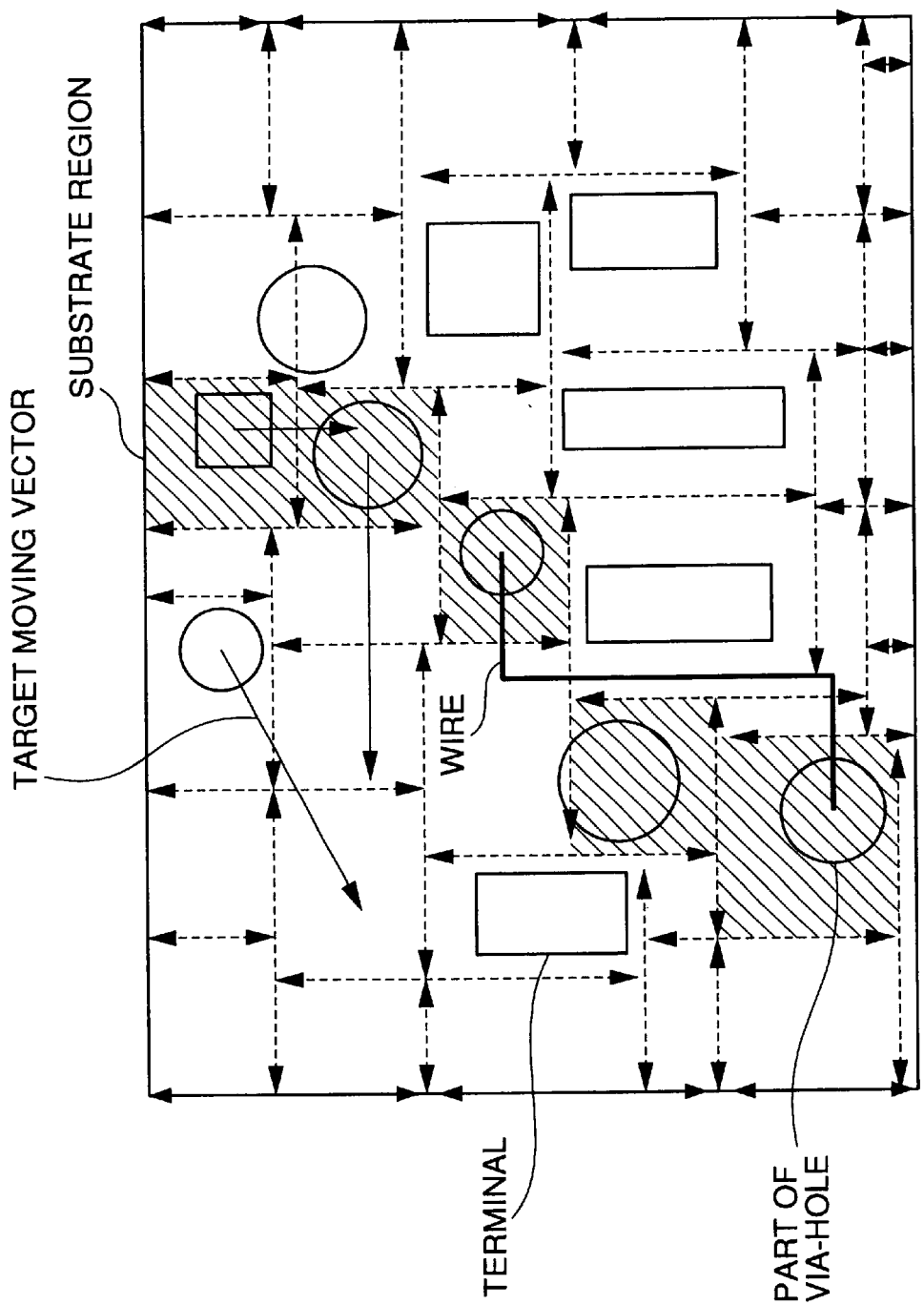
FIG. 48 is a view for use in describing another operation of the fifth example.
Figure 49:
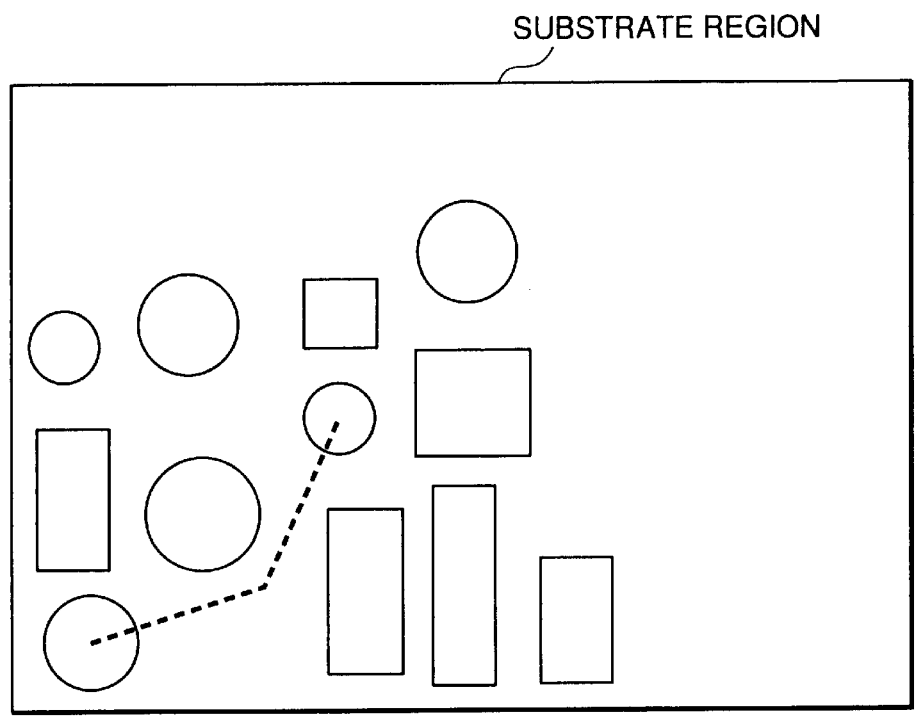
FIG. 49 is a view for use in describing another operation of the fifth example.

In this example, the operator also can designate the target moving vector for the component with the input device, as shown in FIG. 48. If the target moving vector is designated for the component, the processor executes the foregoing step S209. And thereby, the compacted layout is obtained, as shown in FIG. 49.

Figure 50:
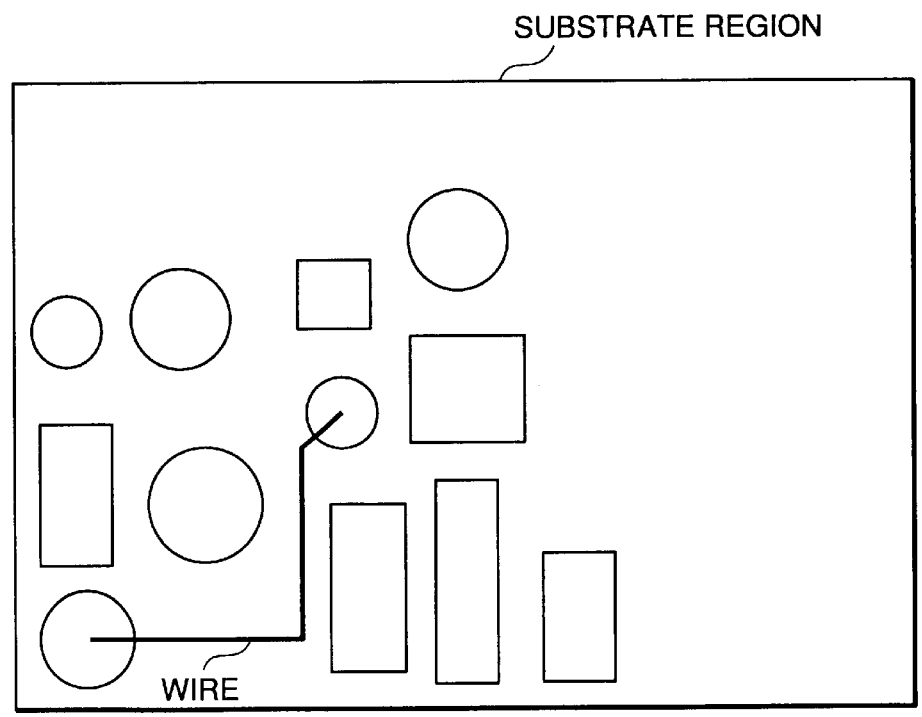
FIG. 50 is a view for use in describing another operation of the fifth example.

In this example, the operator also can request to execute the re-wiring. If the request is inputted, the processor executes the foregoing step S111. Otherwise, the processor executes the foregoing step S209, and updates the respective terminal constraint graph data. And then, the step S111 is executed. And thereby, the compacted layout with wires is obtained, as shown in FIG. 50.

Now, an explanation will be made about a layout compaction apparatus according to a sixth example of the embodiment.

In the layout compaction apparatus, the operator can designate a mutual replacement between the terminal and the wire, or between the wires with the input device. The processor replaces the terminal and the wire with each other, or replaces the wires with each other, according to the designation of the operator. Hereinafter, the former will be at first explained, and then, the latter will be explained.

Figure 51:
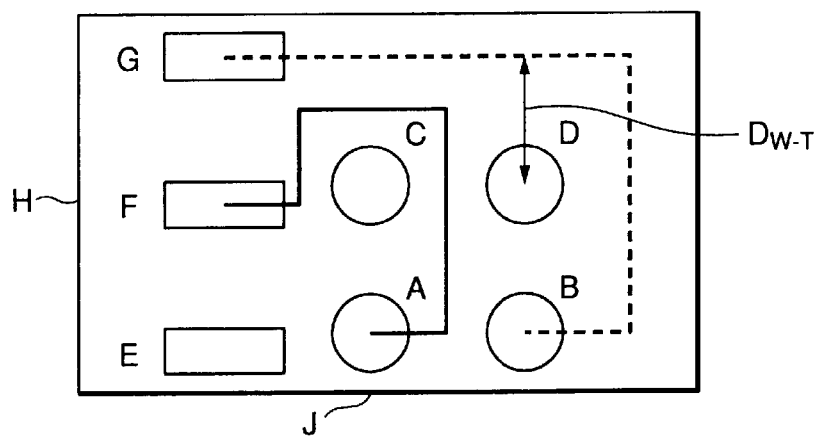
FIG. 51 is a view for use in describing another operation of the sixth example.

When the operator designates a mutual replacement between the terminal and the wire, the processor identifies a designated terminal and a designated wire. For example, the designated wire is the wire connected between the terminals G and B and the designated terminal is the terminal D, in FIG. 51. The designated terminal is not connected to the designated wire, with the distance $D_{W-T}$ left between.

Figure 52:
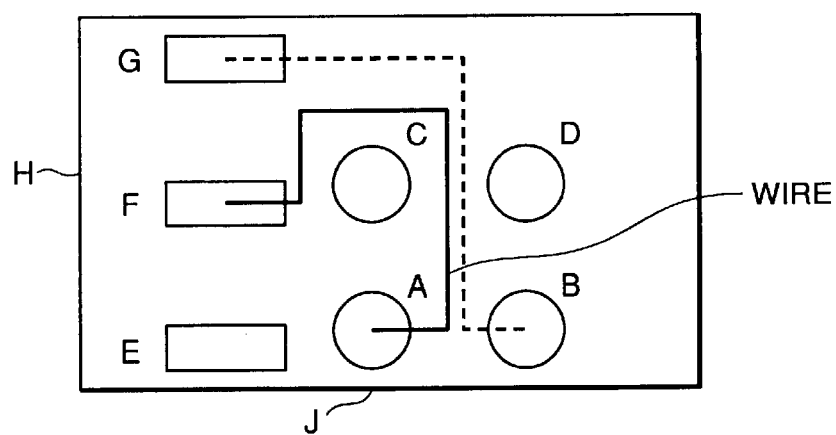
FIG. 52 is a view for use in describing another operation of the sixth example.

The processor forms a detoured wire, instead of the designated wire. The detoured wire detours around the designated terminal, as shown in FIG. 52. The processor updates the constraint graphs joining the pieces of the designated wire with the pieces close to the designated wire in the X- and the Y-directions.

Figure 53:
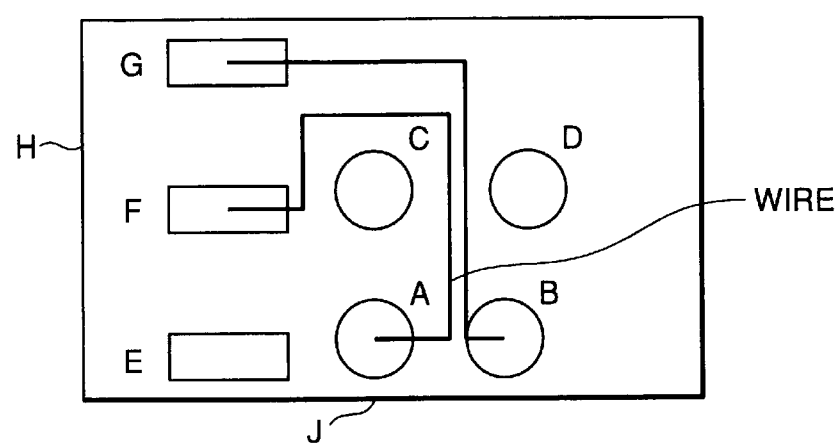
FIG. 53 is a view for use in describing another operation of the sixth example.

And then, the processor judges whether or not the detouring brings about a violation of the design rule. If the detouring bring about the violation, the processor causes the display to display, with special emphasis, the sections in accordance with the violation. Otherwise, the processor removes the designated wire, and then, executes the wiring of the detoured wire, as shown in FIG. 53.

On the other hand, when the operator designates a mutual replacement between the wires with the input device, the processor identifies designated wires as first and second wires. In the FIG. 54, terminal A is connected to the second wire and, on the other hand, is close to the first wire, that will be referred to as first terminal in this example. Similarly, the terminal B is connected to the first wire and, on the other hand, is close to the second wire, that will be referred to as second terminal in this example. In such case, the replacement between the wires is executed under the following first and second condition.

First condition: The first wire and the terminals arranged at both ends of the second wire or the end of the second wire are close to each other; and Second condition: Both of the first and second wire have no branch between first and second closest parts which are peripheral parts of the first and the second terminals A and B.

If the first and the second wire do not meet the above condition, the processor does not execute the designated replacement.

If the first and the second wire meet the above condition, the processor executes the designated replacement, as the following.

The processor extracts the data of the constraint graphs having the piece number of the first wire. And then, the processor lines up the constraint graph numbers of the constraint graphs in a row, and memorizes the row as a first wire row, wherein first constraint graph number is of the constraint graph having the terminal at a left end of the second wire (namely, the terminal A), and last constraint graph number is of the constraint graph having the terminal at a right end of the first wire (namely, the terminal B). The processor further memorizes the piece number of the terminal terminating the first wire (namely, the terminal B).

The processor extracts the data of the constraint graphs having the piece number of the second wire. And then, the processor lines up the constraint graph numbers of the constraint graphs in a row, and memorizes the row as a second wire row, wherein first constraint graph number is of the constraint graph having the terminal at a left end of the second wire (namely, the terminal A), and last constraint graph number is of the constraint graph having the terminal at a right end of the second wire (namely, the terminal C). The processor further memorizes the piece number of the terminal terminating the second wire (namely, the terminal C).

After that, the processor compares the first and the second wire rows, and judges whether or not the first wire row includes the first constraint graph number of the second wire row and the last constraint graph number of the second wire. And, the processor further judges whether or not the first wire row includes the first constraint graph number of the second wire row and the second wire row includes the last constraint graph number of the first wire. The latter judgement is repeatedly executed, instead of the first and second constraint graph to each other.

As the result of the judgement, if the first wire row includes those numbers, the first wire covers the beginning and the terminating ends of the second wire. In this case, the processor executes the followings to replace the first wire with the second wire.

The processor extracts a plurality of the piece data of the second wire and, among them, removes ones directly connected to the terminals at both ends of the second wire. The processor also removes data relating to the removed piece data, so that the shape of the wire is cut off from the terminals. The processor also cuts off the first wire from the terminals with the parts of the first wire extending from the terminals in the Y-direction being kept.

And then, the processor moves the removed part of the first wire and connects between the second terminals A and C. The processor moves the second wire and connects the second wire to the kept parts of the first wire. And then, the processor updates the constraint graphs having the pieces relating to the wire replacement, such as ones arranged at peripheral part of the wire.

Figure 54:
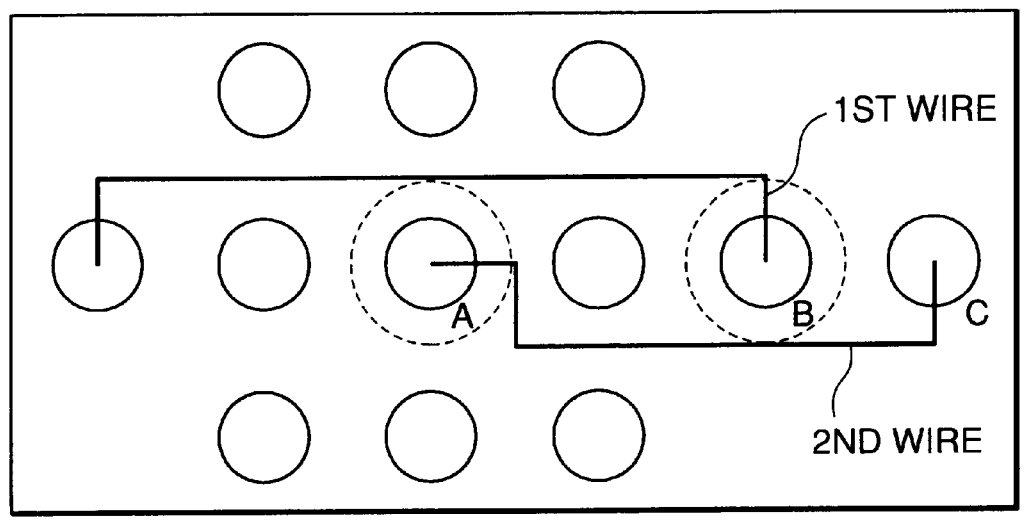
FIG. 54 is a view for use in describing another operation of the sixth example.
Figure 55:
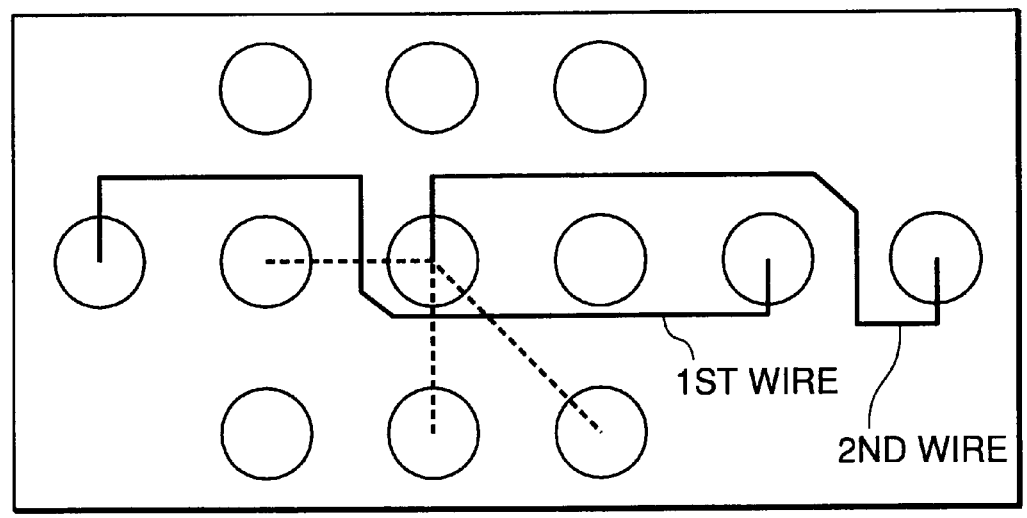
FIG. 55 is a view for use in describing another operation of the sixth example.

On the other hand, as the result of the above-mentioned judgement, if the first wire row includes the first constraint graph number of the second wire row and the second wire row includes the last constraint graph number of the first wire, and if the reverse stands up, the parts of the first and the second wires are parallel to each other. In this case, the processor executes the followings to replace the first wire with the second wire. The case is illustrated in FIG. 54, while the wiring after the replacement is illustrated in FIG. 55.

The processor removes the parts of the second wire connected to the designated terminals from the second wire, and thereby, cuts off the second wire. The processor removes the parts of the first wire connected to the terminal of the right side from the first wire, and thereby, cuts off the first wire. At this point, the second wire is connected to only terminal C, while the first wire is connected to only terminal arranged at left side.

Furthermore, the processor cuts off the first and the second wires from the terminals with the parts of the first and the second wires extending from the terminals in the Y-direction. After that, the processor connects the first and the second wires to the respective terminals, as illustrated in FIG. 55. Accordingly, the processor updates the constraint graphs having the pieces relating to the wire replacement, such as ones arranged at peripheral part of the wire.

Figure 56:
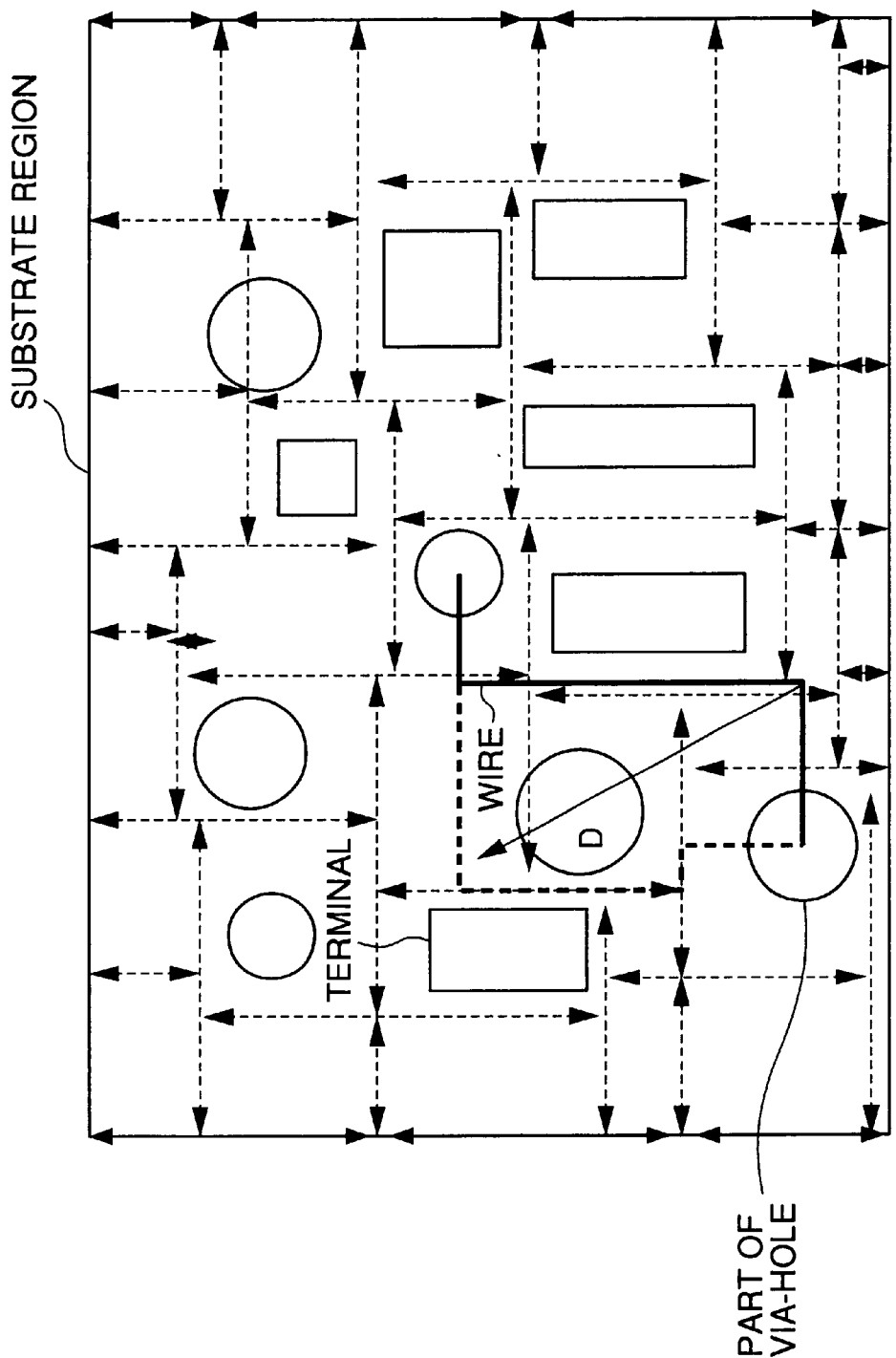
FIG. 56 is a view for use in describing another operation of the sixth example.
Figure 57:
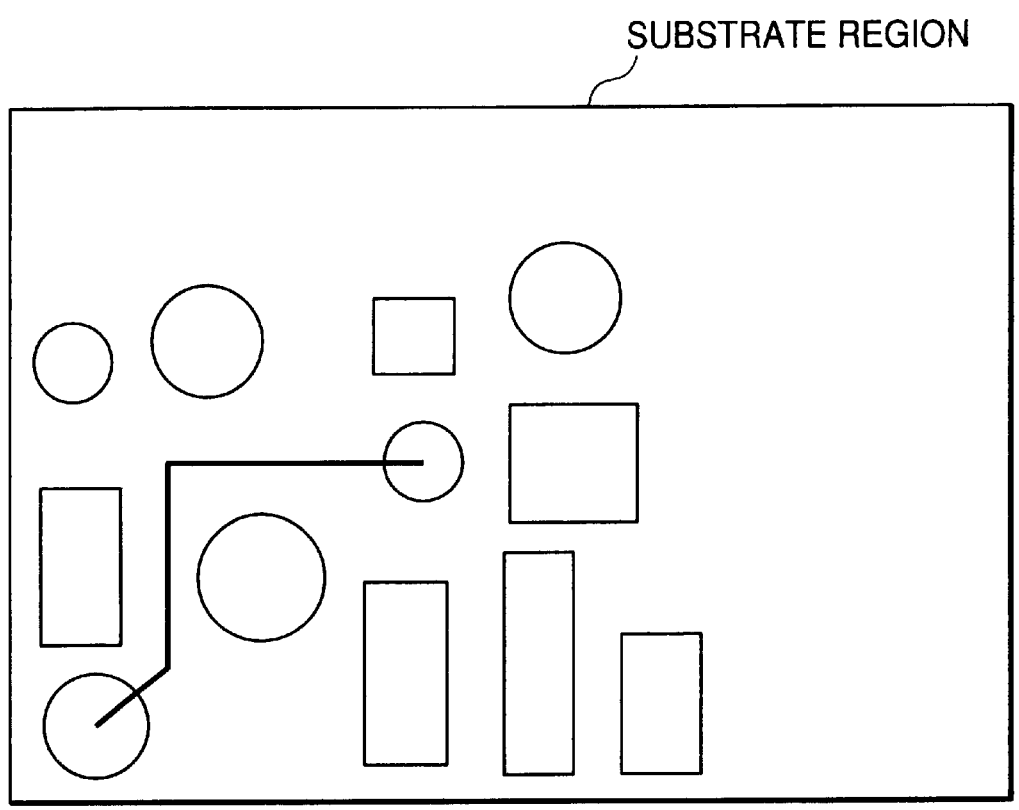
FIG. 57 is a view for use in describing another operation of the sixth example.

With the method of the replacing the wires, when the operator designates the wire (pointed by the allow) and the terminal D close to the wire, the processor executes re-wiring of newly wire (pointed by the bold line), as illustrated in FIG. 56. And thereby, the compacted layout shown in FIG. 57 is obtained.

Similarly to the memory of the layout compaction apparatus, the above-mentioned embodiment and modifications may be embodied also in a computer program product, as will now be explained.

On a practical level, the software that enables the computer system to perform the above-identified approach and operations of the invention, is supplied on any one of variety of media. Furthermore, the actual implementation of the approach and operations of the invention are actually statements written in a programming language. Such programming language statements, when executed by a processor of a computer, cause the processor to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, and any and all equivalents.

One of skill in the art will appreciate that "media", or "computer-readable media", as used here, may include not only the above-mentioned memory, such as an integrated circuit and a hard disk drive, but also a flexible disk, a tape, a compact disc, a magneto optical disc an integrated circuit, a cartridge, a remote transmission via a communications circuit, such as a LAN cable, or any other similar medium useable by computers. For example, to supply software for enabling a computer system to operate in accordance with the invention, the supplier might provide a diskette or might transmit the software in some form via the Internet.

Although the enabling software might be "written on" a diskette, "stored in" and integrated circuit, or "carried over" a communications circuit, it will be appreciated that, for the purpose of this application, the computer usable medium will be referred to as "bearing" the software. Thus, the term "bearing" is intended to encompass the above and all equivalent ways in which software is associated with a computer usable medium.

For the sake of simplicity, therefore, the term "program product" is thus used to refer to a computer useable medium, as defined above, which bears in any form of software to enable a computer system to operate in the layout compaction apparatus according to the above-identified invention.

Thus, the invention is also embodied in a program product bearing software which enables a computer to operate in the forgoing compacting method.

The entire disclosure of Japanese Patent Application No. Hei 11-25310 filed on Feb. 2, 1999 including specification, claims, drawings and summary are incorporated herein by reference in its entirety.

What is claimed is:

1. A method of compacting a circuit layout having a plurality of layers on which moving objects form layer patterns, the moving objects comprising components and wires, ones of the wires being laid on the respective layers in bundles to form wire bundles, each of the wires having a wire width and a pattern shape as a wire pattern shape, each of the wire bundles having a pattern shape as a bundle pattern shape and a bundle width defined by a total width of wires of each wire bundle, said method comprising, for each of the layer patterns on each of the layers:
  assuming a graph problem where a graph comprises nodes corresponding to the components and edges corresponding to moving vectors of the components under first through fourth condition;
    the first condition being that the wire widths of the wires are fixed at constant wire width values;
    the second condition being that belt widths of wire belts are fixed at constant belt width values, the wire belts defined by adding predetermined margins to both sides in a width direction of each of the wire bundles in compliance with a design rule, each of the belt widths being equal to a sum of each of the bundle widths and the predetermined margins;
    the third condition being that component-wire spaces are variable, each of the component-wire spaces being defined to be a distance from the component to edges in the width direction of the wire belts and/or the wires; and
    the fourth condition being that wire pattern shape and the bundle pattern shape are changeable for compacting;
  solving the graph problem to determine a moving order, a moving direction, and a moving distance of each component for moving the components to thereby perform the compacting the circuit layout; and
  moving each components according to the moving order, the moving direction and the moving distance.

2. A compacting method as claimed in claim 1, the components having terminals, wherein the assuming comprises, for each layer pattern:
  extracting the terminals from the components;
  defining a terminal constraint graph in relation to a pair of particular terminals selected among the terminals of all components, the particular terminals being close to each other in a predetermined direction and belonging to different components from one to another, the particular terminals being assigned to nodes at both ends of the terminal constraint graph, the terminal constraint graph having, as a weight, a maximum movable range of one of the particular terminals in a case where the one particular terminals is moved for the other particular terminal in the predetermined direction; and
  processing the terminal constraint graph with reference to the components having the terminals defined as the nodes for the terminal constraint graph to obtain the graph.

3. A compacting method as claimed in claim 2, wherein the maximum movable range has a minus value in a case where the wire and/or the wire belt are laid traversely to a virtual line connecting between the particular terminals and whether or not a length of the virtual line is shorter than another length required by the design rule in accordance with the wire width and/or the belt width, otherwise the maximum movable range has a plus value.

4. A compacting method as claimed in claim 3, wherein the processing comprises, after the defining is executed for all of the layer patterns, determining a component constraint graph on the basis of the terminal constraint graphs of all layer patterns, the component constraint graph having, as a weight, a minimum one among the weights of the terminal constraint graphs, the particular terminals being assigned to nodes at both ends of the components constraint graph, the graph comprising the component constraint graph.

5. A compacting method as claimed in claim 4, wherein:
  the defining is repeatedly executed for all pairs of the particular terminals each selected among the terminals of all components at every layer pattern, so as to obtain the terminal constraint graphs in relation to all pairs;
  the determining being repeatedly executed for all of the terminal constraint graphs; and
  the processing further comprising, for each layer pattern and after the determining being executed for all of the terminal constraint graphs, joining the component constraint graphs with reference to the nodes for the component constrain graphs to obtain the graph.

6. A compacting method as claimed in claim 5, wherein the graph problem is a shortest path problem, the graph having a particular nodes as a starting point.

7. A compacting method as claimed in claim 6, wherein the solving utilizes the Dijkstra method.

8. A compacting method as claimed in claim 6, wherein:
  the circuit layout is formed on a substrate region having a corner;
  the assuming further comprising, prior to the defining, picking up the corner to handle the corner as the terminal;
  the defining further defining, for each layer pattern, the terminal constraint graph in a chase where the corner and the terminal closest to the corner are handled as the pair of particular terminals, the closest terminal serving as the one particular terminal, while the corner serving as the other particular terminal, the node corresponding to the corner being the particular node in the graph.

9. A compacting method as claimed in claim 8, further comprising, after the moving: judging whether the wire and/or the wire belt are laid traversely to a virtual line connecting between the particular terminals; and rewiring the wire and/or the wire belt, in question, in consideration of an allowable form of the design rule.

10. A compacting method as claimed in claim 9, wherein the substrate region has a bottom line extending from the corner and the allowable form is a selected one of a vertical form, a horizontal form, and a diagonal form to the bottom line, and a combination thereof.

11. A compacting method as claimed in claim 6, wherein:
  the defining is further adapted to define additional terminal constraint graphs relating to the pairs of the particular terminals in the case of compacting in a perpendicular direction to the predetermined direction, according to the same way of defining the terminal constraint graphs;
  the determining being further adapted to determine additional component constraint graphs on the basis of the additional terminal constraint graphs of all layer patterns, according to the same way of determining the component constraint graphs;
  the joining being further adapted to join the additional component constraint graphs with reference to the nodes for the additional component constraint graphs to obtain an additional graph;
  the assuming being further adapted to assume an additional graph problem as an additional shortest path problem in consideration of the additional graph;
  the solving being further adapted to solve the additional graph problem to determine a moving order and a moving distance of each component in case of compacting in the perpendicular direction; and
  the moving being further adapted to move each of the components in the perpendicular direction, according to the moving order and the moving distance.

12. A compacting method as claimed in claim 11, wherein:
   the circuit layout is formed on a substrate region, a shape of the substrate region being a rectangular having vertical lines and horizontal lines in the predetermined and perpendicular directions, respectively;
   said comprising method further comprising, for each layer pattern and after the components being moved in both of the predetermined and the perpendicular directions, and thereby, the circuit layout being once compacted;
   deciding a target substrate region, a shape of the target substrate region being another rectangular having target vertical lines and target horizontal lines smaller than the vertical lines and horizontal lines in the predetermined and perpendicular directions, respectively;
   identifying an particular one of the pairs, the movement in the predetermined direction of the one particular terminal of the particular pair causing the once compacted circuit layout to be over the target substrate region in the perpendicular direction; and
   removing the terminal constraint graph of the particular pair;
   the assuming being further adapted to re-assume the graph problem as a re-assumed graph problem in consideration of the removing;
   the solving being further adapted to solve the re-assumed graph problem; and
   the moving being further adapted to move each component in the predetermined direction.

13. A compacting method as claimed in claim 5, wherein:
   the circuit layout is formed on a substrate region;
   the assuming further comprising: after the extracting and prior to the defining, partitioning the substrate region with a plurality of vertical partition lines and a plurality of horizontal partition lines, into a plurality of sections; and picking up the vertical and horizontal partition lines to handle the vertical and horizontal partition lines as the terminals.

14. A compacting method as claimed in claim 13, wherein the assuming further comprising, after the picking up and prior to the defining: detecting whether or not the terminals except for the vertical and horizontal partition lines belong to one of the sections; and supposing an empty terminal to be placed as the terminal at a center of the one section, in a case where no terminals except for the vertical and horizontal partition lines belong to the one sections; the defining being repeatedly executed, in the one section, for all of pairs of particular terminals selected among the vertical and horizontal partition lines and the empty terminal.

15. A compacting method as claimed in claim 14, wherein, in a case where a plurality of the terminals except for the vertical and horizontal partition lines belong to the one section, the defining is repeatedly executed, in the one section, for all of the pairs of particular terminals selected among the terminals including the vertical and horizontal partition lines.

16. A compacting method as claimed in claim 15, wherein, in a case where only one terminal except for the vertical and horizontal partition lines belongs to the one section, the defining is repeatedly executed, in the one section, for all of the pairs of particular terminals selected among the vertical and horizontal partition lines and the only one terminal.

17. A compacting method as claimed in claim 13, wherein the moving is further adapted to move the vertical and horizontal partition lines, with the movements of the components which have the particular terminals except for the vertical and horizontal partition lines.

18. A compacting method as claimed in claim 2, wherein the assuming further comprises, after the defining and prior to the processing: detecting whether or not the pair of particular terminals are given the same signal; and removing the terminal constraint graph relating to the pair of particular terminal given the same signal.

19. A compacting method as claimed in claim 2, wherein the assuming further comprises, prior to the defining, fixing an octagonal restricted region adapted to forbid a center of the one particular terminals to enter inside of the octagonal restriction region, and thereby, to restrict the movement of the one particular terminal, the octagonal restricted region and the other particular terminal having a common center, the defining being carried out under the restriction of the octagonal restricted region.

20. A compacting method as claimed in claim 19, wherein the fixing comprises:
   approximating the other particular terminals to obtain a first octagon having a first distance from a center to an edge of the first octagon;
   adding the belt width to each of edges of the first octagon to obtain a second octagon having a second distance from a center to an edge of the section octagon, the second distance being equal to a sum of the belt width and the first distance;
   approximating the one particular terminal to obtain a third octagon having a third distance from a center to an edge of the third octagon; and
   adding the third distance to each of edges of the second octagon to determine a shape and a size of the octagonal restricted region, the shape having a fourth distance from a center to an edge of the shape, in question, the fourth distance being equal to a sum of the second distance and the third distance.

21. A compacting method as claimed in claim 2, further comprising, prior to the assuming, designating a target moving vector having a target direction and a target distance in the moving of each component, the defining being executed in accordance with the target moving vector.

22. A compacting method as claimed in claim 1, wherein:
   the moving objects further comprise via-holes and semiconductor cells;
   parts of the via-hole at every layer, the semiconductor cells, profiles of the components being handled as the terminals;
   a combination unit of the component and the via-hole being, as a whole, handled as single component; and
   the via-hole connected to only wire being handled as one of the components.

23. A compacting method as claimed in claim 1, wherein:
   the moving objects further comprise polygons obtained by approximating conductors;
   each of the polygons being handled as the component while edges of the edge polygon being handled as the terminals.

24. A layout compaction apparatus adapted, responsive to original layout data of a circuit layout, to virtually compact the circuit layout, and thereby, to produce compacted layout data of a compacted circuit layout, the circuit layout having a plurality of layers on which moving objects form layer patterns, the moving objects comprising components and wires, ones of the wires being laid on the respective layers in bundles to form wire bundles, each of the wires having a wire width and a pattern shape as a wire pattern shape, each of the wire bundles having a pattern shape as a bundle pattern shape and a bundle width defined by a total width of wires of each wire bundle, said layout compaction apparatus comprising:

a processor; and a memory including software instructions adapted to enable said processor to cause the layout compaction apparatus to perform, for each of the layer patterns on each of the layers;

assuming a graph problem where a graph comprises nodes corresponding to the components and edges corresponding to moving vectors of the components under first through fourth condition;

the first condition being that the wire widths of the wires are fixed at constant wire width values;

the second condition being that belt widths of wire belts are fixed at constant belt width values, the wire belts defined by adding predetermined margins to both sides in a width direction of each of the wire bundles in compliance with a design rule, each of the belt widths being equal to a sum of each of the bundle widths and the predetermined margins;

the third condition being that component-wire spaces are variable, each of the component-wire spaces being defined to be a distance from the component to edges in the width direction of the wire belts and/or the wires; and the fourth condition being that wire pattern shape and the bundle pattern shape are changeable for compacting;

solving the graph problem to determine a moving order, a moving direction, and a moving distance of each component; and virtually moving each component according to the moving order, the moving direction and the moving distance, to obtain the compacted layout data of the compacted circuit layout.

25. A layout compaction apparatus as claimed in claim 24, the components having terminals, wherein the memory further includes software instructions adapted to enable the layout compaction apparatus further to perform the assuming so as to include, for each layer pattern:

extracting the terminals from the components;

defining a terminal constraint graph in relation to a pair of particular terminals selected among the terminals of all components, the particular terminals being close to each other in a predetermined direction and belonging to different components from one to another, the particular terminals being assigned to nodes at both ends of the terminal constraint graph, the terminal constraint graph having, as a weight, a maximum movable range of one of the particular terminals in a case where the one particular terminals is moved for the other particular terminal in the predetermined direction; and processing the terminal constraint graph with reference to the components having the terminals defined as the nodes for the terminal constraint graph to obtain the graph bringing out the compacted layout data of the circuit layout compacted in the predetermined direction.

26. A layout compaction apparatus as claimed in claim 25, wherein the memory further includes software instructions adapted to enable the layout compaction apparatus further to perform the defining so as to include assigning a minus value to the weight of the terminal constraint graph in a case where the wire and/or the wire belt are laid traversely to a virtual line connecting between the particular terminals and whether or not a length of the virtual line is shorter than another length required by the design rule in accordance with the wire width and/or the belt within, otherwise assigning a plus value to the weight.

27. A layout compaction apparatus as claimed in claim 26, wherein the memory further includes software instructions adapted to enable the layout compaction apparatus further to perform the processing so as to include, after the defining being executed for all of the layer patterns, determining a component constraint graph on the basis of the terminal constraint graphs of all layer patterns, the component constraint graph having, as a weight, a minimum one among the weights of the terminal constrain graphs, the particular terminals being assigned to nodes at both ends of the component constraint graph, the graph comprising the component constraint graph.

28. A layout compaction apparatus as claimed in claim 27, wherein the memory further includes software instructions adapted to enable the layout compaction apparatus further to perform the assuming so that:

the defining is repeatedly executed for all pairs of the particular terminals each selected among the terminals of all components at every layer pattern, to obtain the terminal constraint graphs in relation to all pairs;

the determining is repeatedly executed for all of the terminal constraint graphs; and the processing is further performed, for each layer pattern and after the determining being executed for all of the terminal constraint graphs, by joining the component constraint graphs with reference to the nodes for the component constraint graphs to obtain the graph.

29. A layout compaction apparatus as claimed in claim 28, wherein the memory further includes software instructions adapted to enable the layout compaction apparatus further to perform the assuming so as to assume a shortest path problem as the graph problem, the graph having a particular nodes as a starting point.

30. A layout compaction apparatus as claimed in claim 29, wherein the memory further includes software instructions adapted to enable the layout compaction apparatus further to perform the solving so as to include utilizing the Dijkstra method.

31. A layout compaction apparatus as claimed in claim 29, the circuit layout being formed on a substrate region having a corner, wherein the memory further includes software instructions adapted to enable the layout compaction apparatus further to perform the assuming so as to include:

prior to the defining, picking up the corner to handle the corner as the terminal; and further defining, for each layer pattern, the terminal constraint graph in a chase where the corner and the terminal closed to the corner are handled as the pair of particular terminals, the closest terminal serving as the one particular terminal, while the corner serving as the other particular terminal, the node corresponding to the corner being the particular node in the graph.

32. A layout compaction apparatus as claimed in claim 31, wherein the memory further includes software instructions adapted to enable the layout compaction apparatus further to perform, after the virtually moving judging whether the wire and/or the wire belt are laid traversely to a virtual line connecting between the particular terminals; and re-wiring the wire and/or the wire belt, in question, in consideration of an allowable form of the design rule.

33. A layout compaction apparatus as claimed in claim 32, the substrate region having a bottom line extending from the corner, wherein the memory further includes software instructions adapted to enable the layout compaction apparatus further to perform the re-wiring so as to include selecting, as the allowable form, one of a vertical form, a horizontal form, and a diagonal form to the bottom line, and a combination thereof.

34. A layout compaction apparatus as claimed in claim 28, wherein the memory further includes software instructions adapted to enable the layout compaction apparatus further to perform:
   defining additional terminal constraint graphs relating to the pairs of the particular terminals in the case of compacting in a perpendicular direction to the predetermined direction, according to the same way of defining the terminal constraint graphs;
   determining additional component constraint graphs on the basis of the additional terminal constraint graphs of all layer patterns, according to the same way of determining the component constraint graphs;
   joining additional component constraint graphs with reference to the nodes for the additional component constraint graphs to obtain an additional graph;
   assuming an additional graph problem as an additional shortest path problem in consideration of the additional graph;
   solving the additional graph problem to determine a moving order and a moving distance of each component in case of compacting in the perpendicular direction; and
   virtually moving each components in the perpendicular direction, according to the moving order and the moving distance, to obtain the compacted layout data of the circuit layout compacted in the perpendicular direction.

35. A layout compaction apparatus as claimed in claim 34, the circuit layout being formed on a substrate region, a shape of the substrate region being a rectangular having vertical lines and horizontal lines in the predetermined and perpendicular directions, respectively, the layout compaction apparatus further comprising an input device adapted to designate a target substrate region, a shape of the target substrate region being another rectangular having target vertical lines and target horizontal lines smaller than the vertical lines and horizontal lines in the predetermined and perpendicular directions, respectively, wherein:
   the memory further includes software instructions adapted to enable the layout compaction apparatus further to perform, for each layer pattern and after the components being virtually moved in both the predetermined and the perpendicular directions, and thereby, the circuit layout being once compacted:
     identifying an paticular one of the pairs, the movement in the predetermined direction of the one particular terminal of the particular pair causing the once compacted circuit layout to be over the target substrate region in the perpendicular direction; and
     removing the terminal constraint graph of the particular pair;
     re-assuming the graph problem as a re-assumed graph problem in consideration of the removing;
     solving the re-assumed graph problem; and
     virtually moving each component in the predetermined direction.

36. A layout compaction apparatus as claimed in claim 28, the circuit layout being formed on a substrate region, wherein the memory further includes software instructions adapted to enable the layout compaction apparatus further to perform the assuming so as to include, after the extracting and prior to the defining: partitioning the substrate region with a plurality of vertical partition lines and a plurality of horizontal partition lines, into a plurality of sections; and picking up the vertical and horizontal partition lines to handle the vertical and horizontal partition lines as the terminals.

37. A layout compaction apparatus as claimed in claim 36, wherein the memory further includes software instructions adapted to enable the layout compaction apparatus further to perform the assuming so as to include, after the picking up end prior to the defining:
   detecting whether or not the terminals except for the vertical and horizontal partition lines belong to one of the sections; and
   supposing an empty terminal to be placed as the terminal at a center of the one section, in a case where no terminals except for the vertical and horizontal partition lines belong to the one sections.

38. A layout compaction apparatus as claimed in claim 37, wherein the memory further includes software instructions adapted to enable the layout compaction apparatus further to perform the defining so as to, in the case where no terminals except for the vertical and horizontal partition lines belong to the one sections, be repeatedly executed for all of pairs of particular terminals selected among the vertical and horizontal partition lines and the empty terminal in the one section.

39. A layout compaction apparatus as claimed in claim 38, wherein the memory further includes software instructions adapted to enable the layout compaction apparatus further to perform the defining so as to, in a case where a plurality of the terminals except for the vertical and horizontal partition lines belong to the one section, be repeatedly executed for all of the pairs of particular terminals selected among the all terminals which belong to the one section and include the vertical and horizontal partition lines for the one section.

40. A layout compaction apparatus as claimed in claim 39, wherein the memory further includes software instructions adapted to enable the layout compaction apparatus further to perform the defining so as to, in a case where only one terminal except for the vertical and horizontal partition lines belongs to the one section, be repeatedly executed for all of the pairs of particular terminals selected among the vertical and horizontal partition lines and the only one terminal in the one section.

41. A layout compaction apparatus as claimed in claim 39, wherein the memory further includes software instructions adapted to enable the layout compaction apparatus further to perform the virtually moving so as to include virtually moving the vertical and horizontal partition lines, with the movements of the components which have the particular terminals except for the vertical and horizontal partition lines.

42. A layout compaction apparatus as claimed in claim 36, further comprising a display, wherein the memory further includes software instructions adapted to enable the layout compaction apparatus further to perform:
   judging whether or not the component of the compacted circuit layout belongs to a predetermined area for the component to be arranged thereon; and
   displaying with special emphasis, in the display, an area enclosed with the vertical and the horizontal partition lines, as regard the predetermined area, when the component does not arranged on the predetermined area.

43. A layout compaction apparatus as claimed in claim 25, wherein the memory further includes software instructions adapted to enable the layout compaction apparatus further to perform the assuming so as to include, after the defining and prior to the processing: detecting whether or not the pair of particular terminals are given the same signal; and removing the terminal constraint graph relating to the pair of particular terminals given the same signal.

44. A layout compaction apparatus as claimed in claim 25, wherein the memory further includes software instructions adapted to enable the layout compaction apparatus further to perform the assuming so as to include, prior to the defining, fixing an octagonal restricted region adapted to forbid a center of the one particular terminal to enter inside of the octagonal restriction region, and thereby, to restrict the movement of the one particular terminal, the octagonal restricted region and the other particular terminal having a common center, the defining being carried out under the restriction of the octagonal restricted region.

45. A layout compaction apparatus as claimed in claim 44, wherein the memory further includes software instructions adapted to enable the layout compaction apparatus further to perform the fixing so as to include:
- approximating the other particular terminal to obtain a first octagon having a first distance from a center to an edge of the first octagon;
- adding the belt width to each of edges of the first octagon to obtain a second octagon having a second distance from a center to an edge of the second octagon, the second distance being equal to a sum of the belt with and the first distance;
- approximating the one particular terminal to obtain a third octagon having a third distance from a center to an edge of the third octagon; and
- adding the third distance to each of edges of the second octagon to determine a shape and a size of the octagonal restricted region, the shape having a fourth distance from a center to an edge of the shape, in question, the fourth distance being equal to a sum of the second distance and the third distance.

46. A layout compaction apparatus as claimed in claim 25, further comprising an input device adapted to designable a target moving vector having a target direction and a target distance in the virtually moving of each component, wherein the memory further includes software instructions adapted to enable the layout compaction apparatus further to perform the defining so as to be executed in accordance with the target moving vector.

47. A layout compaction apparatus as claimed in claim 24, the moving objects further comprising via-holes and semiconductor cells, wherein the memory further includes software instructions adapted to enable the layout compaction apparatus further to perform the assuming so as to include:
- handling parts of the via-hole at every layer, the semiconductor cells, profiles of the components as the terminals;
- handling a combination unit of the component and the via-hole being, as a whole, as single component; and
- handling the via-hole connected to only wire as one of the components.

48. A layout compaction apparatus as claimed in claim 24, the moving objects further comprising polygons obtained by approximating conductors, wherein the memory further includes software instructions adapted to enable the layout compaction apparatus further to perform the assuming so as to include:
- handling each of the polygons as the component; and
- handling edges of the each polygon as the terminals.

49. A layout compaction apparatus as claimed in claim 24, further comprising an input device adapted to designate a change of an arrangement of the component and the wire in the original layout data, wherein the memory further includes software instructions adapted to enable the layout compaction apparatus further to perform:
- changing the arrangement of the component and the wire in the original layout data, according to the designation with the input device, to produce a newly layout data; and
- inputting the newly layout data into the assuming.

50. A layout compaction apparatus as claimed in claim 49, further comprising a display, wherein the memory further includes software instructions adapted to enable the layout compaction apparatus further to perform:
- judging whether or not the changing brings about a violation of the design rule; and
- displaying with special emphasis, in the display, an area on the circuit layout in accordance with the violation.

51. A layout compaction apparatus as claimed in claim 24, further comprising an input device adapted to designate a mutual replacement between one of the components and one of the wires, or between ones of the wires, wherein the memory further includes software instructions adapted to enable the layout compaction apparatus further to perform executing the mutual replacement for layout data.

52. A computer program product for enabling a processor to work as a layout compaction apparatus adapted, responsive to original layout data of a circuit layout, to virtually compacted the circuit layout, and thereby, to produce compacted layout data of a compacted circuit layout, the circuit layout having a plurality of layers on which moving objects form layer patterns, the moving objects comprising components and wires, ones of the wires being laid on the respective layers in bundles to form wire bundles, each of the wires having a wire width and a pattern shape as a wire pattern shape, each of the wire bundles having a pattern shape as a bundle pattern shape and a bundle width defined by a total width of wires of each wire bundle, said computer program, product comprising:
- software instructions for enabling the processor to perform predetermined operations; and
- a computer readable medium bearing the software instructions;
- the predetermined operations including, for each of the layer patterns on each of the layers;
- assuming a graph problem where a graph comprises nodes corresponding to the components and edges corresponding to moving vectors of the components under first through fourth condition;
  - the first condition being the wire widths of the wires are fixed at constant wire width values;
  - the second condition being that bell widths of wire belts are fixed at constant belt width values, the wire bells defined by adding predetermined margins to both sides in a width direction of each of the wire bundles in compliance with a design rule, each of the belt widths being equal to a sum of each of the bundle widths and the predetermined margins;
  - the third condition being that component-wire spaces are variable, each of the component-wire spaces being defined to be a distance from the component to edges in the width direction of the wire belts and/or the wires; and the fourth condition being that wire pattern shape and the bundle pattern shape are changeable for compacting;

solving the graph problem to determine a moving order, a moving direction, and a moving distance of each component; and virtually moving each component according to the moving order, the moving direction and the moving distance, to obtain the compacted layout data of the compacted circuit layout.

53. A computer program product as claimed in claim 52, the components having terminals, wherein the assuming is performed so as to include, for each layer pattern:

extracting the terminals from the components;

defining a terminal constraint graph in relation to a pair of particular terminals selected among the terminals of all components, the particular terminals being close to each other in a predetermined direction and belonging to different components from one to another, the particular terminals being assigned to nodes at both ends of the terminal constraint graph, the terminal constraint graph having, as a weight, a maximum movable range of one of the particular terminals in a case where the one particular terminals is moved for the other particular terminal in the predetermined direction; and processing the terminal constraint graph with reference to the components having the terminals defined as the nodes for the terminal constraint graph to obtain the graph bringing out the compacted layout data of the circuit layout compacted in the predetermined direction.

54. A computer program product as claimed in claim 53, wherein the defining is performed so as to include assigning a minus value to the weight of the terminal constraint graph in a case where the wire and/or the wire belt are laid traversely to a virtual line connecting between the particular terminals and whether or not a length of the virtual line is shorter than another length required by the design rule in accordance with the wire width and/or the belt width, otherwise assigning a pus value to the weight.

55. A computer program product as claimed in claim 54, wherein the processing is performed so as to include, after the defining being executed for all of the layer patterns, determining a component constraint graph on the basis of the terminal constraint graphs of all layer patterns, the component constraint graph having, as a weight, a minimum one among the weights of the terminal constraint graphs, the particular terminals being assigned to nodes at both ends of the component constraint graph, the graph comprising the component constraint graph.

56. A computer program product as claimed in claim 55, wherein the assuming is performed so that:

the defining is repeatedly executed for all pairs of the particular terminals each selected among the terminals of all components at every layer pattern, to obtain the terminal constraint graphs in relation to all pairs;

the determining is repeatedly executed for all the terminal constraint graphs; and the processing is further performed, for each layer pattern and after the determining being executed for all of the terminal constraint graphs, by joining the component constraint graphs with reference to the nodes for the component constraint graphs to obtain the graph.

57. A computer program product as claimed in claim 56, wherein the assuming is performed so as to assume a shortest path problem as the graph problem, the graph having a particular nodes as a starting point.

58. A computer program product as claimed in claim 57, wherein the solving is performed so as to include utilizing the Dijkstra method.

59. A computer program product as claimed in claim 57, the circuit layout being formed on a substrate region having a corner, wherein the assuming is performed so as to include:

prior to the defining, picking up the corner to handle the corner as the terminal; and defining, for each layer pattern, the terminal constraint graph in a case where the corner and the terminal closest to the corner are handled as the pair of particular terminals, the closest terminal serving as the one particular terminal, while the corner serving as the other particular terminal, the mode corresponding to the corner being the particular node in the graph.

60. A computer program product as claimed in claim 59, wherein the predetermined operations including, after the virtually moving: judging whether the wire and/or the wire belt are laid traversely to a virtual line connecting between the particular terminal; and re-wiring the wire and/or the wire belt, in question, in consideration of an allowable form of the design rule.

61. A computer program product as claimed in claim 60, the substrate region having a bottom line extending from the corner, wherein the re-wiring is performed so as to include selecting, as the allowable form, one of a vertical form, a horizontal form, and a diagonal form to the bottom line, and a combination thereof.

62. A computer program product as claimed in claim 57, wherein the predetermined operations further includes:

defining additional terminal constraint graphs relating to the pairs of the particular terminals in the case of compacting in a perpendicular direction to the predetermined direction, according to the same way of defining the terminal constraint graphs;

determining additional component constraint graphs on the basis of the additional terminal constraint graphs of all layer patterns, according to the same way of determining the component constraint graphs;

joining additional component constraint graphs with reference to the nodes for the additional component constraint graphs to obtain an additional graph;

assuming an additional graph problem as an additional shortest path problem in consideration of the additional graph;

solving the additional graph problem to determine a moving order and a moving distance of each component in case of compacting in the perpendicular direction; and virtually moving each components in the perpendicular direction, according to the moving order and the moving distance, to obtain the compacted layout data of the circuit layout compacted in the perpendicular direction.

63. A computer program product as claimed in claim 62, the circuit layout being formed on a substrate region, a shape of the substrate region being a rectangular having vertical lines and horizontal lines in the predetermined and perpendicular directions, respectively, the computer program further for enabling the processor to execute a processing in accordance with requests inputted through an input device, the input device adapted to designate a target substrate region, a shape of the target substrate region being another rectangular having target vertical lines and target horizontal lines smaller than the vertical lines and horizontal lines in the predetermined and perpendicular directions, respectively, wherein:

the predetermined operations further include, for each layer pattern and after the components being virtually moved in both of the predetermined and the perpendicular directions, and thereby, the circuit layout being once compacted:

identifying an particular one of the pairs, the movement in the predetermined direction of the one particular terminal of the particular pair causing the once compacted circuit layout to be over the target substrate region in the perpendicular direction; and removing the terminal constraint graph of the particular pair;

re-assuming the graph problem as a re-assumed graph problem in consideration of the removing.

solving the re-assumed graph problem; and virtually moving each component in the predetermined direction.

64. A computer program product as claimed in claim 56, the circuit layout being formed on a substrate region, wherein the assuming is performed so as to include, after the extracting and prior in the defining partitioning the substrate region with a plurality of vertical partition lines and a plurality of horizontal partition lines, into a plurality of sections; and picking up the vertical and horizontal partition lines to handle the vertical and horizontal partition lines as the terminals.

65. A computer program product as claimed in claim 64, wherein the assuming is performed so as to include, after the picking up and prior to the defining:

detecting whether or not the terminals except for the vertical and horizontal partition lines belong to one of the sections; and supposing an empty terminal to be placed as the terminal at a center of the one section, in a case where no terminals except for the vertical and horizontal partition lines belong to the one sections.

66. A computer program product as claimed in claim 65, wherein the defining is performed so as to, in the case where no terminals except for the vertical and horizontal partition lines belong to the one sections, be repeatedly executed for all of pairs of particular terminals selected among the vertical and horizontal partition lines and the empty terminal in the one section.

67. A computer program product as claimed in claim 66, wherein the defining is performed so as to, in a case where a plurality of the terminals except for the vertical and horizontal partition lines belong to the one section, be repeatedly executed for all of the pairs of particular terminals selected among the all terminals which belong to the one section and include the vertical and horizontal partition lines for the one section.

68. A computer program product as claimed in claim 67, wherein the defining is performed so as to, in a case where only one terminal except for the vertical and horizontal partition lines belongs to the one section, be repeatedly executed for all of the pairs of particular terminals selected among the vertical and horizontal partition lines and the only one terminal in the one section.

69. A computer program product as claimed in claim 64, wherein the virtually moving is performed so as to include virtually moving the vertical and horizontal partition lines, with the movements of the components which have the particular terminals except for the vertical and horizontal partition lines.

70. A computer program product as claimed in claim 64, further for enabling the processor to control displaying in a display, wherein the predetermined operations further include:

judging whether or not the component of the compacted circuit layout belongs to a predetermined area for the component to be arranged thereon; and displaying with special emphasis, in the display, an area enclosed with the vertical and the horizontal partition lines, as regard the predetermined area, when the component does not arranged on the predetermined area.

71. A computer program product as claimed in claim 53, wherein the assuming is performed so as to include, after the defining and prior to the processing: detecting whether or not the pair of particular terminals are given the same signal; and removing the terminal constraint graph relating to the pair of particular terminal given the same signal.

72. A computer program product as claimed in claim 53, wherein the assuming is performed so as to include, prior to the defining, fixing an octagonal restricted region adapted to forbid a center of the one particular terminal to enter inside of the octagonal restriction region, and thereby, to restrict the movement of the one particular terminal, the octagonal restricted region and the other particular terminal having a common center, the defining being carried out under the restriction of the octagonal restricted region.

73. A computer program product as claimed in claim 72, wherein the fixing is performed so as to include:

approximating the other particular terminal to obtain a first octagon having a first distance from a center to an edge of the first octagon;

adding the belt width to each of edges of the first octagon to obtain a second octagon having a second distance from a center to an edge of the second octagon, the second distance being equal to a sum of the belt width and the first distance;

approximating the one particular terminal to obtain a third octagon having a third distance from a center to an edge of the third octagon; and adding the third distance to each of edges of the second octagon to determine a shape and a size of the octagonal restricted region, the shape having a fourth distance from a center to an edge of the shape, in question, the fourth distance being equal to a sum of the second distance and the third distance.

74. A computer program product as claimed in claim 53, further for enabling the processor to execute a processing in accordance with requests inputted through an input device, the input device adapted to designate a target moving vector having a target direction and a target distance in the virtually moving of each component, wherein the defining is performed so as to be executed in accordance with the target moving vector.

75. A computer program product as claimed in claim 52, the moving objects further comprising via-holes and semiconductor cells, wherein the assuming is performed so as to include:

handling parts of the via-hole at every layer, the semiconductor cells, profiles of the components as the terminals;

handling a combination unit of the component and the via-hole being, as a whole, as single component; and handling the via-hole connected to only wire as one of the components.

76. A computer program product as claimed in claim 52, the moving objects further comprising polygons obtained by approximating conductors, wherein the assuming is performed so as to include:

handling each of the polygons as the component; and handling edges of the each polygon as the terminals.

77. A computer program product as claimed in claim 52, further for enabling the processor to execute a processing in accordance with requests inputted through an input device, the input device adapted to designate a change of an arrangement of the component and the wire in the original layout data, wherein the predetermined operations further include:

changing the arrangement of the component and the wire in the original layout data, according to the designation with the input device, to produce a newly layout data; and inputting the newly layout data into the assuming.

78. A computer program product as claimed in claim 77, further for enabling the processor to control displaying in a display, wherein the predetermined operations further include:

judging whether or not the changing brings about a violation of the design rule; and displaying with special emphasis, in the display, an area on the circuit design rule; and displaying with special emphasis, in the display, an area on the circuit layout in accordance with the violation.

79. A computer program product as claimed in claim 52, further for enabling the processor to execute a processing in accordance with requests inputted through an input device, the input device adapted to designate a mutual replacement between one of the components and one of the wires, or between ones of the wires, wherein the predetermined operations further include executing the mutual replacement for layout data.

* * * * *

UNITED STATES PATENT AND TRADEMARK OFFICE
CERTIFICATE OF CORRECTION

PATENT NO.      : 6,412,097 B1
DATED           : June 25, 2002
INVENTOR(S)     : Kikuchi et al.

It is certified that error appears in the above-identified patent and that said Letters Patent is hereby corrected as shown below:

Column 36,
Lines 13 and 21, "terminals" should be -- terminal --.
Line 59, "edge" should be -- each --.

Column 38,
Line 6, "within" should be -- width --.
Line 55, "closed" should be -- closest --.
Line 63, after "moving" insert -- : -- (colon).

Column 39,
Line 54, "paticular" should be -- particular --.

Column 40,
Line 14, "end" should be -- and --.

Column 41,
Line 42, "designable" should be -- designate --.

Column 42,
Line 54, after "being" insert -- that --.
Line 56, "bell" should be -- belt --.
Line 57, "bells" should be -- belts --.

Column 44,
Line 14, "mode" should be -- node --.
Line 20, "terminal" should be -- terminals --.

Column 45,
Line 20, "in" should be -- to --.
Line 20, after "defining" insert -- : -- (colon).

UNITED STATES PATENT AND TRADEMARK OFFICE
CERTIFICATE OF CORRECTION

PATENT NO. : 6,412,097 B1
DATED : June 25, 2002
INVENTOR(S) : Kikuchi et al.

It is certified that error appears in the above-identified patent and that said Letters Patent is hereby corrected as shown below:

<u>Column 48,</u>
Lines 3-4, delete "displaying with special emphasis, in the display, an area on the circuit design rule; and".

Signed and Sealed this

Eleventh Day of November, 2003

JAMES E. ROGAN
*Director of the United States Patent and Trademark Office*